(12) United States Patent
Doherty et al.

(10) Patent No.: US 11,578,225 B2
(45) Date of Patent: *Feb. 14, 2023

(54) FILMS WITH NARROW BAND EMISSION PHOSPHOR MATERIALS

(71) Applicant: General Electric Company, Schenectady, NY (US)

(72) Inventors: Mark D. Doherty, Niskayuna, NY (US); Yangang Liang, Niskayuna, NY (US); Jie Jerry Liu, Niskayuna, NY (US); Samuel Joseph Camardello, Ballston Spa, NY (US); James Edward Murphy, Niskayuna, NY (US)

(73) Assignee: GENERAL ELECTRIC COMPANY, Schenectady, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 17/552,648

(22) Filed: Dec. 16, 2021

(65) Prior Publication Data
US 2022/0177719 A1 Jun. 9, 2022

Related U.S. Application Data

(63) Continuation of application No. 17/152,751, filed on Jan. 19, 2021, now Pat. No. 11,254,864.
(Continued)

(51) Int. Cl.
*C09D 11/00* (2014.01)
*C09D 11/38* (2014.01)
(Continued)

(52) U.S. Cl.
CPC ............ *C09D 11/38* (2013.01); *C09D 11/322* (2013.01); *C09K 11/025* (2013.01);
(Continued)

(58) Field of Classification Search
CPC .. G02B 6/0073; C09K 11/025; C09K 11/617; H01L 33/502; F21V 9/30; G02F 1/133603
See application file for complete search history.

(56) References Cited

U.S. PATENT DOCUMENTS 3,457,179 A   7/1969 Natansohn
3,509,064 A   4/1970 Natansohn
(Continued)

FOREIGN PATENT DOCUMENTS

CN   102220131 A   10/2011
JP   2003336045 A   11/2003
(Continued)

OTHER PUBLICATIONS

Braun, David D. et al., "Rheology Modifiers Handbook: Practical Use and Application", Part 2, pp. 71-191, Elsevier, 2013 (ISBN:0-8155-1441-7).
(Continued)

*Primary Examiner* — Gerald J Sufleta, II
(74) *Attorney, Agent, or Firm* — Armstrong Teasdale LLP

(57) ABSTRACT

A color conversion film is provided. The film includes at least one narrow band emission phosphor dispersed within a binder matrix, wherein the narrow band emission phosphor has a D50 particle size from about 0.1 µm to about 15 µm and is selected from the group consisting of a green-emitting $U^{6+}$-containing phosphor, a green-emitting $Mn^{2+}$-containing phosphor, a red-emitting phosphor based on complex fluoride materials activated by $Mn^{4+}$, and a mixture thereof. A device is also provided.

32 Claims, 5 Drawing Sheets

Related U.S. Application Data

(60) Provisional application No. 63/009,800, filed on Apr. 14, 2020, provisional application No. 63/027,672, filed on May 20, 2020, provisional application No. 63/059,709, filed on Jul. 31, 2020, provisional application No. 63/073,391, filed on Sep. 1, 2020.

(51) Int. Cl.

| | | |
|---|---|---|
| *G03F 7/004* | (2006.01) | |
| *C09K 11/02* | (2006.01) | |
| *C09K 11/61* | (2006.01) | |
| *C09K 11/71* | (2006.01) | |
| *G02F 1/13357* | (2006.01) | |
| *F21V 8/00* | (2006.01) | |
| *F21V 9/30* | (2018.01) | |
| *H01L 33/50* | (2010.01) | |
| *C09D 11/322* | (2014.01) | |
| *C08K 3/32* | (2006.01) | |
| *C08K 3/34* | (2006.01) | |
| *F21Y 115/10* | (2016.01) | |

(52) U.S. Cl.
CPC .......... *C09K 11/617* (2013.01); *C09K 11/71* (2013.01); *C09K 11/717* (2013.01); *F21V 9/30* (2018.02); *G02B 6/0053* (2013.01); *G02B 6/0073* (2013.01); *G02F 1/133603* (2013.01); *G02F 1/133617* (2013.01); *G03F 7/0042* (2013.01); *H01L 33/502* (2013.01); *C08K 3/34* (2013.01); *C08K 2003/328* (2013.01); *C08K 2201/001* (2013.01); *C08K 2201/005* (2013.01); *F21Y 2115/10* (2016.08); *H01L 2933/0091* (2013.01)

(56) References Cited

U.S. PATENT DOCUMENTS

| | | |
|---|---|---|
| 3,576,756 A | 4/1971 | Russo |
| 5,917,935 A | 6/1999 | Hawthorne et al. |
| 7,358,542 B2 | 4/2008 | Radkov et al. |
| 7,497,973 B2 | 3/2009 | Radkov et al. |
| 7,648,649 B2 | 1/2010 | Radkov et al. |
| 7,655,156 B2 | 2/2010 | Cheng et al. |
| 7,985,723 B2 | 7/2011 | Savu et al. |
| 8,252,613 B1 | 8/2012 | Lyons et al. |
| 8,329,485 B2 | 12/2012 | McKean |
| 8,663,501 B2 | 3/2014 | Srivastava et al. |
| 8,721,925 B2 | 5/2014 | Winkler et al. |
| 8,785,222 B2 | 7/2014 | McKean et al. |
| 8,906,724 B2 | 12/2014 | Murphy et al. |
| 9,111,464 B2 | 8/2015 | Bibl et al. |
| 9,222,017 B2 | 12/2015 | Yoshida |
| 9,388,336 B2 | 7/2016 | Murphy et al. |
| 9,512,356 B2 | 12/2016 | Lyons et al. |
| 9,598,636 B2 | 3/2017 | Kaneyoshi et al. |
| 9,627,437 B1 | 4/2017 | Ulmer et al. |
| 9,698,314 B2 | 7/2017 | Murphy et al. |
| 9,879,178 B2 | 1/2018 | Jin et al. |
| 10,020,430 B2 | 7/2018 | Nguyen et al. |
| 10,424,614 B2 | 9/2019 | Schubert et al. |
| 10,600,939 B2 | 3/2020 | Yuan et al. |
| 10,793,773 B2 | 10/2020 | Du et al. |
| 2002/0195927 A1 | 12/2002 | Groen et al. |
| 2003/0148695 A1 | 8/2003 | Kawamura et al. |
| 2004/0144987 A1 | 7/2004 | Ouderkirk et al. |
| 2004/0164277 A1 | 8/2004 | Yen et al. |
| 2006/0012287 A1 | 1/2006 | Tian et al. |
| 2008/0111472 A1 | 5/2008 | Liu et al. |
| 2009/0267485 A1 | 10/2009 | Nagatomi et al. |
| 2009/0272996 A1 | 11/2009 | Chakraborty |
| 2010/0142189 A1 | 6/2010 | Hong et al. |
| 2010/0148193 A1 | 6/2010 | Duong et al. |
| 2012/0064134 A1 | 3/2012 | Bourke, Jr. et al. |
| 2012/0256125 A1 | 10/2012 | Kaneyoshi et al. |
| 2013/0148376 A1 | 6/2013 | Nick et al. |
| 2014/0339495 A1 | 11/2014 | Bibl et al. |
| 2015/0008463 A1 | 1/2015 | Yoshida |
| 2015/0076406 A1 | 3/2015 | Zhou et al. |
| 2015/0301402 A1 | 10/2015 | Kimura et al. |
| 2015/0329770 A1 | 11/2015 | Kaneyoshi et al. |
| 2016/0053170 A1 | 2/2016 | Okura et al. |
| 2016/0244663 A1 | 8/2016 | Murphy et al. |
| 2016/0289553 A1 | 10/2016 | Beers et al. |
| 2016/0312114 A1 | 10/2016 | Murphy et al. |
| 2017/0073815 A1 | 3/2017 | Patel et al. |
| 2017/0130125 A1 | 5/2017 | Shibamoto et al. |
| 2017/0153382 A1 | 6/2017 | Wang et al. |
| 2017/0219184 A1 | 8/2017 | Petluri et al. |
| 2017/0254943 A1 | 9/2017 | Murphy |
| 2017/0276997 A1 | 9/2017 | Yoshinaga |
| 2017/0329770 A1 | 11/2017 | Kozak et al. |
| 2017/0342278 A1 | 11/2017 | Zalich et al. |
| 2018/0163126 A1 | 6/2018 | Murphy et al. |
| 2018/0190827 A1 | 7/2018 | Okazaki et al. |
| 2018/0208787 A1 | 7/2018 | Tateishi et al. |
| 2018/0233632 A1 | 8/2018 | Yuan et al. |
| 2018/0265778 A1 | 9/2018 | Du et al. |
| 2019/0018273 A1 | 1/2019 | Park et al. |
| 2019/0088827 A1 | 3/2019 | Camardello et al. |
| 2019/0280165 A1 | 9/2019 | Camardello et al. |
| 2019/0292448 A1 | 9/2019 | Porob et al. |
| 2020/0028033 A1 | 1/2020 | Camardello et al. |
| 2020/0287099 A1 | 9/2020 | Camardello et al. |
| 2020/0299574 A1 | 9/2020 | Hashizume |
| 2020/0301261 A1 | 9/2020 | Hashizume |
| 2020/0304764 A1 | 9/2020 | Hashizume |
| 2020/0369956 A1 | 11/2020 | Butts et al. |

FOREIGN PATENT DOCUMENTS

| | | |
|---|---|---|
| JP | 5375733 B2 | 12/2013 |
| JP | 5884717 B2 | 3/2016 |
| KR | 20010004094 A | 1/2001 |
| WO | 2010074963 A1 | 7/2010 |
| WO | 2014146748 A1 | 9/2014 |
| WO | 2016186637 A1 | 11/2016 |
| WO | 2017073815 A1 | 5/2017 |
| WO | 2018093832 A2 | 5/2018 |
| WO | 2018190827 A1 | 10/2018 |

OTHER PUBLICATIONS

Cai, Xing-Wei et al., "Lead-free/rare earth-free Green-light-emitting crystal based on organic-inorganic hybrid [(C10H16N)2][MnBr4] with high emissive quantum yields and large crystal size", Journal of Molecular Structure, vol. 1161, 2018, pp. 262-266, ISSN 0022-2860, https://doi.org/10.1016/j.molstruc.2018.01.093.

Derby, Brian, "Inkjet Printing Ceramics: From Drops to Solid", 2011, Journal of The European Ceramic Society—J Eur Ceram Soc, 31, 2543-2550, 10.1016/j.jeurceramsoc.2011.01.016.

Gong, Liaokuo et al., "Efficient modulation of photoluminescence by hydrogen bonding interactions among inorganic [MnBr4]2− anions and organic cations", 2019, Chemical Communications, 55 (51), 10.1039/C9CC03038G.

Lee, Ernest et al., "Quantum Dot Conversion Layers Through Inkjet Printing", Nanosys, Inc., Milpitas, CA, May 21, 2018, 4 pages.

Liu, Yuanyuan et al., "Experimental study of the parameters for stable drop-on-demand inkjet performance", Physics of Fluids, 31, 032004 (2019) https://doi.org/10.1063/1.5085868.

Mao, Wenhui et al., "Synthesis, crystal structure, photoluminescence properties of organic-inorganic hybrid materials based on ethylenediamine bromide", Journal of Saudi Chemical Society, vol. 24, Issue 1, 2020, pp. 52-60, ISSN 1319-6103, https://doi.org/10.1016/j.jscs.2019.09.003.

Mikolajek, Morten et al., "Requirements to Ceramic Suspensions for Inkjet Printing", 2015, Ceramic Forum International, 92, E25-29.

(56) References Cited

OTHER PUBLICATIONS

Morad, Viktoriia et al., "Manganese(II) in Tetrahedral Halide Environment: Factors Governing Bright Green Luminescence", Chemistry of Materials, 2019, 31 (24), 10161-10169, DOI: 10.1021/acs.chemmater.9b03782.

Qin, Yanyan et al., "Luminescent manganese(II) complexes: Synthesis, properties and optoelectronic applications", Coordination Chemistry Reviews, vol. 416, 2020, 213331, ISSN 0010-8545, https://doi.org/10.1016/j.ccr.2020.213331.

Worku, Michael et al., "Sunlike White-Light-Emitting Diodes Based on Zero-Dimensional Organic Metal Halide Hybrids", ACS Applied Materials & Interfaces, 2018, 10 (36), 30051-30057, DOI: 10.1021/acsami.8b12474.

Wu, Yuying et al., "New photoluminescence hybrid perovskites with ultrahigh photoluminescence quantum yield and ultrahigh thermostability temperature up to 600 K", Nano Energy, vol. 77, 2020, 105170, ISSN 2211-2855, https://doi.org/10.1016/j.nanoen.2020.105170.

Zhou, Tingting et al., "P-92: Fabrication and Patterning of a Wide-Color-Gamut Color Filter Based on Quantum Dots", 2016, SID Symposium Digest of Technical Papers, 47, 1469-1471, 10.1002/sdtp.10945.

Allpress "The crystal structure of caesium uranyl oxychloride $Cs_x(UO_2)OCl_x$ (x approximately 0.9)", Published 1964 in "Acta Crystallographica", 17, 41-46 (Year: 1964).

Anonymous, "Compreignactie", (Aug. 11, 2016), pp. 1-3, fluomin, URL: http://www.fluomin.org/uk/fiche.php?id=1008, XP055738271.

Anonymous, "Dumontite", (Aug. 12, 2016), pp. 1-2, fluomin, URL: http://www.fluomin.org/uk/fiche.php?id=325, XP055738275.

Anonymous, "Renardite", (Aug. 12, 2016), pp. 1-2, fluomin, URL: http://www.fluomin.org/uk/fiche.php?id=868&name=renardite, XP055738269.

Anonymous, "Sodium-zippeite", (Aug. 11, 2016), pp. 1-3, fluomin, URL: http://www.fluomin.org/uk/fiche.php?id=674, XP055738273.

Chukanov et al., "Chistyakovaite, a new mineral $Al(UO_2)_2(AsO_4)_2(F,OH)$-6.5H2O", Doklady Earth Sciences, (Feb. 28, 2006), vol. 407, No. 2, ISSN 1531-8354, pp. 290-293, XP019316270.

Chukanov et al., "Larisaite, $Na(H_3O)(UO_2)_3(SeO_3)_2O_2$-4H2O, a new uranyl selenite mineral from Repete mine, San Juan County, Utah, USA", European Journal of Mineralogy, (Jan. 1, 2004), vol. 16, No. 2, doi:10.1127/0935-1221/2004/0016-0367, ISSN 0935-1221, pp. 367-374, XP055738278.

Gough et al., "Multi-Photon Phosphor Feasibility Research", Advanced Light Source Development U.S. Dept. of Energy Contract with EPRI: DE-FC26-00NT40987 Reporting Period Oct. 1, 2000 to Mar. 31, 2002; Final Report, May 2003.

Huang et al., "Highly stable $K_2SiF_6$: Mn4+$K_2SiF_6$ composite phosphor with narrow red emission for white LEDs.", ACS applied materials & interfaces, 2018, vol. 10, No. 21, pp. 18082-18092, <doi:10.1021/acsami.8b03893>.

International Search Report and Written Opinion of the International Searching Authority, PCT/US2019/017606, dated May 27, 2019.

International Search Report and Written Opinion of the International Searching Authority, PCT/US2020/028946, dated Aug. 10, 2020.

International Search Report and Written Opinion of the International Searching Authority, PCT/US2021/013963, dated May 12, 2021.

Kikuyama et al., Surface Active Buffered Hydrogen Fluoride Having Excellent Wettability for ULSI Processing, IEEE Transactions on Semiconductor Manufacturing, vol. 3, No. 3, Aug. 1990, pp. 99-108.

Kumar et al., "On the photo and thermally stimulated luminescence properties of U doped $SrBPO_5$", Materials Research Bulletin, vol. 60, Dec. 2014, 7 Pages.

M. V. Hoffman, "Fluorescence and Energy Transfer in $SrZnP_2O_7$: $UO_2$", J. Electrochem. Soc.: Solid State Science, Feb. 1970, No. 2, vol. 117, 6 Pages.

Morrison et al., "Flux versus Hydrothermal Growth: Polymorphism of $A_2(UO_2)Si_2O_6$ (A=Rb, Cs)", Inorganic chemistry, 2017, vol. 56, pp. 1053-1056.

Nguyen et al., "Waterproof Alkyl Phosphate Coated Fluoride Phosphors for Optoelectronic Materials", Angewandte Communications, International Edition vol. 54, 2015, pp. 10865-10866.

Nichols et al., "Fluorescence of the Uranyl Salts", Published in 1919 by The Carnegie Institution of Washington (Year: 1919).

Onac et al., "Hydrothermal Genesis of Metatyuyamunite, $Ca(UO_2)_2(VO_4)_2 \cdot 3$-5H2O in the Valea Rea Cave, Romania", 13th International Congress of Speleology 4th Speleological Congress of Latin America and Caribbean 26th Brazilian Congress of Speleology, (Jul. 22, 2001), pp. 25-30, XP055637609.

Ondruš et al., "Cejkaite, the triclinic polymorph of $Na_4(UO_2)(CO_3)_3$—A new mineral from Jachymov, Czech Republic", American Mineralogist, (20030431), vol. 88, No. 4, doi:10.2138/am-2003-0422, ISSN 0003-004X, pp. 686-693, XP055637612.

Pekov et al., "Beshtauite, $(NH_4)_2(UO_2)(SO_4)_2 \cdot 2H_2O$, a new mineral from Mount Beshtau, Northern Caucasus, Russia", American Mineralogist, (Aug. 31, 2014), vol. 99, No. 8-9, doi:10.2138/am.2014.4870OLITCiteNPL, ISSN 0003-004X, pp. 1783-1787, XP009523386.

Plasil et al., "Adolfpateraite, $K(UO_2)(SO_4)(OH)(H_2O)$, a new uranyl sulphate mineral from Jachymov", American Mineralogist, Czech Republic, (2012), vol. 97, No. 2-3, doi:10.2138/am.2012.3976, pp. 447-454, XP009523379.

Pote et al., "Preparation of $CaF_2$: U Phosphor by Solid State Metathesis Reaction", International Journal of Self-Propagating High-Temperature Synthesis, 2013, vol. 22, No. 1, pp. 37-40.

Rabinowitch, "Spectroscopy and Photochemistry of Uranyl Compounds", Published Jan. 1, 1964, 1st Edition, The MacMillian Company, New York, pp. 47, 57, & 58 (Year: 1964).

Read et al., "Crystal growth, structural characterization, cation-cation interaction classification, and optical properties of uranium(VI) containing oxychlorides, $A_4U_5O_{16}Cl_2$ (A=K, Rb), $Cs_5U_7O_{22}Cl_3$, and $AUO_3Cl$ (A=Rb, Cs)", Published Apr. 7, 2014 in "CrystEngComm", 2014, 16, 7259-7267.

Read, Cory Michael, "Discovery of novel uranium-containing oxides and related materials by flux crystal growth", University of South Carolina 2015, pp. 1-258.

Rout et al., "Uranium speciation and its site occupancy in alkaline-earth borophosphates", Journal of the American Ceramic Society, vol. 100, No. 7, Apr. 3, 2017 (Apr. 3, 2017), pp. 2921-2931, XP055810229, ISSN: 0002-7820, DOI: 10.1111/jace.14800, Retrieved from the internet: URL: https://api.wiley.com/onlinelibrary/tdm/v1/articles/10.1111%2Fjace.14800>.

Sijbom et al., "K_2SiF_6:Mn4+ as a red phosphor for displays and warm-white LEDs: a review of properties and perspectives", Optical Materials Express, vol. 7, No. 9, Aug. 24, 2017 (Aug. 24, 2017), pp. 3332-3365, XP055810315, DOI: DirectPDFAccess/32562ED4-D5B4-A705-8BEB3A3D3B44F39F_371019/0me-7-9-3332.pdf?da=1&id=371019&seq=0&mobile=no>.

Slattery, "Uranium as an Activator-II", Published in 1929 by Journal of the Optical Society of America, vol. 19, Issue 4, pp. 175-186 (Year: 1929).

Taikar et al., "SrO: U6+ green light emitting phosphor", Journal of Luminescence, Elsevier, Science direct, 153, 2014, pp. 304-306.

Non-Final Office Action dated May 20, 2021 for related U.S. Appl. No. 17/152,736.

International Search Report and Written Opinion of the International Searching Authority, PCT/US2021/027105 dated Jul. 30, 2021.

R.F. Vochten, et al., "Transformation of chernikovite into meta-uranocircite II, $Ba(UO_2)_2(PO_4)_2 \cdot 6H_2$", Published Sep. 1992, in Mineralogical Magazine, vol. 56, pp. 367-372.

FILMS WITH NARROW BAND EMISSION PHOSPHOR MATERIALS

CROSS REFERENCE TO RELATED APPLICATIONS

This application is a continuation application of copending U.S. application Ser. No. 17/152,751 filed Jan. 19, 2021, which claims the priority benefit of U.S. Provisional Patent Application Ser. No. 63/009,800 filed Apr. 14, 2020 for "GREEN-EMITTING PHOSPHORS AND DEVICES THEREOF"; of U.S. Provisional Patent Application Ser. No. 63/027,672 filed May 20, 2020 for "INK FORMUATIONS WITH NARROW BAND EMISSION PHOSPHOR MATERIALS"; of U.S. Provisional Patent Application Ser. No. 63/059,709 filed Jul. 31, 2020 for "INK FORMULATIONS WITH NARROW BAND EMISSION PHOSPHOR MATERIALS"; and of U.S. Provisional Patent Application Ser. No. 63/073,391 filed Sep. 1, 2020 for "GREEN-EMITTING PHOSPHORS AND DEVICES THEREOF"; each of which is hereby incorporated by reference in its entirety.

BACKGROUND

The subject matter described herein relates generally to ink formulations for phosphor materials and more particularly, for forming color conversion films or layers for lighting and display applications.

Narrow band emission phosphor materials achieve high color quality in lighting and displays based on LEDs. Next generation displays may incorporate mini-LEDs and microLEDs having active areas of 10,000 µm² or less that are capable of generating light visible to the human eye at very low drive currents. Mini-LEDs are LEDs with a size of about 100 µm to 0.7 mm. For micro-LEDs, the displays may be self-emissive or include miniaturized backlighting and arrayed with individual LEDs smaller than 100 µm.

New methods of applying phosphor materials onto the miniaturized µm-sized LED elements need to be developed to enable the full potential of mini-LED and micro-LED technologies. Coating and printing films, such as ink jet printing, spin coating or slot die coating of phosphor materials is being developed to prepare LEDs including small size LEDs.

Ink jet printable ink has been prepared using quantum dots. Quantum dot material has nanometer particle sizes with a strong absorption coefficient. Quantum dots suffer from low quantum efficiency (QE) and poor thermal stability, which significantly limit their practical applications.

Phosphors have improved properties over quantum dot materials. Phosphors for use with small size LEDs must have a correspondingly small size. Printing and coating compositions require stable dispersions and phosphor materials with common organic solvents can create sedimentation or phase separation which is undesirable for subsequent coating and printing processes. Also, phosphor materials with small particle sizes tend to agglomerate when mixed with commonly used solvents making it unsuitable for ink compositions or formulations.

BRIEF DESCRIPTION

In one aspect, a film is provided. The film includes at least one narrow band emission phosphor dispersed within a binder matrix. The narrow band emission phosphor has a D50 particle size from about 0.1 µm to about 15 µm and is selected from the group consisting of a green-emitting $U^{6+}$-containing phosphor, a green-emitting $Mn^{2+}$-containing phosphor, a red-emitting phosphor based on complex fluoride materials activated by $Mn^{4+}$, and a mixture thereof.

In another aspect, a black matrix and device are provided.

DRAWINGS

These and other features, aspects, and advantages of the present disclosure will become better understood when the following detailed description is read with reference to the accompanying drawings in which like characters represent like parts throughout the drawings, wherein.

Figure 1A:
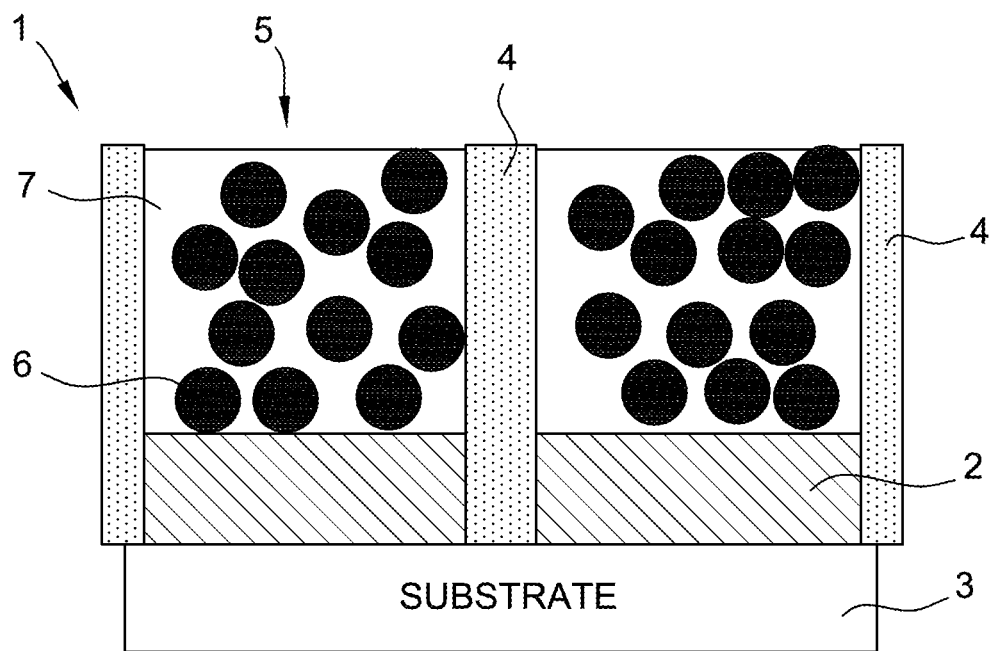
FIG. 1A is a schematic cross-sectional view of a matrix device, in accordance with one embodiment of the disclosure.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

"Optional" or "optionally" means that the subsequently described event or circumstance may or may not occur, or that the subsequently identified material may or may not be present, and that the description includes instances where the event or circumstance occurs or where the material is present, and instances where the event or circumstance does not occur or the material is not present.

Square brackets in the formulas indicate that at least one of the elements is present in the phosphor composition, and any combination of two or more thereof may be present. For example, the formula $[Ca,Sr,Ba]_3MgSi_2O_8:Eu^{2+},Mn^{2+}$ encompasses at least one of Ca, Sr or Ba or any combination of two or more of Ca, Sr or Ba. Examples include $Ca_3MgSi_2O_8:Eu^{2+}.Mn^{2+}$; $Sr_3MgSi_2O_8:Eu^{2+}.Mn^{2+}$; or $Ba_3MgSi_2O_8:Eu^{2+}.Mn^{2+}$. Formula with an activator after a colon ":" indicates that the phosphor composition is doped with the activator. Formula showing more than one activator separated by a "," after a colon ":" indicates that the phosphor composition is doped with either activator or both activators. For example, the formula $[Ca,Sr,Ba]_3MgSi_2O_8:Eu^{2+},Mn^{2+}$ encompasses $[Ca,Sr,Ba]_3MgSi_2O_8:Eu^{2+}$, $[Ca,Sr,Ba]_3MgSi_2O_8:Mn^{2+}$ or $[Ca,Sr,Ba]_3MgSi_2O_8:Eu^{2+}$ and $Mn^{2+}$.

In one aspect, an ink composition is provided. The composition including a binder material and at least one narrow band emission phosphor being uniformly dispersed throughout the composition. The narrow band emission phosphor has a D50 particle size from about 0.1 µm to about 15 µm and is selected from the group consisting of a green-emitting $U^{6+}$-containing phosphor, a green-emitting $Mn^{2+}$-containing phosphor, a red-emitting phosphor based on complex fluoride materials activated by $Mn^{4+}$, and a mixture thereof.

The ink composition or formulation is a solution and may be used to prepare conversion films by coating or printing the ink composition, such as by ink jet printing, slot die coating or spin coating. In one embodiment, the films may be deposited or printed on LEDs, miniLEDs, OLEDs or microLEDs. The conversion films convert light, such as blue LED light from one wavelength to another.

A liquid ink formulation may be prepared by combining a binder material with phosphor particles and optionally, a liquid media. In one embodiment, a liquid varnish is formed.

The composition includes a narrow band emission phosphor. Narrow band emission phosphor materials achieve high color quality lighting and displays. Phosphors for use in the ink formulations include narrow band red-emitting phosphors and green-emitting phosphors having small particle sizes, which improve color conversion. In one embodiment, the narrow band emission phosphor includes a combination of a narrow band red-emitting phosphor and a narrow band green-emitting phosphor.

The narrow band emission phosphor may be a green-emitting $U^{6+}$-containing phosphor, a green-emitting $Mn^{2+}$-containing phosphor, a red-emitting phosphor based on complex fluoride materials activated by $Mn^{4+}$, and a mixture thereof.

The green-emitting phosphors absorb radiation in the near-UV or blue region (a wavelength range between about 400 nm and 470 nm) and emit in a narrow region with an emission peak centered in a wavelength range from about 510 nm to about 550 nm, particularly from about 520 nm to about 535 nm.

In one embodiment, the narrow band emission phosphor may be a green emitting $U^{6+}$-containing phosphor or $Mn^{2+}$ phosphor. The green-emitting $U^{6+}$-containing phosphors may contain $U^{6+}$ within the host of the phosphor compound or may be activated or doped with an activator ion $U^{6+}$. In some embodiments, an additional activator ion may be present such as $Mn^{2+}$, $Mn^{4+}$, $Ce^{3+}$, $Sn^{2+}$, $Bi^{3+}$, $Sb^{3+}$, $Cr^{3+}$, $Tb^{3+}$, $Pr^{3+}$, $Eu^{3+}$, $Eu^{2+}$, $Ti^{4+}$, $In^+$, $Tl^+$, $Dy^{3+}$ and $Pb^{2+}$.

In one embodiment, the $U^{6+}$-containing phosphors have $(UO_2)^{2+}$ groups. The $Mn^{2+}$ and $(UO_2)^{2+}$ phosphors having ligands surrounding the $Mn^{2+}$ and $(UO_2)^{2+}$ groups that convey solubility in the ink composition. Examples of suitable $(UO_2)^{2+}$ compositions include uranyl acetate, uranyl acetylacetonate, uranyl ammonium acetate, uranyl sodium magnesium acetate, uranyl benzoate, uranyl magnesium acetate, uranyl naphthanate, uranyl oxalate, uranyl sulfate, uranyl zinc acetate and uranyl sodium zinc acetate. Examples of suitable $Mn^{2+}$ compounds include $((CH_3)_4N)MnX_3$, where X=Br or Cl; $MEA(MnX_4)_2$, where X=Br or Cl and $MEA=((CH_3)_4N(C_2H_5)_4N)_2NH_4$; $(OPPh_3)_2MnBr_2$, where Ph=phenyl; $(OP(NMe_2)_3)_2MnX_2$, where X=Cl or Br and Me=methyl; $(OPPh(NMe_2)_2)_2MnX_2$, where X=Cl or Br, Ph=phenyl and Me=Methyl; $DPEPOMnX_2$, where X=Cl, Br or I and DPEPO=bis[2-(diphenylphosphino)-phenyl]etheroxide; $DBFDPOMnX_2$, where X=Cl or Br and DBFDPO=4,6-bis(diphenylphosphoryl)dibenzofuran; $C_{11}H_{22}N_2MnCl_4$; $C_4H_{10}NMnBr_3$; and $A_2MnX_4$, where X=Br, Cl or I, and when X=Br, then A=$Et_4N$, $Pr_4N$, $BzBu_3N$, $PhMe_3N$, $Ph_4P$, $MePh_3P$, $EtPh_3P$, $BzMe_3N$, K(crypt-222), $PrMe_3N$, $MePPh_3Br$, $PrMe_3NBr$, P14, PP14, $C_2H_{10}N_2Br$, $C_{10}H_{16}N$, Btz, $BnPPh_3$, $C_nmim$ (n=1,2,3), K(dibenzo-18-crown-6), $BnMe_3N$, $BnEt_3N$, $Bn(C_5H_5N)$, $C_6H_{14}N$, $C_5H_5N$, $C_4H_{10}N$, and when X=Cl, then A=$Et_4N$, $Pr_4N$, $BzBu_3N$, $PhMe_3N$, $Ph_4P$, $EtPh_3P$, $BzMe_3N$, $(PPh_3)_2N$, Btz, $BnPPh_3$, $C_nmim$ (n=1,2,3), K(dibenzo-18-crown-6), $C_4NOH_{10}$, and when X=I, then A=$Et_4N$, $Pr_4N$, $PhMe_3N$, $BzMe_3N$, $C_4H_{10}N$; where Bz=benzoyl, Bn=benzyl, Pr=propyl, Me=methyl, Et=ethyl, Bu=butyl, Btz=Benzothiazole, Cnmim=n-alkyl-methylimidazoliumand Ph=phenyl.

In one embodiment, the green $U^{6+}$-containing phosphor may be a $U^{6+}$-doped phosphate-vanadate phosphor, such as $[Ba, Sr, Ca, Mg][B, Al, Ga, In][P, V]O_5: U^{6+}$; $Ba_{2-x} [Sr, Ca, Mg]_x [P_{1-y}, V_y]_2O_7: U^{6+}$; wherein $0 \leq x \leq 2$, $0 \leq y \leq 1$, and $x \neq 0$ when y=0; $[Ba, Sr, Ca, Mg]_4[P, V]_2O_9: U^{6+}$; $[Ba, Sr, Ca, Mg]_3[P, V]_4O_{13}: U^{6+}$; $[Ba, Sr, Ca, Mg]_4[B, Al, Ga, In][P, V]O_8: U^{6+}$; $[Ba, Sr, Ca, Mg]_6[B, Al, Ga, In]_5[P, V]_5O_{26}: U^{6+}$; $Ba_{3-x} [Sr, Ca, Mg]_x[P_{1-y}, V_y]_2O_8: U^{6+}$; wherein $0 \leq x \leq 3$, $0 \leq y \leq 1$, and $x \neq 0$ when y=0; $A_2[Ba, Sr, Ca, Mg][P, V]_2O_7: U^{6+}$; $A[Ba, Sr, Ca, Mg][P, V]O_4: U^{6+}$; $[Ba, Sr, Ca, Mg][P, V]_2O_6: U^{6+}$; $[Ba, Sr, Ca, Mg]_3[B, Al, Ga, In][P, V]O_7: U^{6+}$; and $[Ba, Sr, Ca, Mg]_{10}[P, V]_6O_{25}: U^{6+}$, $U^{6+}$-doped halide phosphors, such as $[Ba, Sr, Ca, Mg]X_2: U^{6+}$; $A[Ba, Sr, Ca, Mg]X_3: U^{6+}$; and $[Ba, Sr, Ca, Mg]_2X_4: U^{6+}$, $U^{6+}$-doped oxyhalide phosphors, such as $[Ba, Sr, Ca, Mg]_2[B, Al, Ga, In]O_3X: U^{6+}$; $[Ba, Sr, Ca, Mg]_2[P, V]O_4X: U^{6+}$; $Ba_{5-n} [Sr, Ca, Mg]_n[P_{1-m}, V_m]_3O_{12}X: U^{6+}$; wherein $0 \leq n \leq 5$, $0 \leq m \leq 1$, and $n \neq 0$ when m=0 and X=F; $[Ba, Sr, Ca, Mg]_5[B, Al, Ga, In]_3O_9X: U^{6+}$; and $[Ba, Sr, Ca, Mg]_3[Si, Ge]O_4X: U^{6+}$, $U^{6+}$-doped silicate-germanate phosphors, such as $[Ba, Sr, Ca, Mg]_2[Si, Ge]O_4: U^{6+}$; $[Ba, Sr, Ca, Mg]_3[Si, Ge]O_5: U^{6+}$; $[Ba, Sr, Ca, Mg]_3[Si, Ge]_2O_7: U^{6+}$; $[Ba, Sr, Ca, Mg][Si, Ge]O_3: U^{6+}$; $[Ba, Sr, Ca, Mg][B, Al, Ga, In]_2[Si, Ge]_2O_8: U^{6+}$; $[Ba, Sr, Ca, Mg]_2[B, Al, Ga, In]_2[Si, Ge]O_7: U^{6+}$; $[Ba, Sr, Ca, Mg]_3[B, Al, Ga, In]_6[Si, Ge]2O16: U^{6+}$; $[Ba, Sr, Ca, $Mg]_3[B, Al, Ga, In]_2[Si, Ge]O_8$: $U^{6+}$; $[Ba, Sr, Ca, Mg]_{11}[B, Al, Ga, In]_2[Si, Ge]_4O_{22}$: $U^{6+}$; $[Ba, Sr, Ca, Mg]_3[B, Al, Ga, In]_{10}[Si, Ge]O_{20}$: $U^{6+}$; and $[Ba, Sr, Ca, Mg]_{6.5}[B, Al, Ga, In]_{11}[Si, Ge]_5O_{33}$: $U^{6+}$, and $U^{6+}$-doped alkali earth oxide phosphors, such as $[Ba, Sr, Ca, Mg][B, Al, Ga, In]_4O_7$: $U^{6+}$; $[Ba, Sr, Ca, Mg]_3[B, Al, Ga, In]_2O_6$: $U^{6+}$; $[Ba, Sr, Ca, Mg][B, Al, Ga, In]_6O_{10}$: $U^{6+}$; $[Ba, Sr, Ca, Mg][B, Al, Ga, In]_2O_4$: $U^{6+}$; $[Ba, Sr, Ca, Mg]_4[B, Al, Ga, In]_2O_7$: $U^{6+}$; $[Ba, Sr, Ca, Mg]_{12}[B, Al, Ga, In]_{14}O_{33}$: $U^{6+}$; $A[Ba, Sr, Ca, Mg][B, Al, Ga, In]O_3$: $U^{6+}$; $[Ba, Sr, Ca, Mg]O$: $U^{6+}$; $[Ba, Sr, Ca, Mg]_2[B, Al, Ga, In, Sc]_2O_5$: $U^{6+}$; $A[Ba, Sr, Ca, Mg]_2[B, Al, Ga, In]_5O_{10}$: $U^{6+}$; and $A[Ba, Sr, Ca, Mg]_4[B, Al, Ga, In]_3O_9$: $U^{6+}$, wherein, A is Li, Na, K, Rb, Cs, or a combination thereof and X is F, Cl, Br or a combination thereof.

In another embodiment, the $U^{6+}$-containing phosphor may be $A_2USiO_6$, where A is Cs, Rb, or a combination thereof, $A_2(UO_2)Si_2O_6$, where A is Cs, Rb, or a combination thereof, $A_2MnU_3O_{11}$, where A is K, Rb, or a combination thereof, $K_4MU_3O_{12}$, where M is Ca, Sr, or a combination thereof, $M_3UO_6$, where M is Ca, Sr, or a combination thereof, $Na_{5-x}M_xUO_6$, where M is Ca, Sr, Nd, or a combination thereof, and $0 \le x \le 3$; $LUO_4$, where L is Ca, Mn, Fe, or a combination thereof, $Na_3MU_6F_{30}$, where M is Al, Ga, Ti, V, Cr, Fe, or a combination thereof, $Ba_2MUO_6$, where M is Cu, Ni, Zn, or a combination thereof, $Na_3A_3(UO_2)_3(Si_2O_7)_2 \cdot 2H_2O$, where A is K, Rb, or a combination thereof, $A_3(U_2O_4)Ge_2O_7$, where A is Rb, Cs, or a combination thereof, $Ba_2(UO_2)(TO_4)_2$, where T is P, As, or a combination thereof, $K_8U_7O_{24}$; $Na_4UO_5$; $NiU_2O_6$; $K_2UO_4$; $Li_{3.2}Mn_{1.8}U_6O_{22}$; $Ks(K_5F)U_6Si_8O_4O$; $Na_9F_2(UO_2)_3(Si_2O_7)_2$; $Cs_2Mn_3U_6O_{22}$; $BaK_4U_3O_{12}$; $Ba_2Na_{0.38}U_{1.17}O_6$; $Na_{3.13}Mg_{1.43}U_6F_3O$; $Na_{2.5}Mn_{1.75}U_6F_{30}$; $K_8U_7O_{24}$; $KUO_3Cl$; $A(UO_2)OCl$, where A is Rb, Cs, Na or a combination thereof, $Na_6Rb_4(UO_2)_4Si_{12}O_{33}$; $Cs_2K(UO_2)_2Si_4O_{12}$; $Cs_8U(UO_2)_3(Ge_3O_9)_3 \cdot 3H_2O$; $Cs_2K(UO)_2Si_4O_{12}$; $Cs_3(UO_2)_2(PO_4)O_2$; $Cs_2(UO_2)_2(PO_4)_2$; $Cs_2UO_2Cl_4$; $Ba_3(UO_2)_2(HPO_4)_2(PO_4)_2$; $Ba(UO_2)F(PO_4)$; $Na_7(UO_2)_3(UO)Si_4O_{16}$; $CaO:U$; $SrMoO_4:U$; $BaSO_4:U$; $MgO:U$; $Li_4MgWO_6:U$; $Li_4WO_5:U$; $Li_6Mg_5Sb_2O_{13}:U$; $Li_3NbO_4:U$; $Li_3SbO_4:U$; $Li_2SnO_3:U$; $LiScO_2:U$; $LiNbO_3:U$; $LiSbO_3:U$; $NaSbO_3:U$; $Y_6WO_{12}:U$; $[Ca, Cd, Mg]WO_4:U$, where M is Ca, Sr, Cd, Mg, or a combination thereof, $Li_2WO_4:U$; $Li_3PO_4:U$; $Ca_2MgWO_6:U$; $SrZnP_2O_7:U$; $R_2TeO_6:U$, where R is Y, La, Gd, Lu or a combination thereof, $M_3TeO_6$: U, where M is Mg, Ca, Sr, or a combination thereof, $Ba_2TeO_5$: U; and combinations thereof.

In another embodiment, the $U^{6+}$-containing phosphor may be $(A^{2+}_yM^{1+}_{2-2y})(UO_2)_2(ZO_4)_2 \cdot xH_2O$, where M is $NH_4$, $H_3O$, Na, K, or a combination thereof, A is Fe, Co, Cu, Zn, Mg, Ca, Sr, Ba, Pb, or a combination thereof, Z is As, P, V or a combination thereof, $0 \le y \le 1$ and $0 \le x \le 16$; $M^{1+}(UO_2)(SO_4)(OH, F) \cdot xH_2O$, where M is K, Na, or a combination thereof, and $0 \le x \le 2$; $(A^{2+}_{2y}M^{1+}_{4-4y})(UO_2)(CO_3)_3 \cdot xH_2O$, where M is Na, K, or a combination thereof, A is Mg, Ca, or a combination thereof, $0 \le y \le 1$ and $0 \le x \le 18$; $(A^{2+})(UO_2)_4(ZO_4)_2(OH, F)_4 \cdot xH_2O$, where A is Ca, Pb, or a combination thereof, Z is As, P, or a combination thereof; and $0 \le x \le 7$; $(A^{2+}_yM^{1+}_{2-2y})(UO_2)_6O_4(OH, F)_6 \cdot xH_2O$, where A is Ca, Ba, or a combination thereof, M is K, $0 \le y \le 1$ and $0 \le x \le 8$; $(M^{1+})_2(UO_2)(SO_4)_2 \cdot xH_2O$, where M is $NH_4$, Na, or a combination thereof; and $0 \le x \le 3$; $Al(UO_2)_2(ZO_4)_2(OH, F) \cdot xH_2O$, where Z is As, V, P, or a combination thereof, and $0 \le x \le 11$; $(L^{2+}_{2y}M^{1+}_{4-4y})(UO_2)_6(SO_4)_3(OH, F)_{10} \cdot xH_2O$, where L is Co, Ni, or a combination thereof, M is Na; $0 \le y \le 1$ and $0 \le x \le 16 (A^{2+})_2(UO_2)_3O_2(PO_4)_2 \cdot xH_2O$, where A is Ca, Pb, or a combination thereof, and $0 \le x \le 7$; $(A^{2+}_yM^{1+}_{2-2y})(UO_2)_3(SeO_3)_2O_2 \cdot xH_2O$, where M is Ba, Na, or a combination thereof, A is $H_3O$, $0 \le x \le 4$ and $0 \le y \le 1$; $UO_3 \cdot xH_2O$ where $0 \le x \le 2$; $UO_4 \cdot xH_2O$ where $0 \le x \le 2$; $UO_2CO_3 \cdot xH_2O$, where $0 \le x \le 2$; $U(UO_2)_3(PO_4)_2(OH, F)_6 \cdot xH_2O$ where $0 \le x \le 4$; $Ca(UO_2)(CO_3)_2 \cdot xH_2O$ where $0 \le x \le 5$; $HAl(UO_2)_4(AsO_4)_4 \cdot xH_2O$ where $0 \le x \le 40$; $H_{0.5}Al_{0.5}(UO_2)_2(PO_4)_2 \cdot xH_2O$ where $0 \le x \le 8$; $Cu(UO_2)_2(SO_4)_2(OH, F)_2 \cdot xH_2O$ where $0 \le x \le 8$; $K_2Ca_3[(UO_2)(CO_3)_3]_2 \cdot xH_2O$ where $0 \le x \le 7$; $Na_7(UO_2)(SO_4)_4(SO_3OH) \cdot xH_2O$ where $0 \le x \le 3$; $Ca_2Ba_4[(UO_2)_3O_2(PO_4)_2]_3 \cdot xH_2O$ where $0 \le x \le 16$; $NaAl(UO_2)_2(SO_4)_4 \cdot xH_2O$ where $0 \le x \le 18$; $Na_2Mg(UO_2)_2(SO_4)_4 \cdot xH_2O$ where $0 \le x \le 18$; $Na_7(UO_2)(SO_4)_4Cl \cdot xH_2O$ where $0 \le x \le 2$; $[K,Na](UO_2)(SiO_3OH) \cdot xH_2O$ where $0 \le x \le 1.5$; $Ca(UO_2)_2[SiO_3[OH, F]]_2 \cdot xH_2O$ where $0 \le x \le 5$; $Ca(UO_2)_3(MoO_4)_3(OH, F)_2 \cdot xH_2O$ where $0 \le x \le 11$; $Al_2(UO_2)(PO_4)_2[OH, F]_2 \cdot xH_2O$ where $0 \le x \le 8$; $Al_3(UO_2)(PO_4)_3[OH, F]_2 \cdot xH_2O$ where $0 \le x \le 13$; $Al(UO_2)_3(PO_4)_2[OH, F]_3 \cdot xH_2O$ where $0 \le x \le 5.5$; $Al_2(UO_2)_3(PO_4)_2[OH, F]_6 \cdot xH_2O$ where $0 \le x \le 10$; $Ca(UO_2)_4(SO_4)_2[OH, F]_6 \cdot xH_2O$ where $0 \le x \le 6$; $K(UO_2)_2(SO_4)[OH, F]_3 \cdot xH_2O$ where $0 \le x \le 1$; $H_2Pb_3(UO_2)_6O_4(PO_4)_4 \cdot xH_2O$ where $0 \le x \le 12$; $Na_4(UO_2)(SO_4)_3 \cdot xH_2O$ where $0 \le x \le 3$; $Ca(UO_2)_3(CO_3)_2O_2 \cdot xH_2O$ where $0 \le x \le 6$; $Ca[(UO_2)_2Si_5O_{12}[OH, F]_2] \cdot xH_2O$ where $0 \le x \le 3$; $(UO_2)_3(SeO_3)_2[OH, F]_2 \cdot xH_2O$ where $0 \le x \le 5$; $(U)_2(UO_2)_4O_6[OH, F]_4 \cdot xH_2O$ where $0 \le x \le 9$; $(UO_2)_8(SO_4)[OH, F]_{14} \cdot xH_2O$ where $0 \le x \le 13$; $(UO_2)_6(SO_4)[OH, F]_{10} \cdot xH_2O$ where $0 \le x \le 5$; $Y_2U_4(CO_3)_3O_{12} \cdot xH_2O$ where $0 \le x \le 14.5$; $Mg(UO_2)_2(SO_4)_2O_2 \cdot xH_2O$ where $0 \le x \le 3.5$; $Pb[(UO_2)_3O_3[OH, F]_2] \cdot xH_2O$ where $0 \le x \le 3$; $Pb_{1.5}[(UO_2)_{10}]O_6[OH, F]_{11}] \cdot xH_2O$ where $0 \le x \le 11$; $Na_5(UO_2)(SO_4)_3(SO_3OH) \cdot xH_2O$ where $0 \le x \le 1$; $Ca(UO_2)_2Si_6O_{15} \cdot xH_2O$ where $0 \le x \le 5$; $PbU_7O_{22} \cdot xH_2O$ where $0 \le x \le 12$; $Ca_2Cu(UO_2)(CO_3)_4 \cdot xH_2O$ where $0 \le x \le 6$; $(H_3O)_3KCa(UO_2)_7O_4(PO_4)_4 \cdot xH_2O$ where $0 \le x \le 8$; $(H_3O)_4Ca_2(UO_2)_2(PO_4)_4 \cdot xH_2O$ where $0 \le x \le 5$; $Ca_3Mg_3(UO_2)_2(CO_3)_6[OH, F]_4 \cdot xH_2O$ where $0 \le x \le 18$; $HAl(UO_2)PO_4[OH, F]_3 \cdot xH_2O$ where $0 \le x \le 4$; $[(UO_2)_8O_2[OH, F]_{12}] \cdot xH_2O$ where $0 \le x \le 12$; $NaCa_3(UO_2)(SO_4)(CO_3)_3F \cdot xH_2O$ where $0 \le x \le 10$; $Ca(UO_2)_6(CO_3)_5[OH, F]_4 \cdot xH_2O$ where $0 \le x \le 6$; $(UO_2)_2(SO_4)_2 \cdot xH_2O$ where $0 \le x \le 5$; $(H_3O)_2Mg(UO_2)_2(SiO_4)_2 \cdot xH_2O$ where $0 \le x \le 4$; $(UO_2)_2SiO_4 \cdot xH_2O$ where $0 \le x \le 2$; $[Na,K](UO_2)SiO_3[OH, F] \cdot xH_2O$ where $0 \le x \le 1.5$; $(H_3O)(UO_2)(AsO_4) \cdot xH_2O$ where $0 \le x \le 3$; $(UO_2)_6(SO_4)O_2[OH, F]_6 \cdot xH_2O$ where $0 \le x \le 14$; $Al_{1-0.5}(UO_2)(PO_4)_2 \cdot xH_2O(F \le 1)$ where $0 \le x \le 21$; $[Mg,Ca]_4(UO_2)_4(Si_2O_5)_{5.5}[OH, F]_5 \cdot xH_2O$ where $0 \le x \le 13$; $Cu(UO_2)(OH, F)_4$; $[K,Ba,Ca]_2(UO_2)_2Si_5O_{13} \cdot xH_2O$ where $0 \le x \le 1$; $K_2Ca(UO_2)_7(PO_4)_4[OH, F]_6 \cdot xH_2O$ where $0 \le x \le 6$; $Zn_2(UO_2)_6(SO_4)_3[OH, F]_{10} \cdot xH_2O$ where $0 \le x \le 16$; $CaZn_{11}(UO_2)(CO_3)_3[OH, F]_{20} \cdot xH_2O$ where $0 \le x \le 4$; $A_xMF_y:U^{6+}$, where A is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge of the $[MF_y]$ ion; and y is 5, 6, or 7; and combinations thereof.

In another embodiment, the green $U^{6+}$-containing phosphor may be $[Ba_{1-a-b}Sr_aCa_b]_x[Mg,Zn]_y(UO_2)_z([P,V]O_4)_{2(x+y+z)/3}$, where $0 \le a \le 1$, $0 \le b \le 0.5$, $0.75 \le x \le 1.25$, $0.75 \le y \le 1.25$, $0.75 \le z \le 1.25$; and $[Ba_{1-a-b}Sr_aCa_b]_p(UO_2)_q[P,V]_rO_{(2p+2q+5r)/2}$, where $0 \le a \le 1$, $0 \le b \le 1$, $2.5 \le p \le 3.5$, $1.75 \le q \le 2.25$, $3.5 \le r \le 4.5$.

Examples include, but are not limited to, $BaMgUO_2(PO_4)_2$, $BaZnUO_2(PO_4)_2$, $Ba_3(PO_4)_2(UO_2)_2P_2O_7$, $Ba_2Sr(PO_4)_2(UO_2)_2P_2O_7$, $BaSr_2(PO_4)_2(UO_2)_2P_2O_7$, $Sr_3(PO_4)_2(UO_2)_2P_2O_7$, $Ca_3(PO_4)_2(UO_2)_2P_2O_7$, $BaMg_2(PO_4)_2(UO_2)_2P_2O_7$, $Sr_4AlPO_8:U^{6+}$, $Ba_4AlPO_8:U^{6+}$, $Ca_4AlPO_8:U^{6+}$, $SrBa_3AlPO_8:U^{6+}$, $Sr_2Ba_2AlPO_8:U^{6+}$, $Sr_3BaAlPO_8:U^{6+}$, $Ba_6Al_5P_5O_{26}:U^{6+}$, $Ba_6Ga_5P_5O_{26}:U^{6+}$, $Ba_6In_5P_5O_{26}:U^{6+}$, $Ba_6Al_5V_5O_{26}:U^{6+}$, $Ba_6Ga_5V_5O_{26}:U^{6+}$, $Ba_6In_5V_5O_{26}:U^{6+}$, $SrBPO_5:U^{6+}$, $BaBPO_5:U^{6+}$, $BaBP_5:U^{6+}$, $MgAlPO_8:$ $U^{6+}$, $Ca_2V_2O_7{:}U^{6+}$, $Ba_2V_2O_7{:}U^{6+}$, $CaMgV_2O_7{:}U^{6+}$, $SrMgV_2O_7{:}U^{6+}$, $Sr_4P_2O_9$: $U^{6+}$, $Ca_4P_2O_9{:}U^{6+}$, $Ba_3P_4O_{13}$: $U^{6+}$, $Sr_3P_4O_{13}{:}U^{6+}$, $Ca_{10}P_6O_{25}$: $U^{6+}$, $Sr_{10}P_6O_{25}$: $U^{6+}$, $Mg_3P_2O_8$: $U^{6+}$, $Ca_3V_2O_8$: $U^{6+}$, $Ba_3V_2O_8$: $U^{6+}$, $BaMg_2V_2O_8$: $U^{6+}$, $Cs_2CaP_2O_7$: $U^{6+}$, $Cs_2SrP_2O_7$: $U^{6+}$, $Cs_2CaV_2O_7$: $U^{6+}$, $Cs_2SrV_2O_7$: $U^{6+}$, $Li_2BaP_2O_7{:}U^{6+}$, $NaCaPO_4$: $U^{6+}$, $LiSrPO_4$: $U^{6+}$, $NaSrPO_4$: $U^{6+}$, $KSrPO_4$: $U^{6+}$, $KBaVO_4$: $U^{6+}$, $KSrVO_4$: $U^{6+}$, $KCaVO_4$: $U^{6+}$, $BaP_2O_6$: $U^{6+}$, $CaV_2O_6$: $U^{6+}$, $Ba_3BPO_7$: $U^{6+}$, $Sr_3BPO_7$: $U^{6+}$, $CaF_2$: $U^{6+}$, $BaF_2{:}U^{6+}$, $BaFCl{:}U^{6+}$, $BaFBr{:}U^{6+}$, $LiBaF_3{:}U^{6+}$, $BaMgF_4{:}U^{6+}$, $Ca_2BO_3Cl$: $U^{6+}$, $Ca_2PO_4Cl$: $U^{6+}$, $Ca_5(PO_4)_3Cl$: $U^{6+}$, $Ba_5V_3O_{12}Cl$: $U^{6+}$, $Sr_5(BO_3)_3Cl$: $U^{6+}$, $Sr_3GeO_4F$: $U^{6+}$, $Ca_2SiO_4$: $U^{6+}$, $Mg_2SiO_4$: $U^{6+}$, $Ca_2GeO_4$: $U^{6+}$, $Sr_2GeO_4$: $U^{6+}$, $Sr_3SiO_8$: $U^{6+}$, $Ca_3SiO_8$: $U^{6+}$, $Ca_3Si_2O_7$: $U^{6+}$, $MgSiO_3$: $U^{6+}$, $BaGeO_3$: $U^{6+}$, $BaAl_2Si_2O_8$: $U^{6+}$, $SrAl_2Si_2O_8$: $U^{6+}$, $CaAl_2Si_2O_8$: $U^{6+}$, $BaGa_2Si_2O_8$: $U^{6+}$, $CaAl_2SiO_7$: $U^{6+}$, $Ba_3B_6Si_2O_{16}{:}U^{6+}$, $Ca_{11}B_2Si_4O_{22}$: $U^{6+}$, $Sr_3Al_{10}SiO_2O$: $U^{6+}$, $Ba_{6.5}Al_{11}Si_5O_{33}$: $U^{6+}$, $CaAl_2B_2O_7{:}U^{6+}$, $SrAl_2B_2O_7{:}U^{6+}$, $BaAl_2B_2O_7$: $U^{6+}$, $CaB_4O_7{:}U^{6+}$, $SrB_4O_7{:}U^{6+}$, $SrAl_3BO_7$: $U^{6+}$, $CaAlB_3O_7{:}U^{6+}$, $Ca_3B_2O_6{:}U^{6+}$, $Sr_3B_2O_6$: $U^{6+}$, $Ba_3B_2O_6{:}U^{6+}$, $Sr_3Al_2O_6{:}U^{6+}$, $Ca_3Al_2O_6{:}U^{6+}$, $Ba_2SrAl_2O_6$: $U^{6+}$, $BaSr_2Al_2O_6$: $U^{6+}$, $Ba_2SrB_2O_6{:}U^{6+}$, $BaSr_2B_2O_6{:}U^{6+}$, $Ca_3In_2O_6{:}U^{6+}$, $Sr_3In_2O_6{:}U^{6+}$, $SrB_6O{:}U^{6+}$, $SrAl_2O_4$: $U^{6+}$, $SrAlBO_4$: $U^{6+}$, $Sr_4Al_2O_7$: $U^{6+}$, $Ca_4Al_2O_7$: $U^{6+}$, $Sr_{10}Ga_6Sc_4O_{25}$: $U^{6+}$, $Ca_{12}Al_{14}O_{33}$: $U^{6+}$, $LiSrBO_3$: $U^{6+}$, $LiCaBO_3$: $U^{6+}$, SrO: $U^{6+}$, $LiBa_2B_5O_{10}$: $U^{6+}$ and $LiSr_4B_3O_9$: $U^{6+}$, $Na_2(UO_2)_2(AsO_4)_2$-$5H_2O$, $K_2(UO_2)_2(AsO_4)_2$-$6H_2O$, $Ba(UO_2)_2(AsO_4)_2$-(10-12)$H_2O$, $Co(UO_2)_2(AsO_4)_2$-$8H_2O$, $Cu(UO_2)_2(AsO_4)_2$-$8H_2O$, $Cu(UO_2)_2(AsO_4)_2$-$12H_2O$, $Zn(UO_2)_2(AsO_4)_2$-$10H_2O$, $Mg(UO_2)_2(AsO_4)_2$-(4-8)$H_2O$, $Mg(UO_2)_2(AsO_4)_2$-(10-12)$H_2O$, $Ca(UO_2)_2(AsO_4)_2$-$8H_2O$, $Ca(UO_2)_2(AsO_4)_2$-$10H_2O$, $Ba(UO_2)_2(AsO_4)_2$-$8H_2O$, $Ba(UO_2)_2(AsO_4)_2$-(10-12)$H_2O$, $(NH_4,H_3O)_2(UO_2)_2(AsO_4,PO_4)_2$-$6H_2O$, $(NH_4)_2(UO_2)_2(PO_4)_2$-$6H_2O$, $(H_3O)_2(UO_2)_2(PO_4)_2$-$6H_2O$, $Na_2(UO_2)_2(PO_4)_2$-(6-8)$H_2O$, $Na_2(UO_2)_2(PO_4)_2$-(10-16)$H_2O$, $K_2(UO_2)_2(PO_4)_2$-$6H_2O$, $Fe(UO_2)_2(PO_4)_2$-$8H_2O$, $Mg(UO_2)_2(PO_4)_2$-$8H_2O$, $Mg(UO_2)_2(PO_4)_2$-$10H_2O$, $Ca(UO_2)_2(PO_4)_2$-(2-6)$H_2O$, $Ca(UO_2)_2(PO_4)_2$-$11H_2O$, $Ba(UO_2)_2(PO_4)_2$-$6H_2O$, $Ba(UO_2)_2(PO_4)_2$-$8H_2O$, $Ba(UO_2)_2(PO_4)_2$-$12H_2O$, $Pb(UO_2)_2(PO_4)_2$-$4H_2O$, $Na_2(UO_2)_2(VO_4)_2$-$6H_2O$, $K_2(UO_2)_2(VO_4)_2$-(1-3)$H_2O$, $Ca(UO_2)_2(VO_4)_2$-$3H_2O$, $K(UO_2)(SO_4)(OH)$—$H_2O$, $Na(UO_2)(SO_4)(OH)$-$2H_2O$, $K_4(UO_2)(CO_4)_3$, $Na_4(UO_2)(CO_3)_3$, $Na_2Ca(UO_2)(CO_3)_3$-$6H_2O$, $Mg_2(UO_2)(CO_3)_3$-$18H_2O$, $CaMg(UO_2)(CO_3)_3$-$12H_2O$, $Ca_2(UO_2)(CO_3)_3$-$11H_2O$, $Ca(UO_2)_4(AsO_4)_2(OH)_4$-$6H_2O$, $Pb(UO_2)_4(PO_4)_2(OH)_4$-$7H_2O$, $K_2(UO_2)_6O_4(OH)_6$-$7H_2O$, $Ca(UO_2)_6O_4(OH)_{6-8}H_2O$, $Ba(UO_2)_6O_4(OH)_{6-8}H_2O$, $(NH_4)_2(UO_2)(SO_4)_2$-$2H_2O$, $Na_2(UO_2)(SO_4)_2$-$3H_2O$, $Al(UO_2)_2(AsO_4)_2(F,OH)$-$6.5H_2O$, $Al(UO_2)_2(VO_4)_2(OH)$-$8H_2O$, $Al(UO_2)_2(VO_4)_2(OH)$-$11H_2O$, $Al(UO_2)_2(PO_4)_2(OH)$-$8H_2O$, $Co_2(UO_2)_6(SO_4)_3(OH)_{10}$-$16H_2O$, $Ni_2(UO_2)_6(SO_4)_3(OH)_{10}$-$16H_2O$, $Na_4(UO_2)_6(SO_4)_3(OH)_{10}$-$4H_2O$, $Pb_2(UO_2)_3O_2(PO_4)_2$-$5H_2O$, $Ca_2(UO_2)_3O_2(PO_4)_2$-$7H_2O$, $Ba(UO_2)_3(SeO_3)_2O_2$-$3H_2O$, $Na(H_3O)(UO_2)_3(SeO_3)_2O_2$-$4H_2O$, $K_2SiF_6{:}U^{6+}$, $UO_3$-$0.75H_2O$, $UO_3$—$H_2O$, $UO_3$-$2H_2O$, $UO_4$-$2H_2O$, $UO_4$-$4H_2O$, $UO_2CO_3$, $UO_2CO_3$—$H_2O$, $(UO_2)(CO_3)$-$2H_2O$, $U(UO_2)_3(PO_4)_2(OH)_6$-$2H_2O$, $U(UO_2)_3(PO_4)_2(OH)_6$-$4H_2O$, $Ca(UO_2)(CO_3)_2$-$3H_2O$, $Ca(UO_2)(CO_3)_2$-$5H_2O$, $HAl(UO_2)_4(AsO_4)_4$-$40H_2O$, $H_{0.5}Al_{0.5}(UO_2)_2(PO_4)_2$-$8H_2O$, $Cu(UO_2)_2(SO_4)_2(OH)_2$-$8H_2O$, $K_2Ca_3[(UO_2)(CO_3)_3]_2$-$7H_2O$, $Na_7(UO_2)(SO_4)_4(SO_3OH)$-$3H_2O$, $Ca_2Ba_4[(UO_2)_3O_2(PO_4)_2]_3$-$16H_2O$, $NaAl(UO_2)_2(SO_4)_4$-$18H_2O$, $Na_2Mg(UO_2)_2(SO_4)_4$-$18H_2O$, $Na_7(UO_2)(SO_4)_4Cl$-$2H_2O$, $[K,Na](UO_2)(SiO_3OH)$-$1.5H_2O$, $Ca(UO_2)_2[SiO_3(OH)]_2$-$5H_2O$, $Ca(UO_2)_3(MoO_4)_3(OH)_2$-$11H_2O$, $Al_2(UO_2)(PO_4)_2(OH)_2$-$8H_2O$, $Al_3(UO_2)_3(PO_4)_3(OH)_2$-$13H_2O$, $Al(UO_2)_3(PO_4)_2(OH)_3$-$5.5H_2O$, $Al_2(UO_2)_3(PO_4)_2(OH)_6$-$10H_2O$, $Ca(UO_2)_4(SO_4)_2(OH)_6$-$6H_2O$, $K(UO_2)_2(SO_4)(OH)_3$—$H_2O$, $H_2Pb_3(UO_2)_6O_4(PO_4)_4$-$12H_2O$, $Na_4(UO_2)(SO_4)_3$-$3H_2O$, $Ca(UO_2)_3(CO_3)_2O_2$-$6H_2O$, $Ca[(UO_2)_2Si_5O_{12}(OH)_2]$-$3H_2O$, $(UO_2)_3(SeO_3)_2(OH)_2$-$5H_2O$, $(U)_2(UO_2)_4O_6(OH)_4$-$9H_2O$, $(UO_2)_3(SO_4)(OH)_{14}$-$3H_2O$, $(UO_2)_6(SO_4)(OH)_{10}$-$5H_2O$, $Y_2U_4(CO_3)_3O_{12}$-$14.5H_2O$, $Mg(UO_2)_2(SO_4)O_2$-$3.5H_2O$, $Pb[(UO_2)_3O_3(OH)_2]$-$3H_2O$, $Pb_{1.5}[(UO_2)_{10}]O_6(OH)_{11}]$-$11H_2O$, $Na_5(UO_2)(SO_4)_3(SO_3OH)$—$H_2O$, $Ca(UO_2)_2Si_6O_{15}$-$5H_2O$, $PbU_7O_{22}$-$12H_2O$, $Ca_2Cu(UO_2)(CO_3)_4$-$6H_2O$, $(H_3O)_3KCa(UO_2)_7O_4(PO_4)_4$-$8H_2O$, $(H_3O)_4Ca_2(UO_2)_2(PO_4)_4$-$5H_2O$, $Ca_3Mg_3(UO_2)_2(CO_3)_6(OH)_4$-$8H_2O$, $HAl(UO_2)PO_4(OH)_3$-$4H_2O$, $[(UO_2)_8O_2(OH)_{12}]$-$12H_2O$, $NaCa_3(UO_2)(SO_4)(CO_3)_3F$-$10H_2O$, $Ca(UO_2)_6(CO_3)_s(OH)_4$-$6H_2O$, $(UO_2)_2(SO_4)_2$-$5H_2O$, $(H_3O)_2Mg(UO_2)_2(SiO_4)_2$-$4H_2O$, $(UO_2)_2SiO_4$-$2H_2O$, $[Na,K](UO_2)SiO_3(OH)$-$1.5H_2O$, $(H_3O)(UO_2)(AsO_4)$-$3H_2O$, $(UO_2)_6(SO_4)O_2(OH)_6$-$14H_2O$, $Al_{0.5-1}(UO_2)_4(PO_4)_4$-(20-21)$H_2O(F<1)$, $[Mg,Ca]_4(UO_2)_4(Si_2O_5)_{5.5}(OH)_5$-$13H_2O$, $Cu(UO_2)(OH)_4$, $[K,Ba,Ca]_2(UO_2)_2Si_5O_{13}$—$H_2O$, $K_2Ca(UO_2)_7(PO_4)_4(OH)_6$-$6H_2O$, $Zn_2(UO_2)_6(SO_4)_3(OH)_{10}$-$16H_2O$, $CaZn_{11}(UO_2)(CO_3)_3(OH)_{20}$-$4H_2O$, $CsUSiO_6$, $RbUSiO_6$, $Cs_2(UO_2)Si_2O_6$, $Rb_2(UO_2)Si_2O_6$ $K_2MnU_3O_{11}$, $Rb_2MnU_3O_{11}$ $K_4CaU_3O_{12}$, $K_4SrU_3O_{12}$ $Ca_3UO_6$, $Sr_3UO_6Na_3Ca_{1.5}UO_6$, $Na_{4.5}Nd_{0.5}UO_6$ $CaUO_4$, $MnUO_4$, $FeUO_4$ $Na_3GaU_6F_{30}$, $Na_3AlU_6F_{30}$, $Na_3TiU_6F_{30}$, $Na_3VU_6F_{30}$, $Na_3CrU_6F_{30}$, and $Na_3FeU_6F_{30}$, $Ba_2NiUO_6$, $Ba_2CuUO_6$, $Na_3K_3(UO_2)_3(Si_2O_7)$-$2H_2O$, $Na_3Rb_3(UO_2)_3(Si_2O_7)$-$2H_2O$ $Rb_3(U_2O_4)Ge_2O_7$, $CS_3(U_2O_4)Ge_2O_7$ $Ba_2(UO_2)(PO_4)_2$, $Ba_2(UO_2)(AsO_4)_2$ $A(UO_2)OCl$, $CaWO_4$:U, $CdWO_4$:U, $MgWO_4$:U, $Y_2TeO_6$:U and $Gd_2TeO_6$:U, $Ca_3TeO_6$: U, $Sr_3TeO_6$: U, $Mg_3TeO_6$: U, $K_8(K_5F)U_6Si_8O_{40}$, $SrZnP_2O_7$:U, $KUO_3Cl$, $CsUO_3Cl$, $NaUO_3Cl$, $RbUO_3Cl$ or combinations thereof.

In one embodiment, the green $U^{6+}$-containing phosphor may be selected from phosphors of formula $\gamma$-$Ba_2UO_2(PO_4)_2$, $[Ba,Zn,Mg](UO_2)_2(PO_4)_2$, $Ba_6Al_5P_5O_{26}{:}U^{6+}$, $Ba(UO_2)P_2O_7$ and $Ba_3(UO_2)_2P_2O_7(PO_4)_2$. Particular examples include $Ba[Mg,Zn]UO_2(PO_4)_2$, more particularly $BaMgUO_2(PO_4)_2$ and $BaZnUO_2(PO_4)_2$. Suitable narrow band green-emitting phosphors and methods for making the phosphors are described in US Publication No. 2019/0088827, US Publication No. 2019/0280165 and U.S. Publication No. 2020/0028033. The entire contents of each of which are incorporated herein by reference.

In one embodiment, the $U^{6+}$-containing phosphors of the present invention may be produced by firing a mixture of precursors under an oxidizing atmosphere. Non-limiting examples of suitable precursors include the appropriate metal oxides, hydroxides, alkoxides, carbonates, nitrates, aluminates, silicates, citrates, oxalates, carboxylates, tartrates, stearates, nitrites, peroxides, phosphates, pyrophosphates and combinations thereof. Suitable materials for use as precursors include, but are not limited to, $BaCl_2$ $2H_2O$, $BaCO_3$, $BaHPO_4$, $Ba_3(PO_4)_2$, $Ba_2P_2O_7$, $Ba_2Zn(PO_4)_2$, $BaZnP_2O_7$, $Ba(OH)_2$, $Ba(C_2O_4)$, $Ba(C_2H3O_2)_2$, $Ba_3(C_6H_5O_7)_2$, $Ba(NO_3)_2$, $Eu_2O_3$, $Mg(C_2O_4)$, $Mg(C_2H_3O_2)_2$, $Mg(C_6H_6O_7)$, $MgCO_3$, MgO, $Mg(OH)_2$, $Mg_3(PO_4)_2$, $Mg_2P_2O_7$, $Mg_2Ba(PO_4)_2$, $MgHPO_4$, $Mg(NO_3)_2$, $NH_4VO_3$, $(NH_4)_2HPO_4$, $NH_4MgPO_4$, $Zn(C_2O_4)$, $Zn(C_2H_3O_2)_2$, $Zn_3(C_6H_8O_7)_2$, $ZnCO_3$, $Zn(OH)_2$, $Zn_3(PO_4)_2$, $Zn_2P_2O_7$, $Zn_2Ba(PO_4)_2$, $ZnHPO_4$, $Zn(NO_3)_2$, $NH_4ZnPO_4$, $UO_2$, $UO_2(NO_3)_2$, $UO_2(NO_3)_2.6H_2O$, $(UO_2)_2P_2O_7$, $(UO_2)_3(PO_4)_2$, $NH_4(UO_2)PO_4$, $UO_2CO_3$, $UO_2(C_2H_3O_2)_2$, $UO_2(C_2O_4)$, $H(UO_2)PO_4$, $UO_2(OH)_2$, and $ZnUO_2(C_2H_3O_2)_4$, and various hydrates. For example, the exemplary phosphor phase gamma $Ba_2UO_2(PO_4)_2$ may be produced by mixing the appropriate amounts of $BaHPO_4$ and $UO_2$ with the appropriate amount of (NH$_4$)$_2$HPO$_4$ and then firing the mixture under an air atmosphere. In another example, Ba$_3$(UO$_2$)$_2$(P$_2$O$_7$)(PO$_4$)$_2$ may be produced by mixing the appropriate amounts of BaCl$_2$.2H$_2$O and UO$_2$(NO$_3$)$_2$.6H$_2$O with the appropriate amount of (NH$_4$)$_2$HPO$_4$ and then firing the mixture under an air atmosphere. The precursors may be in solid form or in solution. Non-limiting examples of solvents include water, ethanol, acetone, and isopropanol, and suitability depends chiefly on solubility of the precursors in the solvent. After firing, the phosphor may be milled to break up any agglomerates that may have formed during the firing procedure.

The mixture of starting materials for producing the phosphor may also include one or more low melting temperature flux materials, such as boric acid, borate compounds such as lithium tetraborate, alkali phosphates, and combinations thereof. Non-limiting examples include Li$_3$PO$_4$, Na$_3$PO$_4$, NaBO$_3$—H$_2$O, Li$_2$B$_4$O$_7$, K$_4$P$_2$O$_7$, Na$_4$P$_2$O$_7$, H$_3$BO$_3$, and B$_2$O$_3$. The flux may lower the firing temperature and/or firing time for the phosphor. If a flux is used, it may be desirable to wash the final phosphor product with a suitable solvent to remove any residual soluble impurities that may have originated from the flux.

The firing of the samples is generally done in air but since the uranium is in its highest oxidation state (U$^{6+}$) in can also be fired in O$_2$ or other oxidizing atmospheres, including at oxygen partial pressures above one atmosphere, at a temperature between about 900° C. and about 1300° C., particularly between about 1000° C. and about 1200° C., for a time sufficient to convert the mixture to the phosphor. The firing time required may range from about one to twenty hours, depending on the amount of the mixture being fired, the extent of contact between the solid and the gas of the atmosphere, and the degree of mixing while the mixture is fired or heated. The mixture may rapidly be brought to and held at the final temperature, or the mixture may be heated to the final temperature at a lower rate such as from about 2° C./minute to about 200° C./minute.

In one embodiment, the narrow band emission phosphor may be a red-emitting phosphor based on complex fluoride materials activated by Mn$^{4+}$. Suitable red-emitting phosphors based on complex fluoride materials and processes for making the phosphors are described in U.S. Pat. Nos. 7,497,973, 7,648,649, 8,906,724, 8,252,613, 9,698,314, US 2016/0244663, US Publication No. 2018/0163126, and US Publication No. 2020/0369956. The entire contents of each of which are incorporated herein by reference.

Suitable red-emitting phosphors include phosphors of formula I $$A_x(MF_y):Mn^{+4} \qquad (I)$$

wherein A is Li, Na, K, Rb, Cs, or a combination thereof, M is Si, Ge, Sn, Ti, Zr, Al, Ga, In, Sc, Y, La, Nb, Ta, Bi, Gd, or a combination thereof, x is the absolute value of the charge of the (MF$_y$) ion; and y is 5, 6 or 7.

In one embodiment, the red-emitting phosphor may be a manganese-doped potassium fluorosilicate, such as K$_2$SiF$_6$:Mn$^{4+}$ (PFS). PFS has a narrow band emission having multiple peaks with an average full width at half maximum (FWHM) of less than 4 nm. In another embodiment, the red-emitting phosphor may be Na$_2$SiF$_6$:Mn$^{4+}$ (SFS).

Examples of the red-emitting phosphors of formula I include, but are not limited to, K$_2$(SiF$_6$):Mn$^{4+}$, K$_2$(TiF$_6$):Mn$^4$, K$_2$(SnF$_6$):Mn$^4$, Cs$_2$(TiF$_6$):Mn$^{4+}$, Rb$_2$(TiF$_6$):Mn$^4$, Cs$_2$(SiF$_6$):Mn$^{4+}$, Rb$_2$(SiF$_6$):Mn$^4$, Na$_2$(TiF$_6$):Mn$^{4+}$, Na$_2$(SiF$_6$):Mn, Na$_2$(ZrF$_6$):Mn$^{4+}$, K$_3$(ZrF$_7$):Mn$^{4+}$, K$_3$(BiF$_7$):Mn$^{4+}$, K$_3$(YF$_7$):Mn$^{4+}$, K$_3$(LaF$_7$):Mn$^{4+}$, K$_3$(GdF$_7$):Mn$^{4+}$, K$_3$(NbF$_7$):Mn$^{4+}$, K$_3$(TaF$_7$):Mn$^{4+}$.

In one embodiment, the red-emitting phosphors may be further treated, such as by annealing, wash treatment, roasting or any combination of these treatments. Post-treatment processes for red-emitting phosphors are described in U.S. Pat. Nos. 8,906,724, 8,252,613, 9,698,314, US Publication No. 2016/0244663, US Publication No. 2018/0163126, and US Publication No. 2020/0369956. The entire contents of each of which are incorporated herein by reference. In one embodiment, the red-emitting phosphors may be annealed, treated with multiple wash treatments and roasted.

The amount of activator Mn incorporation in the red-emitting phosphors (referred to as Mn %) improves color conversion. Increasing the amount of Mn % incorporation improves color conversion by increasing the intensity of the red emission, maximizing absorption of excitation blue light and reducing the amount of unconverted blue light or bleed-through of blue light from a blue LED.

In one embodiment, the red-emitting phosphor has a Mn loading or Mn % of at least 1 wt %. In another embodiment, the red-emitting phosphor has a Mn loading of at least 1.5 wt %. In another embodiment, the red-emitting phosphor has a Mn loading of at least 2 wt %. In another embodiment, the red-emitting phosphor has a Mn % of at least 3 wt %. In another embodiment the Mn % is greater than 3.0 wt %. In another embodiment, the content of Mn in the red-emitting phosphor is from about 1 wt % to about 4 wt %.

In one embodiment, the narrow band emission phosphor has a particle size diameter in the range from about 0.1 μm to about 15 μm. In another embodiment, the narrow band emission phosphor has a particle size diameter in the range from about 0.1 μm to about 10 μm. In another embodiment, the narrow band emission phosphor has a particle size distribution that is, D50 of less than 15 μm, particularly, D50 of less than 10 μm, particularly D50 of less than 5 μm, or D50 of less than 3 μm, or D50 of less than 2 μm, or D50 of less than 1 μm. In another embodiment, the particle size distribution D50 may be in a range from about 0.1 μm to about 5 μm. In another embodiment, the D50 particle size is in a range from about 0.1 μm to about 3 μm. In another embodiment, the D50 particle size is in a range from about 0.1 μm to about 1 μm. In another embodiment, the D50 particle size is in a range from about 1 μm to about 5 μm. D50 (also expressed as D$_{50}$) is defined as the median particle size for a volume distribution. D90 or D$_{90}$ is the particle size for a volume distribution that is greater than the particle size of 90% of the particles of the distribution. D10 or D$_{10}$ is the particle size for a volume distribution that is greater than the particle size of 10% of the particles of the distribution. Particle size of the phosphors may be conveniently measured by laser diffraction or optical microscopy methods, and commercially available software can generate the particle size distribution and span. Span is a measure of the width of the particle size distribution curve for a particulate material or powder, and is defined according to the equation:

$$\text{Span} = \frac{(D_{90} - D_{10})}{D_{50}}$$

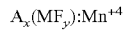

wherein D$_{90}$, D$_{10}$ and D$_{50}$ are defined above. For phosphor particles, span of the particle size distribution is not necessarily limited and may be ≤1.0 in some embodiments.

The narrow band emission phosphors may be in particulate form. The phosphors may be ground or milled, in a conventional manner, into small particle sizes having a D50 particle size from about 0.1 μm to about 15 μm. In another embodiment, the D50 particle size may be from about 0.1 µm to about 10 µm. In another embodiment, the D50 particle size may be from about 0.1 µm to about 5 µm. In another embodiment, the D50 particle size may be from about 0.1 µm to about 3 µm. In another embodiment, the D50 particle size may be from about 0.1 µm to about 1 µm.

Quantum efficiency (QE) of phosphors, particularly, red-emitting phosphors based on complex fluoride materials with high Mn % content, can degrade with conventional milling and grinding. In some embodiments, particle sizes of phosphors may be reduced by wet-milling, which maintain the QE during milling and grinding.

Commonly used solvents can also degrade the QE of phosphors. In one embodiment, the narrow band emission phosphors may be wet-milled using specific solvent media, such as oleic acid, dibutyl phosphate, bis(2-ethylhexyl) phosphate and alkanes including, but not limited to hexane, heptane and hexadecane.

The ink composition or film may include other luminescent or optical materials. These materials can reduce bleed-through of blue light. The luminescent or optical materials may be added to the ink composition and incorporated into films. In other embodiments, luminescent materials may be added as a separate filtering layer or coating in the optical path. In one embodiment, the ink composition or film includes at least one color filter pigment capable of absorbing blue light. Suitable color filter pigments for use with red phosphors have high transmittance for red wavelengths and low transmittance for blue wavelengths. Suitable color filter pigments for use with green phosphors have high transmittance for green wavelengths and low transmittance for blue wavelengths.

The ink composition or film may further include one or more other luminescent materials. In one embodiment, the luminescent materials may be polyfluorenes, such as poly(9,9-dioctyl fluorene) and copolymers thereof, such as poly(9,9'-diocyl-fluorene-co-bis-N,N'-(4-butylphenyl)diphenylamine) (F8-TFB); poly(vinylcarbazole) and polyphenylenevinylene and their derivatives. Additional luminescent materials, such as blue, yellow, red, orange, or other color phosphors may be included to customize the white color of the resulting light and produce specific spectral power distributions. Suitable additional phosphors may include, but are not limited to: $((Sr_{1-z}[Ca, Ba, Mg, Zn]_z)_{1-(x+w)}[Li, Na, K, Rb]_wCe_x)_3(Al_{1-y}Si_y)O_{4+y+3(x-w)}F_{1-y-3(x-w)}$, (wherein $0 \le x \le 1.10$, $0 \le y \le 0.5$, $0 \le z \le 0.5$, $0 \le w \le x$); $[Ca,Ce]_3Sc_2S_3O_{12}$ (CaSiG); $[Sr,Ca,Ba]_3Al_{1-x}Si_xO_{4+x}F_{1-x}:Ce^{3+}$ (SASOF)); $[Ba,Sr,Ca]_5(PO_4)_3[Cl,F,Br,OH]:Eu^{2+},Mn^{2+}$; $[Ba,Sr,Ca]BPO_5: Eu^{2+},Mn^{2+}$, $[Sr,Ca]_{10}(PO_4)_6*vB_2O_3:Eu^{2+}$ (wherein $0<v\le1$); $Sr_2Si_3O_8*2SrCl_2:Eu^{2+}$; $[Ca,Sr,Ba]3MgSi_2O_8:Eu^{2+},Mn^{2+}$; $BaAl_8O_{13}:Eu^{2+}$; $2SrO*0.84P_2O_5*0.16B_2O_3:Eu^{2+}$; $[Ba,Sr,Ca]MgAl_{10}O_{17}:Eu^{2+},Mn^{2+}$; $[Ba,Sr,Ca]Al_2O_4:Eu^{2+}$; $[Y,Gd,Lu,Sc,La]BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag+,Al^{3+}$; $[Ba,Sr,Ca]_2Si_{1-n}O_{4-2n}:Eu^{2+}$ (wherein $0 \le n \le 0.2$); $[Ba,Sr,Ca]_2[Mg,Zn]Si_2O_7:Eu^{2+}$; $[Sr,Ca,Ba][Al,Ga,In]_2S_4:Eu^{2+}$; $[Y,Gd,Tb,La,Sm,Pr,Lu]_3[Al,Ga]_{5-a}O_{12-3/2a}:Ce^{3+}$ (wherein $0 \le a \le 0.5$); $[Ca,Sr]_8[Mg,Zn](SiO_4)_4Cl_2:Eu^{2+},Mn^{2+}$; $Na_2Gd_2B_2O_7:Ce^{3+},Tb^{3+}$; $[Sr,Ca,Ba,Mg,Zn]_2 P_2O_7:Eu^{2+},Mn^{2+}$; $[Gd,Y,Lu,La]_2O_3:Eu^{3+},Bi^{3+}$; $[Gd,Y,Lu,La]_2O_2S:Eu^{3+},Bi^{3+}$; $[Gd,Y,Lu,La]VO_4:Eu^{3+},Bi^{3+}$; $[Ca,Sr]S:Eu^{2+},Ce^{3+}$; $SrY_2S_4:Eu^{2+}$; $CaLa_2S_4:Ce^{3+}$; $[Ba,Sr,Ca]MgP_2O_7:Eu^{2+},Mn^{2+}$; $[Y,Lu]_2WO_6:Eu^{3+},Mo^{6+}$; $[Ba,Sr,Ca]_bSi_gN_m:Eu^{2+}$ (wherein $2b+4g=3m$); $Ca_3(SiO_4)Cl_2:Eu^{2+}$; $[Lu,Sc,Y,Tb]_{2-u-v}Ce_vCa_{1+u}Li_wMg_{2-w}P_w(Si,Ge)_{3-w}O_{12-u/2}$ (where $-0.5 \le u \le 1$, $0<v\le0.1$ and $0 \le w \le 0.2$); $[Y,Lu,Gd]_{2-m}[Y,Lu,Gd]Ca_mSi_4N_{6+m}C_{1-m}:Ce^{3+}$, (wherein $0 \le m \le 0.5$); [Lu,Ca, Li,Mg,Y], alpha-SiAlON doped with $Eu^{2+}$ and/or $Ce^{3+}$; $Sr(LiAl_3N_4):Eu^{2+}$, $[Ca,Sr,Ba]SiO_2N_2:Eu^{2+},Ce^{3+}$; beta-SiAlON:$Eu^{2+}$, $3.5MgO*0.5MgF_2*GeO_2:Mn^{4+}$; $Ca_{1-e-f}Ce_cEu_fAl_{1+c}Si_{1-c}N_3$, (where $0 \le c \le 0.2$, $\le f \le 0.2$); $Ca_{1-h-r}Ce_hEu_rAl_{1-h}[Mg,Zn]_hSiN_3$, (where $0 \le h \le 0.2$, $0 \le r \le 0.2$); $Ca_{1 \le 2s-t}Ce_s[Li,Na]_tEu_rAlSiN_3$, (where $0 \le s \le 0.2$, $0 \le t \le 0.2$, s+t>0); $[Sr,Ca]AlSiN_3:Eu^{2+}$, $Ce^{3+}$, and $Li_2CaSiO_4:Eu^{2+}$. In addition, the light emitting layer may include a blue, yellow, orange, green or red phosphorescent dye or metal complex, a quantum dot material, color filter pigments or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorophenyOpyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADSO90GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

The ratio of each of the individual phosphors in the ink composition or film may vary depending on the characteristics of the desired light output. The relative proportions of the individual phosphors in the various phosphor materials may be adjusted such that when their emissions are blended and employed in a device, for example a lighting apparatus, there is produced visible light of predetermined x and y values on the CIE chromaticity diagram.

In another embodiment, the ink composition and films may include quantum dots (QDs) that can absorb blue light and generate green or red light or both may also be included to form a hybrid color conversion article. Exemplary QD materials include, but are not limited to, group II-IV compound semiconductors such as CdS, CdSe, CdS/ZnS, CdSe/ZnS or CdSe/CdS/ZnS, group II-VI, such as CdTe, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, group III-V or group IV-VI compound semiconductors such as GaN, GaP, GaNP, GaNAs, GaPAs, GaAs, GaAlNP, GaAlNAs, GaAlPAs, GaInNP, GaInNAs, GaInPAs, AlN, AlNP, AlNAs, AlP, AlPAs, AlAs, InN, InNP, InP, InNAs, InPAs, InAS, InAlNP, InAlNAs, InAlPAs, PbS/ZnS or PbSe/ZnS, group IV, such as Si, Ge, SiC, and SiGe, chalcopyrite-type compounds, including, but not limited to, $CuInS_2$, $CuInSe_2$, $CuGaS_2$, $CuGaSe_2$, $AgInS_2$, $AgInSe_2$, $AgGaS_2$, $AgGaSe_2$ or perovskite QDs having a formula of $ABX_3$ where A is cesium, methylammonium or formamidinium, B is lead or tin and C is chloride, bromide or iodide. In one embodiment, the perovskite quantum dot may be CsPbX3, where X is Cl, Br, I or a combination thereof. The mean size of the QD materials may range from about 2 nm to about 20 nm. The surface of QD particles may be further modified with ligands such as amine ligands, phosphine ligands, phosphatide and polyvinylpyridine. In one aspect, the red phosphor may be a quantum dot material.

The QD materials may be a core/shell QD, including a core, at least one shell coated on the core, and an outer coating including one or more ligands, preferably organic polymeric ligands. Exemplary materials for preparing core-shell QDs include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, HgS, HgSe, HgTe, BeS, BeSe, BeTe, MgS, MgSe, MnS, MnSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $[Al, Ga, In]_2[S, Se, Te]_3$, and appropriate combinations of two or more such materials. Exemplary core-shell luminescent nanocrystals include, but are not limited to, CdSe/ZnS, CdSe/CdS, CdSe/CdS/ZnS, CdSeZn/CdS/ZnS, CdSeZn/ZnS, InP/ZnS, PbSe/PbS, PbSe/PbS, CdTe/CdS and CdTe/ZnS.

Binder materials provide a matrix for the phosphor particles in the film and can adjust viscosity to achieve a stable dispersion in the ink formulation. Binder materials may also improve performance in the ink composition and films, such as thermal stability and optical performance.

Binder materials for the ink composition may include thermoplastic polymers and copolymers, pre-binder materials, such as thermally curable precursors or photocurable precursors. Exemplary binders include, but are not limited to ethyl cellulose, polystyrene, polyacrylate, polymethacrylates, such as polymethyl acrylate (PMA) and polymethyl methacrylate (PMMA), polycarbonate, polyurethane, polyetherether ketone, polysulfone, polyphenylene sulfide, polyvinylpyrrolidone (PVP), polyethyleneimine (PEI), poly (1-naphthyl methacrylate), poly(vinyl phenyl sulfide) (PVPS), polyvinyl alcohol (PVA), polyvinyl butyral (PVB), poly(N-vinylphthalimide), fluorinated polymers, such as polyvinylidene fluoride (PDVF) or poly(vinylidene fluoride-co-hexafluoropropylene) (PVDF-HFP), amine-based oligomers/polymers/copolymers, fluorine-based oligomers/polymers/copolymers, poly(phenylene vinylene), carbazole-based oligomers/polymers/copolymers, phenyl-pyridine-based oligomers/polymers/copolymers.

In another embodiment, the binder materials may include curable precursor materials, such as photocurable or UV-curable precursor materials and thermally curable or thermoset binder precursor materials. Exemplary thermoset binder precursor materials include silicone materials, such as Sylgard™ 184, Sylgard™ 186, Sylgard™ 527 and epoxy-based materials. Photocurable or UV-curable materials may include precursor materials with mono-functional groups, such as isobornyl acrylate, isodecyl acrylate, 2-ethylhexyl acrylate, tetrahydro furfuryl methacrylate, tetrahydro furfuryl acrylate, stearyl acrylate, t-butyl cyclohexyl acrylate, stearyl methacrylate, 2-phenoxyethyl methacrylate, cyclic trimethylolpropane formal acrylate, N-acryloyl morpholine and diacetone acrylamide; bi-functional groups, such as 1,4-butanediol diacrylate, diethylene glycol diacrylate, diethylene glycol dimethacrylate, neopentyl glycol diacrylate, triethylene glycol diacrylate, dipropylene glycol diacrylate, tricyclodecane dimethanol diacrylate and propoxylated (2) neopentyl glycol diacrylate; and multi-functional groups, such as trimethylolpropane triacrylate, tris(2-hydroxy ethyl) isocyanurate triacrylate, pentaerythratol triacrylate, ethoxylated (3) trimethylolpropane triacrylate and propoxylated (6) trimethylolpropane triacrylate. In one embodiment, the precursor materials include pentaacrylate ester, epoxy resins, acrylic resins, acrylate resins and urethane-based materials. In one embodiment, the binder materials may include photo-initiators for curing the photocurable or UV-curable materials.

In another embodiment, the binder materials may include photoresist materials, such as positive photoresist materials and negative photoresist materials. A positive resist is a type of photoresist in which the portion of the photoresist exposed to light becomes more soluble to a photoresist developer. The unexposed portion of the photoresist remains insoluble to the photoresist developer. A negative photoresist is a type of photoresist in which the portion of the photoresist exposed to light becomes insoluble to a photoresist developer. The unexposed portion of the photoresist is dissolved by the photoresist developer. Exemplary positive photoresist materials include, but are not limited to, polymethyl methacrylate (PMMA), Megaposit™ SPR™ series, diazonaphthoquinone (DNQ) and novolac resin. Exemplary negative photoresist materials include, but are not limited to, epoxy-based polymers, thiol-ene (OSTE) polymers and crosslinkable monomers, such as allyl monomers.

In another embodiment, the binder materials may include conjugated polymers containing fluorescence quenching units that absorb blue light and have negligible emission at the desired wavelength, such as polyfluorene-based polymers. In one embodiment, the polyfluorene-based polymers may be Brilliant violet fluorophores or poly(5,5,10,10-tetrahexyl-5,10-dihydroindeno[2,1-a]indene-2,7-diyl) (PI-NINE).

In one embodiment, the binder material may have a higher refractive index than the narrow band emission phosphor material. In one aspect, the narrow band emission phosphor comprises a red-emitting phosphor based on complex fluoride materials activated by $Mn^{4+}$ and the binder material comprises a refractive index of at least 1.40. In another embodiment, the binder material comprises a refractive index from about 1.40 to about 1.45. In another embodiment, the binder material comprises a refractive index of at least 1.5. In another embodiment, the binder material has a refractive index greater than that of a red-emitting phosphor based on complex fluoride materials activated by $Mn^{4+}$ by at least 0.05. In another embodiment, the binder material has a refractive index greater than that of a red-emitting phosphor based on complex fluoride materials activated by $Mn^{4+}$ by at least 0.1.

In one embodiment, the binder material may have a lower refractive index than the narrow band emission phosphor material. In one aspect, the phosphor material comprises a green-emitting phosphor including a $U^{6+}$-containing phosphor or a $Mn^{2+}$-containing phosphor, and the binder material comprises a refractive index of at least 1.40. In another embodiment, the binder material comprises a refractive index from about 1.40 to about 1.45. In another embodiment, the binder material comprises a refractive index of at least 1.5. In another embodiment, the binder material has a refractive index that is less than that of a green-emitting phosphor including a $U^{6+}$-containing phosphor or a $Mn^{2+}$-containing phosphor, by at least 0.05. In another embodiment, the binder material has a refractive index that is less than that of a green-emitting phosphor including a $U^{6+}$-containing phosphor or a $Mn^2$-containing phosphor, by at least 0.1.

In one embodiment, refractive index modifiers may be added to the ink composition to increase the effective refractive index of the binder matrix and increase the difference between the refractive index of PFS particles and their surrounding binder matrix, resulting in increased light scattering, reduced bleed-through of blue light and increased haze of the film. The strength of scattering of a particle in a binder system is roughly proportional to the square of the difference in refractive indices of the particle with respect to matrix material.

In one embodiment, the refractive index modifiers may be high index metal oxide or metal nanoparticles. In one embodiment, the metal oxide nanoparticles have a particle size from about 1 nm to about 10 nm. In another embodiment, the metal oxide nanoparticles have a particle size of less than about 10 nm. In another embodiment, the metal oxide nanoparticles have a particle size of less than about 5 nm. In one embodiment, the metal oxide nanoparticles may be zirconium oxide, indium tin oxide, cerium oxide, tantalum oxide, titanium dioxide, aluminum oxide, zinc oxide, carbides, such as silicon carbides, nitrides, such as boron nitride, sulfides, such as carbon disulfide and mixtures thereof. In one embodiment, the binder matrix includes from about 20 wt % to about 80 wt % binder material and about 20 wt % to about 80 wt % of a refractive index modifier, based on the weight of the binder matrix. In another embodiment, the binder matrix includes from about 20 wt % to about 50 wt % binder material and about 50 wt % to about 80 wt % of a refractive index modifier, based on the weight of the binder matrix. In one embodiment, the refractive index of the binder material with the refractive index modifier is at least 1.6.

The ink composition is a stable solution with the narrow band emission phosphor particles suspended and uniformly dispersed throughout the liquid composition. The particulate size of the phosphor and viscosity of the ink composition affect the stability of the composition. Reducing the particulate size of the phosphor material and increasing the viscosity of the liquid composition improves the stability of the ink formulation with a very slow sedimentation rate. In one embodiment, the composition has a sedimentation velocity of no more than 1 mm/hr. In another embodiment, the composition has a sedimentation velocity of no more than 0.5 mm/hr.

Increasing the narrow band phosphor loading with respect to the binder material in an ink formulation increases absorption of blue light and light conversion. In one embodiment, the ink composition may include the narrow band emission phosphor in an amount from about 1 wt % to about 60 wt %. In one embodiment, the ink composition may include the narrow band emission phosphor in an amount from about 1 wt % to about 50 wt %. In another embodiment, the narrow band emission phosphor may be present in an amount from about 5 wt % to about 40 wt %. In another embodiment, the narrow band emission phosphor may be present in an amount from about 10 wt % to about 30 wt %. In another embodiment, the narrow band emission phosphor is present in an amount from about 20 wt % to about 25 wt %. In some embodiments, the narrow band phosphor is present in an amount below 10 wt %. The narrow band emission phosphor loading in the ink composition is based on the total weight of the ink composition.

In one embodiment, the ink composition includes the binder in an amount of at least 2 wt %. In another embodiment, the binder is present from about 3 wt % to about 5 wt %. The binder loading in the ink composition is based on the total weight of the ink composition.

In one embodiment, the weight loading of the narrow band emission phosphor to the binder material is in a range from about 50% to about 95%. In another embodiment, the weight loading of the narrow band emission phosphor to the binder material is in a range from about 60% to about 95%. In another embodiment, the weight loading of the narrow band emission phosphor to the binder material is in a range from about 75% to about 95%. In another embodiment, the weight loading of the narrow band emission phosphor to the binder material is greater than 90%.

In one embodiment, the ink composition includes at least one solvent that can evaporate after the ink or coating is applied to a substrate. A solvent provides a liquid media to the ink formulation and can alter the density and viscosity of the ink formulation at room temperature to provide a stable ink suspension for the narrow band emission phosphor to be uniformly dispersed within. In one embodiment, the liquid formulation has a stable dispersion with a sedimentation speed of 1.0 mm per hour or less.

In one embodiment, the solvent has a density of about 1.00 g/ml. In another embodiment, the solvent may have a melting point close to room temperature. In another embodiment, the solvent has a melting point of less than 40° C.

In one embodiment, the solvent may be an organic solvent. The organic solvents should not darken after mixing with the phosphor material. Exemplary solvents include, but not limited to, chloroform, dibutyl phosphate, diethylene glycol methyl ether, bis(2-ethylhexyl) phosphate, isobutyric acid, isobornyl acrylate, propylene glycol dimethacrylate, triethylene glycol dimethacrylate, toluene, xylenes, mesitylene, benzene, and chlorobenzene, aliphatic solvents such as hexane, cyclohexane, benzene, heptane, hexadecane, undecane, decane, dodecane, octadecane, tetradecane, and octane, alcohol-based solvents such as ethanol, propanol, isopropanol, butanol, 2-butanol, tert-butanol, terpineol, ethylene glycol, propylene glycol, glycerol, fluorinated alcohols such as 222-trifluoroethanol and 2,2,3,3-tetrafluoro-1-propanol (TFPO), ester-based solvents such as ethyl acetate, butyl acetate (BA), tert-butyl acetate, 2-(2-Butoxyethoxy) ethyl acetate (BEA), propylene glycol methyl ether acetate (PGMEA), ethylene glycol phenyl ether methacrylate and ethyl benzoate (EB), ketone-based solvents such as 2-pentanone, 3-heptanone, methyl ethyl ketone, methyl n-propyl ketone, methyl isobutyl ketone, cyclopentanone, and cyclohexanone, N-containing solvents such as trimethylamine, pyridine, 4-tert-butyl pyridine, acetonitrile and N-methyl-2-pyrrolidone (NMP) and ether-based solvents such as butyl ether, tetra(ethylene glycol) dimethyl ether, tetrahydrofuran and dioxane and sulfur-containing solvents such as dimethyl sulfoxide (DMSO).

In another embodiment, the solvent may include water. Although PFS particles may degrade when in contact with water, water may be used as a solvent when the particles have a water-resistant surface coating such as $MgF_2$. Alternatively, phosphate materials such as potassium dihydrogen phosphate (KHP) or $H_3PO_4$ may be incorporated in the ink formulation to reduce degradation.

In another embodiment, the solvent may be a mixture of multiple solvents or co-solvents. A co-solvent may be added to a primary solvent to form a solvent mixture. The co-solvent may be added to adjust ink properties such as viscosity, density, surface tension, the ability to suspend particles and decrease sedimentation speed, wetting properties and drying behaviors of films once coated. Co-solvent(s) may be incorporated in the formulation to adjust surface energy and film forming properties. In one embodiment, a co-solvent may be dibutyl phosphate or bis(2-ethylhexyl) phosphate. In another embodiment, a co-solvent mixture may be terpineol and 2-(2-Butoxyethoxy)ethyl acetate (BEA). In another embodiment, a co-solvent mixture may be 2-(2-Butoxyethoxy)ethyl acetate (BEA) and Diethylene glycol methyl ether (DGME). In another embodiment, the ink may be solventless and curable under UV or near UV light.

Narrow band emission phosphors with small particle sizes tend to agglomerate. Particles of red-emitting phosphors based on complex fluoride materials activated by $Mn^{4+}$ phosphors in a fluid exhibit random motion, known as Brownian motion, due to collisions with other particles and molecules of the fluid. Whether particles adhere to each other upon each collision relies on its surface properties, such as Zeta potential, the potential difference between the dispersion medium and the stationary layer of fluid attached to the dispersed particle. The magnitude of the zeta potential indicates the degree of electrostatic repulsion between adjacent, similarly charged particles in a dispersion. Colloids with high zeta potential (negative or positive) are electrically stabilized while colloids with low zeta potentials tend to coagulate or flocculate. Particles of red-emitting phosphors based on complex fluoride materials activated by $Mn^{4+}$ phosphors have a small or neutral zeta potential and tend to coagulate or flocculate.

In one embodiment, the red-emitting phosphors based on complex fluoride materials activated by $Mn^{4+}$ phosphors may be at least partially coated with surface coatings to enhance stability of the phosphor particles and resist aggregation by modifying the surface of the particles and increase the zeta potential of the particles. In one embodiment, the surface coatings may be a metal fluoride, silica or organic coating. In one embodiment, the red-emitting phosphors based on complex fluoride materials activated by $Mn^{4+}$ phosphors are at least partially coated with a metal fluoride, which increases positive Zeta potential and reduces agglomeration. In one embodiment, the metal fluoride coating includes $MgF_2$, $CaF_2$, $SrF_2$, $BaF_2$, $AgF$, $ZnF_2$, $AlF_3$ or a combination thereof. In another embodiment, the metal fluoride coating is in an amount from about 0.1 wt % to about 10 wt %. In another embodiment, the metal fluoride coating is present in an amount from about 0.1 wt % to about 5 wt %. In another embodiment, the metal fluoride coating is present from about 0.3 wt % to about 3 wt %. Metal fluoride coated red-emitting phosphors based on complex fluoride materials activated by $Mn^{4+}$ are prepared as described in WO 2018/093832 and US Publication No. 2020/0369956. The entire contents of each of which are incorporated herein by reference.

In one embodiment, the coated phosphor has a $MgF_2$ or $CaF_2$ surface coating and a surface Zeta potential of at least |20 mV| when measured in isopropanol. In another embodiment, the coated phosphor has a Zeta potential of at least |±30 mV| when measured in isopropanol.

In one embodiment, the red-emitting phosphors based on complex fluoride materials activated by $Mn^{4+}$ phosphors are at least partially coated with an organic coating, such as polymerized oleic acid. Oleic acid may be used to coat the phosphor particles via a solvothermal synthesis or treatment, such as by a mixing adsorption treatment.

In some embodiments, surfactants, such as small molecule surfactants or dispersants may be incorporated to reduce dispersity and agglomeration in the ink composition. Dispersants reduce agglomeration of phosphor powders with minimal impact to optical performance and reliability. Dispersants may have functional groups, such as hydroxyl (—OH), carboxyl (—COOH), sulfonate, sulfate, ammonium, amino (—$NH_2$) or imino (—NH—) for anchoring on surfaces and a buoyant moiety, which helps to keep a dispersion uniform and homogeneous. In addition, dispersants with proper functional groups may also improve wetting ability. A liquid with lower surface tension tends to wet particles better than liquids with higher surface tension. Dispersants can lower the surface tension of a liquid and the interfacial tension between the liquid and dispersing particles.

In one embodiment, the dispersants may be anionic, non-ionic, cationic or zwitterionic polymers. Anionic dispersants include, but are not limited to potassium oleate, alkyl sulfonate, polyesters, phosphoric and carboxylic acid esters, polyoxyethylene (10) ether phosphate, polyol derivatized phosphate ester, phosphates, 2-(octen-1-yl)-butanedioic acid, polyacrylates including structured or controlled polymerization technology (CPT) derived acrylates, polyacrylate salt, such as a polyol functionalized polyacrylate. In another embodiment, the dispersants are zwitterionic, such as a zwitterionic comb copolymer functionalized with amine and acid groups. In one aspect, the non-ionic dispersant may be a polyurethane based dispersant. In another embodiment, the cationic dispersant may be a polyamine dispersant, including cationic hyperbranched polyamine. In one embodiment, the dispersant may be polymers containing amine groups, polymer dispersants, such as TEGO® 689 and TEGO® 690 with pigment affinity groups, such as dodecanoic acid, polymers with OH/ether groups and pigment affinity groups. In one embodiment, the dispersant may be a polyester composed of polyhydroxystearic acid stearate. In another embodiment, the dispersant may be EO/PO block copolymers.

In one embodiment, the dispersant may be a solution of a modified urea (BYK®-7410-ET from BYK Additives and Instruments).

In one embodiment, the dispersant or surfactant may be included in amounts up to 10 wt %. In another embodiment, the dispersant or surfactant may be included in an amount from about 0.1 wt % to about 10 wt %. In another embodiment, the dispersant or surfactant may be included in an amount from about 1 wt % to about 5 wt %. The dispersant or surfactant amount is based on the total weight of the ink composition.

In one embodiment, the ink composition may include rheology modifiers. Rheology modifiers may be used to provide desirable rheological properties to the ink composition, such as adjusting the viscosity of the composition, improving dispersion stability and phosphor particle suspension and controlling the rheology profile of the composition for film forming characteristics and ink printability. In one embodiment, the rheology modifier has a viscosity greater than 100 centipoise at 20° C. In one embodiment, the rheology modifiers include silica nanoparticles and clay-based materials. In another embodiment, nanoparticles of silica may be fumed silica, precipitated silica or surface-modified hydrophobic silica.

In another embodiment, the rheology modifiers include gelators including at least one crosslinkable group. In another embodiment, the gelators may gel at temperatures at less than 30° C. In another embodiment, the gelators may gel at temperatures in the range of about 20° C. to about 30° C. Gelators, such as a wax with polymerizable functionality, may be added to the ink composition to form gel-like dispersions with good stability and low sedimentation at room temperature, which become coatable and printable liquids with much reduced viscosity upon heating. Exemplary waxes include, but are not limited to, di(hexadecyl) fumarate, oleyl cinnamide, di(4-vinyloxybutyl) octadecanedioate, non-polar acrylate waxes, such as octadecyl cinnamide, and functionalized waxes, such as dodecyl cinnamide.

Additive materials may be added to the ink composition to adjust rheological properties, adjust viscosity and optimize coatability or film-forming capability and printability. In one embodiment, materials with high thermal conductivity, such as aluminum nitride nanoparticles and microparticles may be added to the ink composition. In another embodiment, one or more electrolytes or polyelectrolytes may be added to the ink composition.

In one embodiment, the ink composition may include scattering particles. In one embodiment, the scattering particles have a particle size of at least 1 μm. In another embodiment, the scattering particles have a particle size from about 1 μm to about 10 μm. In another embodiment, the scattering particles may include titanium dioxide, aluminum oxide ($Al_2O_3$), zirconium oxide, indium tin oxide, cerium oxide, tantalum oxide, zinc oxide, magnesium fluoride ($MgF_2$), calcium fluoride ($CaF_2$), strontium fluoride ($SrF_2$), barium fluoride ($BaF_2$), silver fluoride (AgF), aluminum fluoride ($AlF_3$) or combinations thereof.

In another aspect, a film is provided. The film includes at least one narrow band emission phosphor dispersed within a binder matrix. The narrow band emission phosphor has a D50 particle size from about 0.1 µm to about 15 µm and is selected from the group consisting of a green-emitting $U^{6+}$-containing phosphor, a green-emitting $Mn^{2+}$-containing phosphor, a red-emitting phosphor based on complex fluoride materials activated by $Mn^{4+}$, and a mixture thereof.

In one aspect, a color conversion film is provided. The film may be formed by depositing the ink composition on a substrate. In one embodiment, a film may be formed by coating the ink composition on a substrate by any conventional manner. In one embodiment, a film may be formed by coating the ink composition by wet-coating, spin coating, slot-die coating, spray coating, dipping or using a doctor blade to sweep the ink composition over a surface of a substrate. In another embodiment, the film may be formed by printing the ink composition, such as by ink jet printing. In one embodiment, the films may be deposited or printed on LEDs, miniLEDs or microLEDs. In another embodiment, the film may be deposited on a display substrate, such as a glass or silicon substrate or polymer substrate, such as a thermoplastic substrate. The films have high light conversion efficiency.

The film includes particulate narrow band emission phosphor dispersed within a binder matrix. The phosphor material absorbs light from one wavelength and emits in another wavelength. The narrow band emission phosphor may be a red-emitting phosphor, a green-emitting phosphor or a combination of a red-emitting phosphor and a green-emitting phosphor. The narrow emission band phosphors absorb light from a light source, such as blue light from a blue LED, and generate red or green light or a white light. In some embodiments, the blue LED may be a micro-LED or a mini-LED.

The binder material forms a solid binder matrix holding the phosphor particulates dispersed within the matrix. After the ink composition is deposited, the film is dried or cured forming a solid binder matrix holding the dispersed phosphor particles. In one embodiment, the binder material is a polymer and the binder matrix forms upon drying the film and evaporating any volatile or liquid materials. In one embodiment, the volatile or liquid material may be evaporated by heating. In another embodiment, the film may be heated by baking in an oven or on a hotplate or with an infra-red lamp. In another embodiment, the film may be dried with drying beds or in a vacuum.

In one embodiment, the binder matrix includes a crosslinked polymer. In another embodiment, the binder material includes curable materials, such as photocurable or UV-curable materials or thermally curable or thermoset binder materials or a combination. A thermally curable or thermoset binder material will polymerize or crosslink and form a cured resin binder matrix when the film is thermally treated. Exemplary thermoset binder materials include silicone materials, such as Sylgard 184, Sylgard 186, Sylgard 527 and epoxy based materials. In one embodiment, the film may be cured by heating. In another embodiment, the film is heated to a temperature of at least 100° C. In another embodiment, the film may be heated to a temperature from about 100° C. to about 200° C. In another embodiment, the film may be heated to a temperature from about 100° C. to about 150° C. In another embodiment, the film may be heated to a temperature from about 100° C. to about 130° C. A photocurable or UV-curable binder material will polymerize or crosslink to form a UV-cured binder matrix when the film is irradiated by electromagnetic beams or a UV or blue light.

In one embodiment, the binder matrix may include refractive index modifiers as previously described. In one embodiment, the binder matrix includes from about 20 wt % to about 80 wt % binder material and about 20 wt % to about 80 wt % of a refractive index modifier, based on the weight of the binder matrix. In another embodiment, the binder matrix includes from about 20 wt % to about 50 wt % binder material and about 50 wt % to about 80 wt % of a refractive index modifier.

In one embodiment, the film includes a narrow band emission phosphor in an amount from about 20 wt % to about 98 wt % and a binder matrix in an amount from about 2 wt % to about 20 wt %, based on the total weight of the film. In another embodiment, the narrow band emission phosphor may be in amount from about 30 wt % to about 98 wt %, based on the total weight of the film. In another embodiment, the narrow band emission phosphor may be present in an amount from about 40 wt % to about 98 wt %, based on the total weight of the film. In another embodiment, the narrow band emission phosphor may be in an amount from about 50 wt % to about 98 wt %, based on the total weight of the film. In another embodiment, the narrow band emission phosphor may be in an amount from about 80 wt % to about 98 wt %, based on the total weight of the film. In another embodiment, the narrow band emission phosphor may be in an amount from about 90 wt % to about 98 wt % and a binder matrix in an amount of about 2 wt % to about 10 wt %, based on the total weight of the film. In another embodiment, the binder matrix may be present in an amount from about 2 wt % to about 10 wt %, based on the total weight of the film. In another embodiment, the binder matrix may be present in an amount from about 2 wt % to about 5 wt %. In another embodiment, the binder matrix may be present in an amount from about 5 wt % to about 8 w %, based on the total weight of the film. In another embodiment, the binder matrix may be present in an amount from about 10 wt % to about 20 wt %, based on the total weight of the film.

In another embodiment, the ink composition or film includes quantum dots. In one embodiment, the film includes quantum dots in an amount up to about 8 wt %, based on the weight of the film. In another embodiment, the film includes quantum dots in an amount from about 1 wt % to about 7 wt %, based on the weight of the film. In another embodiment, the film includes quantum dots in an amount from about 4 wt % to about 6 wt %, based on the weight of the film.

The film or phosphor containing layer may have any desired thickness suitable for its use or application. In one embodiment, the film may have a thickness of no more than 250 micrometers. In another embodiment, the film or layer may have a thickness from about 1 micrometer to about 150 micrometers. In another embodiment, the film may have a thickness from about 10 micrometers to about 150 micrometers. In another embodiment, the film thickness may be from about 10 micrometers to about 100 micrometers. In another embodiment, the film thickness may be from about 10 micrometers to about 50 micrometers. In another embodiment, the film may have a thickness from about 20 micrometers to about 50 micrometers. In another embodiment, the film may have a thickness from about 30 micrometers to about 50 micrometers. In another embodiment, the film may have a thickness from about 1 micrometer to about 10 micrometers. In another embodiment, the film or layer has a thickness of no more than 20 micrometers. In another embodiment, the film may have a thickness from about 2 micrometers to about 5 micrometers.

The phosphor material including the narrow band emission phosphors absorb blue light from a light source, such as a blue light to generate red light, green light or a white light. The degree of blue light absorption and the amount of blue light that passes through the color conversion film is called bleed-through. Depending on application requirements, some bleed-through of blue light to create white light is desired. In other embodiments, large absorption by the phosphor materials with minimal bleed-through of blue light is needed. In one embodiment, the light may be an LED, such as a mini-LED or a micro-LED.

Ink formulations and ingredients may be adjusted to provide final color conversion films and layers with desirable color conversion, absorption (blue-to-red conversion and blue-to-green conversion), bleed-through of blue light and haze. In one embodiment, bleed-through may be reduced by increasing the loading of a narrow band emission phosphor with respect to the binder matrix or adding other luminescent materials.

In one embodiment, the film includes refractive index modifiers as previously described. In one embodiment, the film includes refractive index modifiers in an amount from about 20 wt % to about 40 wt %, based on the total weight of the film. In another embodiment, the refractive index modifier is present from about 25 wt % to about 30 wt %, based on the total weight of the film.

In one embodiment, the film includes a narrow band emission phosphor in an amount from about 20 wt % to about 78 wt %, a binder matrix in an amount from about 2 wt % to about 20 wt % and a refractive index modifier in an amount from about 20 wt % to about 40 wt %, based on the total weight of the film. In another embodiment, film include a narrow band emission phosphor in an amount from about 30 wt % to about 78 wt %, a binder matrix in an amount from about 2 wt % to about 10 wt % and a refractive index modifier in an amount from about 20 wt % to about 40 wt %, based on the total weight of the film. In another embodiment, film include a narrow band emission phosphor in an amount from about 40 wt % to about 78 wt %, a binder matrix in an amount from about 2 wt % to about 10 wt % and a refractive index modifier in an amount from about 20 wt % to about 40 wt %, based on the total weight of the film.

In one embodiment, the color conversion films have a high conversion efficiency. In one embodiment, the film has a color conversion efficiency of greater than 25%. In another embodiment, the film has a color conversion efficiency of greater than 35%. In another embodiment, the film has a color conversion efficiency of greater than 40%. In another embodiment, the film has a color conversion efficiency of greater than 50%. In another embodiment, the film has a blue absorption of greater than 60%. In another embodiment, the film has a blue absorption of greater than 70%.

The films prepared from the ink composition are substantially free of uniformity or mura defects. Mura defects are non-uniformities in luminance or color that cover an extended, irregular area. The uniformity defects are perceived as luminance or color contrasts. Methods and apparatus for identifying and classifying mura defects are described in U.S. Pat. No. 5,917,935. In one embodiment, the film is free of visible agglomerates. In another embodiment, the film is uniform in color and luminance. In one embodiment, a film is substantially free of uniformity defects or mura defects if the film is free of visible agglomerates and has uniformity in color and/or luminance.

In one embodiment, the ink composition may be deposited onto a substrate by printing, such as inkjet printing or slot die coating. The ink compositions include narrow band emission phosphors having small particle sizes with good suspension stability and reduced agglomeration providing good printability or jettability. In one embodiment, the narrow band emission phosphor has a D50 particle size of up to about 10 µm. In one embodiment, the narrow band emission phosphor has a D50 particle size of up to about 5 µm. In another embodiment the phosphor has a D50 particle size of less than 5 µm. In another embodiment, the phosphor has a D50 particle size of less than 3 µm. In another embodiment, the phosphor has a D50 particle size of less than 1 µm. In another embodiment, the phosphor has a D50 particle size of up to about 2 µm.

In one embodiment, an ink composition may be used for ink jet printing. In one embodiment, ink jet printing may be made at temperatures from about 20° C. to about 100° C. In another embodiment, ink jet printing may be made from about 20° C. to about 50° C.

In one embodiment, the ink composition for ink jet printing has a viscosity in the range of 0.5 centipoise to 40 centipoise at operating temperatures and printing conditions. In another embodiment, the ink composition has a viscosity in a range from about 5 centipoise to about 30 centipoise. In another embodiment, the ink composition has a viscosity in a range from about 4 centipoise to about 20 centipoise. In another embodiment, the ink composition has a viscosity ranging from 35 centipoise at 25° C. to about 20 centipoise at 50° C. In another embodiment, the ink composition has a viscosity of less than 30 centipoise.

In one embodiment, the ink composition for jet printing may include a solvent. In another embodiment, the ink formulation includes a solvent that has a viscosity greater than 1 centipoise at room temperature. In another embodiment, the solvent has a viscosity greater than 10 centipoise at room temperature. In one embodiment, the solvent may be ethanol, water, propylene glycol methyl ether acetate (PG-MEA), propanol, ethylene glycol, terpineol, 2-(2-Butoxyethoxy)ethyl acetate (BEA) or mixtures thereof. In one embodiment, the solvent or mixture of solvents used may have a low vapor pressure or slow evaporation rate at printing conditions to prevent undesirable drying at nozzle opening.

Rheological properties and ink formulation may need to be adjusted for different printers or nozzles with different surface coatings. The surface tension should be between 28 and 40 dynes/cm. The contact angle should be more than 50 degrees on the surface of the nozzle plate for good printability. In one embodiment, the printer orifice may be about 20 µm and the jet velocity of about 4 m/s.

In one embodiment, an ink composition may be applied or deposited on a surface of a substrate by ink jet printing. Other printing techniques, such as aerosol jetting and spray coating may be used to print ink formulations with higher viscosities. For example, for aerosol jet printing, the viscosity of the ink formulation may be in a range from 0.5 centipoise to 2000 centipoise.

Figure 1B:
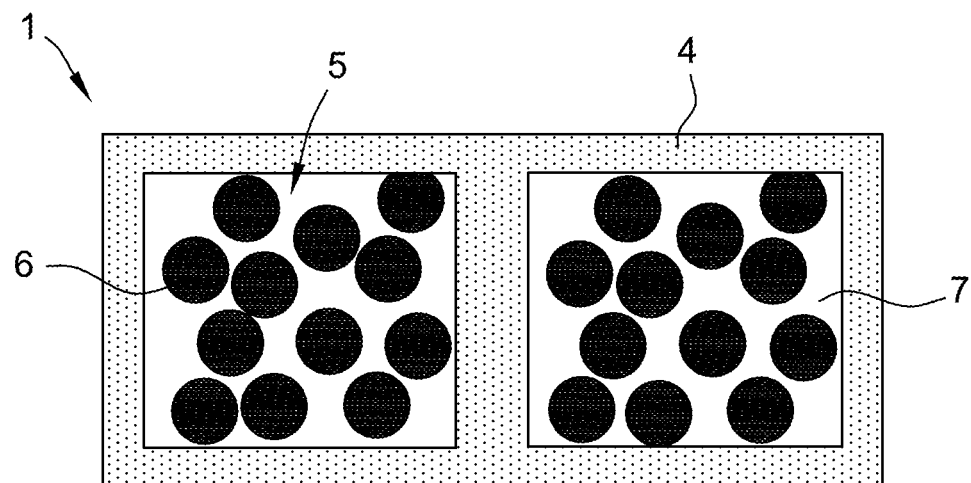
FIG. 1B is a top planar view of a matrix device, in accordance with one embodiment of the disclosure.

In one embodiment, the composition may cover at least a portion of an LED. In another embodiment, the ink composition may be printed as a pattern on a substrate, such as an LED or glass or silicon substrate or polymeric material, such as a thermoplastic substrate, by ink jet printing. In some embodiments, the ink composition may be placed over a plurality of light sources, such as an array of mini-LEDs or micro-LEDs. FIGS. 1A and 1B depict a portion of a black matrix 1 according to one embodiment of the present disclosure. A black matrix minimizes cross-talk or optical interference between adjacent pixels and provides good display contrast and definition. The black matrix 1 includes a plurality or an array of light sources 2 disposed on a substrate 3 with each light source 2 spatially separated from other light sources 2 in the array and a non-transmissive region 4 between the spatially separate light sources 2. In one embodiment, the light sources 2 may be separated from about 1 µm to about 1 mm. In another embodiment, the light sources 2 may be separated from about 1 µm to about 500 µm. In another embodiment, the light sources 2 may be separated from about 5 µm to about 300 µm. In another embodiment, the light sources 2 may be separated from about 10 µm to about 200 µm. In another embodiment, the light sources 2 may be separated from about 20 µm to about 50 µm. In one embodiment, the non-transmissive region 4 between the light sources 2 may be from about 1 µm to about 1 mm. In another embodiment, the non-transmissive region 4 between the light sources 2 may be from about 1 µm to about 500 µm. In another embodiment, the non-transmissive region 4 between the light sources 2 may be from about 5 µm to about 300 µm. In another embodiment, the non-transmissive region 4 between the light sources 2 may be from about 10 µm to about 200 µm. In another embodiment, the non-transmissive region 4 between the light sources 2 may be from about 20 µm to about 50 µm.

A color conversion film 5, as described herein, may be deposited on each of the light sources 2 by printing, such as by ink jet printing. The light sources 2 may be light emitting diodes, such as a mini-LED or a micro-LED. The color conversion film 5 includes a narrow band emission phosphor 6 dispersed within a matrix 7. The non-transmissive region 4 is substantially free of the color conversion film 5 and is substantially non-transmissive to light generated from the plurality of light sources 2. The non-transmissive region 4 may be filled by a black matrix material including one or more non-transmissive materials dispersed within a black matrix binder. The non-transmissive materials may include, but are not limited to, carbon black powders, dielectric oxides, such as aluminum oxide, or metal particles, such as Ni, Co, Fe, Cr, Cu, Pd, Au, Pt, Sn, Zn and a combination of such. In one embodiment, the black matrix binder may include binder materials, such as previously described. In another embodiment, the black matrix binder may be silicone materials, thermoplastic polymers or thermoplastic copolymers. In one embodiment, the optical density of the non-transmissive region 4, at the wavelength of light corresponding to the emission spectrum of the narrow band emission phosphor 6, is at least 1.0. In another embodiment, the optical density is at least 2.0. In another embodiment, the optical density is at least 3.0. In one embodiment, the non-transmissive region is black or dark.

In some embodiments, the non-transmissive region 4 surrounds each light source 2 or light source 2 with a printed film 5 disposed thereon, as shown in FIG. 1B. In one embodiment, the black matrix material may be filled to substantially the same height as the height of the light source 2 and color conversion film 5, such that the black matrix has a substantially planar surface, as shown in FIG. TA. In one embodiment, the non-transmissive region 4 has a depth of up to about 100 µm. In another embodiment, the non-transmissive region 4 has a depth from about 1 µm to about 100 µm. In another embodiment, the non-transmissive region 4 has a depth from about 10 µm to about 30 µm.

Figure 2:
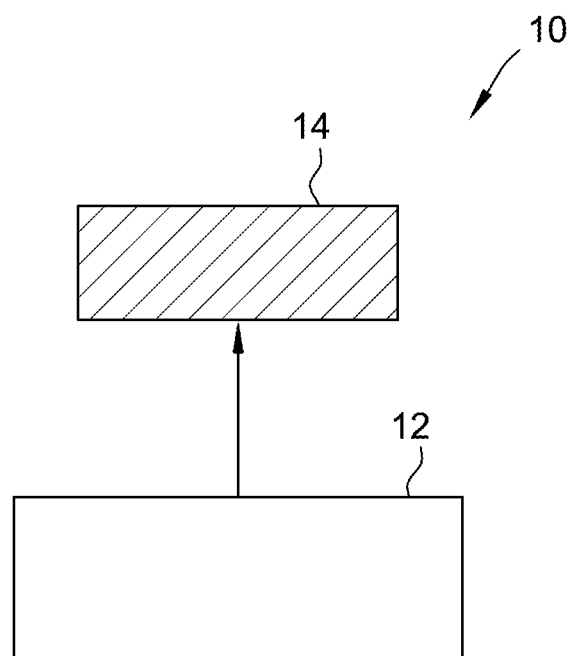
FIG. 2 is a schematic cross-sectional view of a lighting apparatus, in accordance with one embodiment of the disclosure.

Devices or LED packages according to the present disclosure include a light source optically connected or radiationally coupled to a color conversion film, which includes narrow band emission phosphors, as previously described. FIG. 2 shows a device 10, according to one embodiment of the present disclosure. The device 10 includes a light source 12 and a color conversion film 14. In the device 10, the color conversion film 14 is optically coupled or radiationally connected to the light source 12. Optically or radiationally coupled or connected means that radiation from the light source 12 is able to excite the phosphor material in the color conversion film 14 and the color conversion film 14 is able to emit light in response to the excitation by the radiation. The color conversion film 14 may be disposed on at least a part or portion of the light source 12 or may be located remotely at a distance from the light source 12.

The light source 12 may be an inorganic LED light source or an organic LED light source. The term 'LED light source', as used herein, is meant to encompass all LED light sources such as semiconductor laser diodes (LD), inorganic light emitting diodes, organic light emitting diodes (OLED) or a hybrid of LED and LD. The LED uses a pn-junction diode to emit light when activated through electroluminescence. The color of the light corresponds to the energy of the photon in accordance with the energy band gap of the semiconductor materials. In addition, the LED light source may be a chip CSP (chip scale package), miniLED, or micro LED, which may be used in self-emissive displays. A mini-LED is a sub-millimeter light emitting diode having a size of about 100 µm to about 0.7 mm. The micro-LED has a size smaller than 100 micrometers. In another embodiment, the micro-LED has a size smaller than 50 micrometers. For a micro-LED, the LED backlight may be miniaturized and arrayed with individual LEDs where each LED element as a pitch is individually addressed and driven to emit light in the same way as self-emitting OLEDs.

Further, it should be understood that the LED light source may be replaced, supplemented or augmented by another radiation source unless otherwise noted and that any reference to semiconductor, semiconductor LED, or LED chip is merely representative of any appropriate radiation source, including, but not limited to, LDs and OLEDs.

In one aspect, the light source 12 is coated or covered with the color conversion film 14. In one aspect, the color conversion coating or film is applied by ink jet printing and coats or covers the light source 12. In another aspect, the color conversion film 14 may have multiple layers deposited on the surface of the light source 12.

In one embodiment, the light source 12 may comprise a UV or blue emitting LED. In another embodiment, the light source 12 may include a mini-LED or micro-LED. In some embodiments, the light source 12 produces blue light in a wavelength range from about 440 nm to about 460 nm.

In some embodiments, the device 10 may be a backlight unit for display applications. LED backlight units (BLU) for use in displays are based on a combination of a blue LED, such as a mini-LED or micro-LED, and a phosphor material including a green-emitting phosphor and a red-emitting phosphor to provide a white light from the device. In one embodiment, the green phosphor may be a narrow band green-emitting $U^{6+}$-containing phosphor or a narrow band green-emitting $Mn^{2+}$-containing phosphor. In one embodiment, the red phosphor includes a narrow band red-emitting phosphor based on complex fluoride materials activated by $Mn^{4+}$. In another embodiment, the phosphor material includes a combination of a narrow band red-emitting phosphor based on complex fluoride materials activated by $Mn^{4+}$ with a narrow band green-emitting $U^{6+}$-containing phosphor or a narrow band green-emitting $Mn^{2+}$-containing phosphor.

Figure 3:
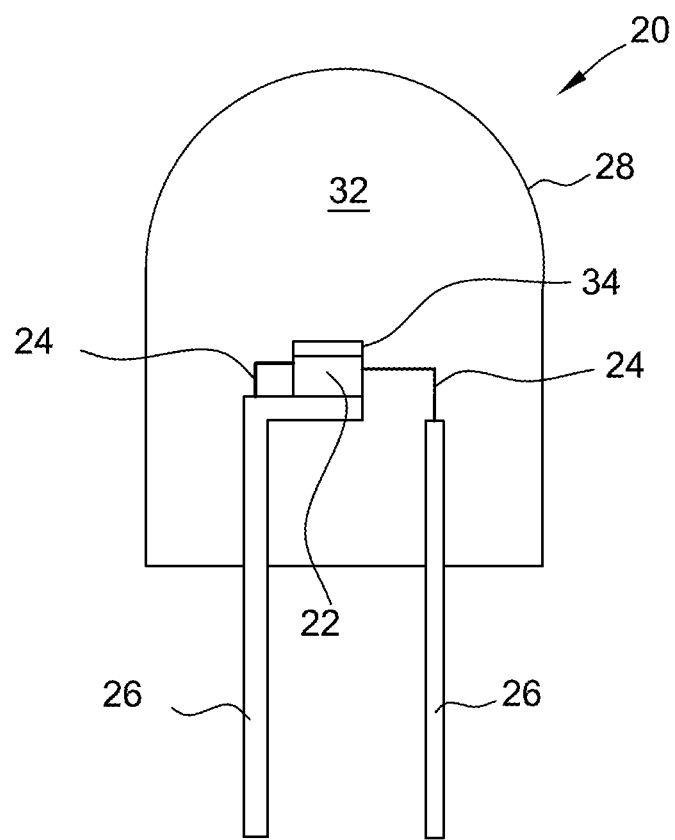
FIG. 3 is a schematic cross-sectional view of a lighting apparatus, in accordance with one embodiment of the disclosure.

In one embodiment, a lighting apparatus comprises the device. FIG. 3 illustrates a lighting apparatus or lamp 20, in accordance with some embodiments. The lighting apparatus 20 includes a light source 22, such as an LED chip, and leads 24 electrically attached to the light source 22. The leads 24 may comprise thin wires supported by a thicker lead frame(s) 26 or the leads 24 may comprise self-supported electrodes and the lead frame may be omitted. The leads 24 provide current to light source 22 and thus cause it to emit radiation. In one embodiment, the LED chip may be a mini-LED chip or a micro-LED chip.

The light source 22 may be encapsulated within an envelope 28. The envelope 28 may be formed of, for example, glass or plastic. The light source 22 may be enclosed by an encapsulant material 32. The encapsulant material 32 may be a low temperature glass, or a polymer or resin known in the art, for example, an epoxy, silicone, epoxy-silicone, acrylate or a combination thereof. In an alternative embodiment, the lighting apparatus 20 may only include the encapsulant material 32 without the envelope 28. Both the envelope 28 and the encapsulant material 32 should be transparent to allow light to be transmitted through those elements.

With continued reference to FIG. 3, a color conversion film 34, as previously described, is disposed on a light emitting surface of the light source 22. The film 34 may be disposed by any appropriate method, for example, by coating or printing. As illustrated, the layer 34 may be disposed for example, coated over or directly on the surface of the light source 22 by coating or printing and drying or curing the coating over the LED light source 22. The light emitted by the light source 22 mixes with the light emitted by the color conversion film 34 to produce desired emission.

Figure 4:
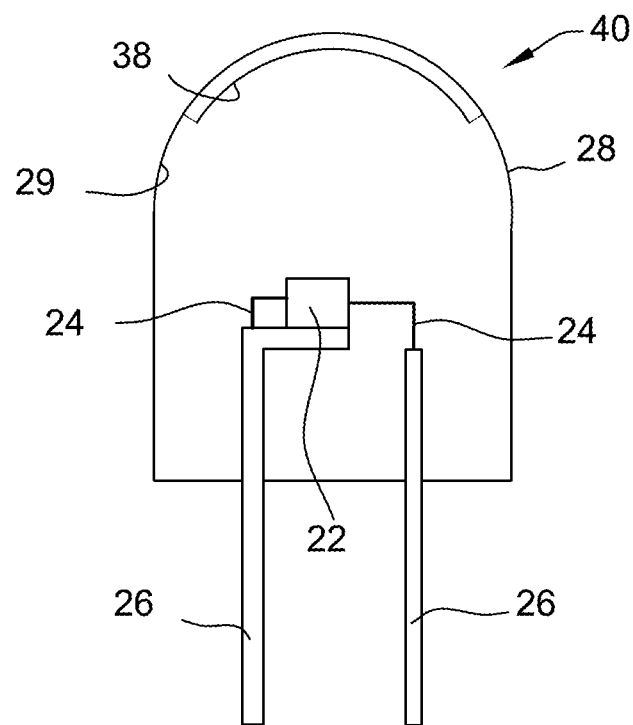
FIG. 4 is a schematic cross-sectional view of a lighting apparatus, in accordance with one embodiment of the disclosure.

In some other embodiments, a color conversion film 38 is coated onto a surface of the envelope 28 as illustrated in FIG. 4 showing an exemplary embodiment of a lighting apparatus 40, instead of being formed over the light source 22 (FIG. 3). As shown, the film 38 is coated on an inside surface 29 of the envelope 28, although the film 38 may be coated on an outside surface of the envelope 28, if desired. The film 38 may be coated on the entire surface of the envelope 28 or only a top portion of the inside surface 29 of the envelope 28. The light emitted by the light source 22 mixes with the light emitted by the film 38, and the mixed light transmits out. The color conversion film may be located in either or both locations (as shown in FIGS. 3 and 4) or in any other suitable location, such as in a remote location, separately from the envelope 28 or integrated into the light source 22.

In any or all of the above configurations, the lighting apparatus 20 or 40 shown respectively in FIG. 3 or FIG. 4 may also include a plurality of scattering particles (not shown), which are embedded in the encapsulant material 32. The scattering particles may comprise, for example, alumina, silica, zirconia, or titania. The scattering particles effectively scatter the directional light emitted from the light source 22, preferably with a negligible amount of absorption.

Figure 5:
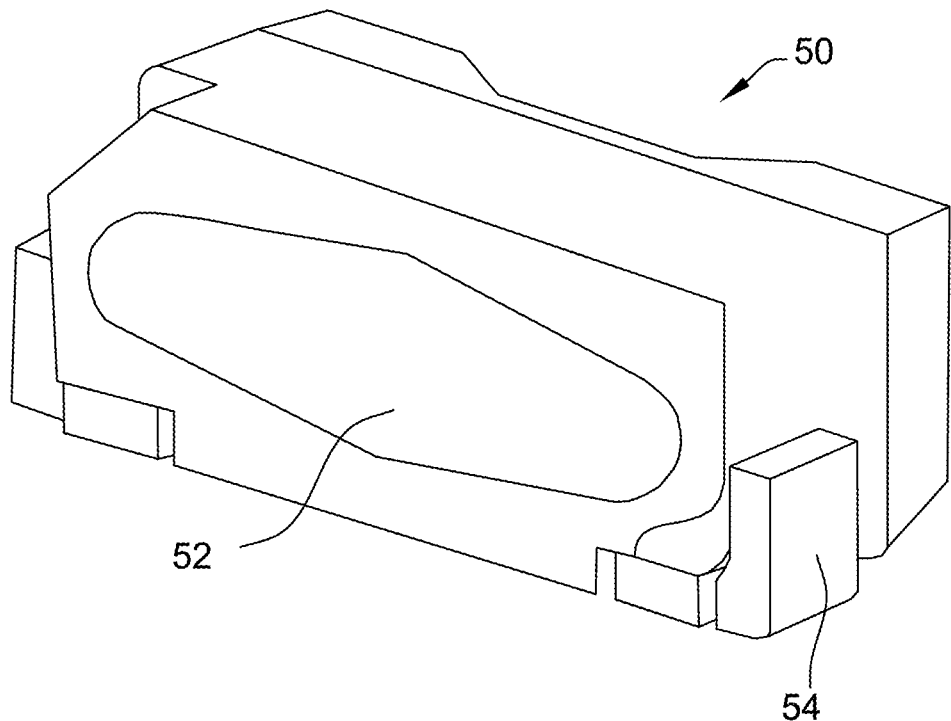
FIG. 5 is a schematic perspective view of a backlight apparatus, in accordance with one embodiment of the disclosure.

In one embodiment, the lighting apparatus 20 or 40 shown in FIG. 3 or FIG. 4 may be a backlight apparatus. In another embodiment, the backlight apparatus comprises a backlight unit 10. Some embodiments are directed to a backlight apparatus 50 as illustrated in FIG. 5. The backlight apparatus 50 includes a surface mounted device (SMD) type light emitting diode for backlight or display applications. This SMD is a "side-emitting type" and has a light-emitting window 52 on a protruding portion of a light guiding member 54. An SMD package may comprise an LED chip and a color conversion film. In one embodiment, the backlight apparatus may be an edge lit apparatus or side-emitting apparatus. In another embodiment, the backlight apparatus may be a direct lit apparatus. A backlight apparatus and related devices are described in U.S. Publication No. 2017/0254943 and PCT Publication No. 2018/190827, the entire contents of each of which are incorporated herein by reference.

Figure 6A:
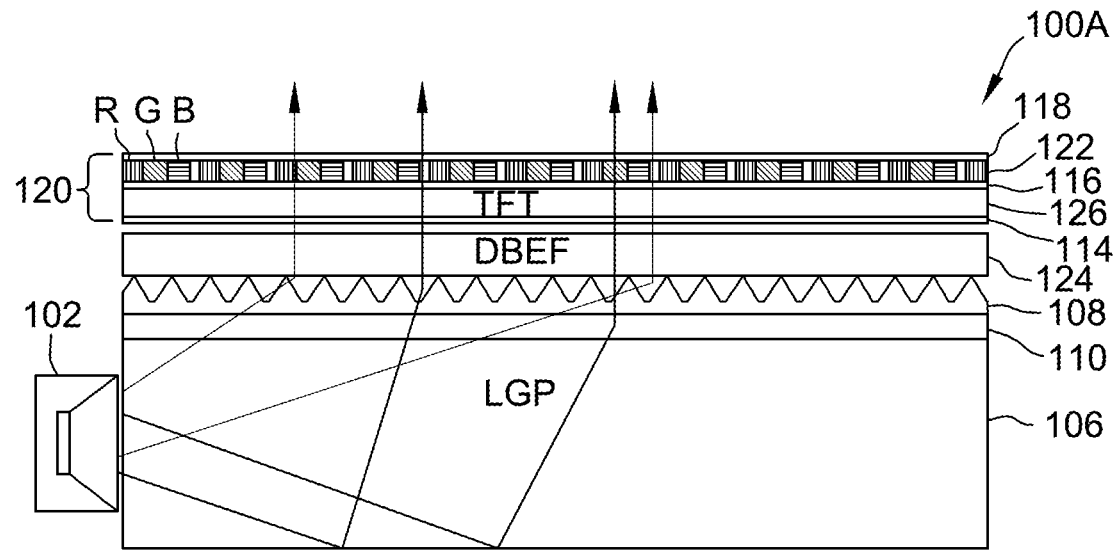
FIG. 6A illustrates a liquid crystal display (LCD) with an edge lit configuration, in accordance with one embodiment of the disclosure.

The films may be used in direct lit and edge lit LCD display devices. FIG. 6A illustrates an embodiment of a single mode liquid crystal display (LCD) with an edge lit backlight configuration. LCD 100A includes a light apparatus or backlight apparatus 102, as described previously in FIG. 3 or FIG. 4, light guide panel 106 and an LCD panel 120. The LCD 100A uses the LCD panel 120 with control electronics and the backlight apparatus 102 to produce color images. The backlight apparatus 102 provides white light and represents a plurality of backlight apparatuses 102 along one or more edges of the LCD 100A. The LCD 100A uses the LCD panel 120 with control electronics and the LED backlighting 100 to produce color images.

The LCD panel 120 includes color filters 122 arranged in subpixels, such as a red color filter, a green color filter and a blue color filter. The red, green and blue filters 122 transmit a light having a specific wavelength of white light incident from the backlight apparatus 102. The filters 122 transmit wavelengths of light corresponding to the color of each filter and absorb other wavelengths.

The LCD panel 120 may include a front polarizer 118, a rear polarizer 114, a thin film transistor (TFT) 126 and liquid crystal 116, as well as electrodes (not shown). The color filters 122 may be positioned between the liquid crystal 116 and the front polarizer 118. The thin film transistor 126 may be positioned between the liquid crystal 116 and the rear polarizer 114. Each pixel has a corresponding transistor or switch for controlling voltage applied to the liquid crystal 116. The front and rear polarizers 118 and 114 may be set at right angles. In one aspect, the LCD panel 120 is opaque. When a voltage is applied across the liquid crystal 116, rod-shaped polymers align with the electric field and untwist such that the voltage controls the light output from the front polarizer 118. For example, when a voltage is applied to the liquid crystal 116, the liquid crystal 116 rotates so that there is a light output from the front polarizer 118.

White light from the backlight apparatus 102 travels toward light guide panel (LGP) 106, through diffuser film 110 and prism 108, as well as double brightness enhanced film (DBEF) 124, which provides a uniform light backlight for the LCD panel 120.

The LED backlighting 102 and LCD 100A may include additional components typical in an optical stack. In one aspect, diffusers, reflectors or glass filters may be provided. In another aspect, a cover glass may cover the optical stack.

Figure 6B:
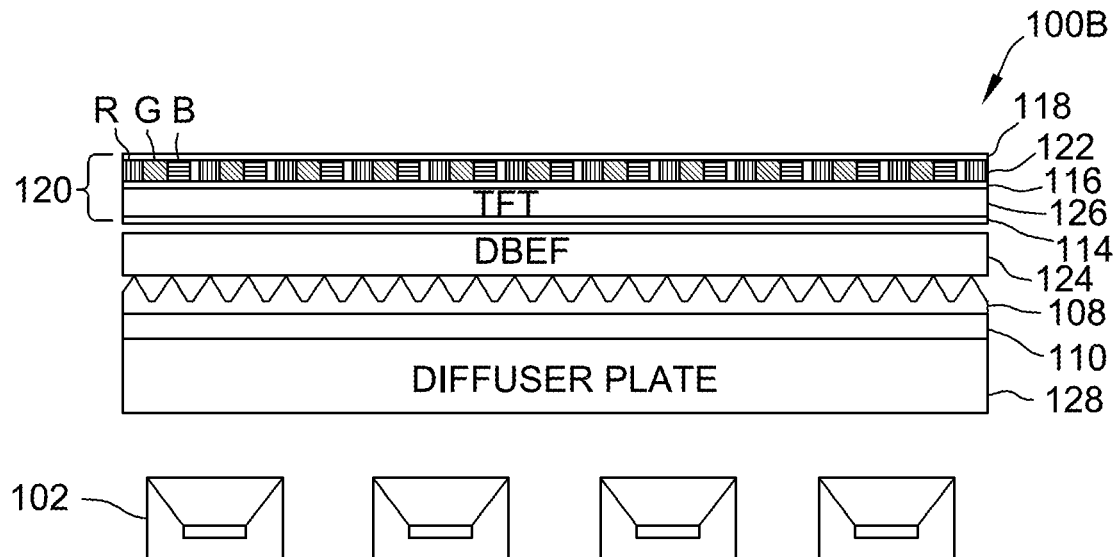
FIG. 6B illustrates a liquid crystal display (LCD) with a direct lit configuration, in accordance with one embodiment of the disclosure.

FIG. 6B illustrates an embodiment of a single mode LCD 100B with a direct view/lit backlight configuration. The direct lit backlight configuration is similar to the edge lit backlight configuration shown in FIG. 6A, except that there is no light guide panel 106 and there is a different arrangement of LEDs. A plurality of backlight apparatuses 102 are arranged to directly provide light to a diffuser plate 128, which may support a diffuser film 110.

Figure 7:
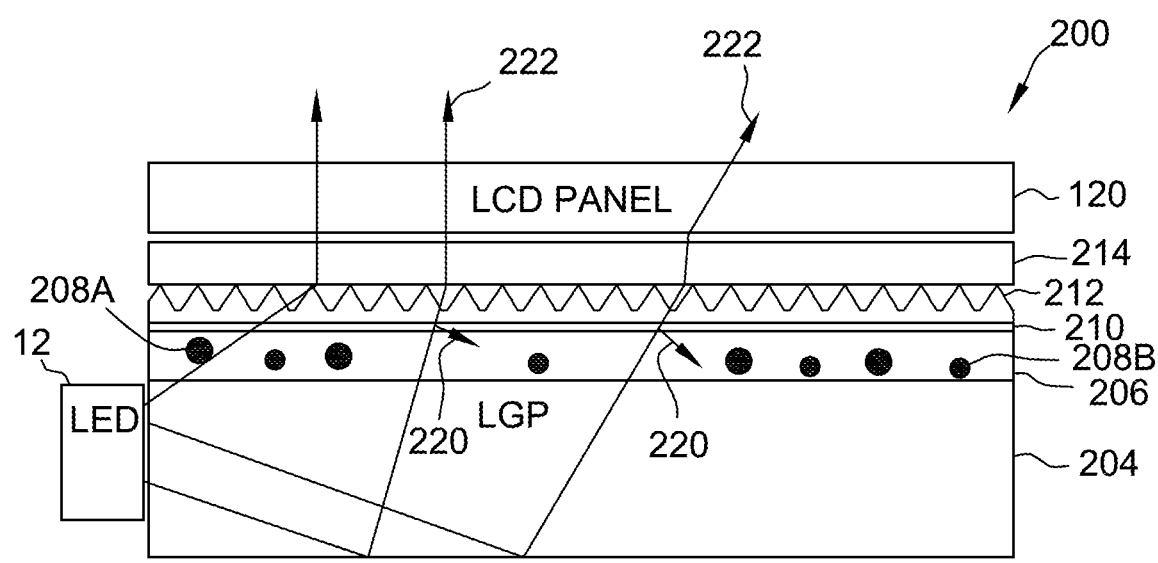
FIG. 7 illustrates a liquid crystal display (LCD) with an edge lit configuration, in accordance with one embodiment of the disclosure.

FIG. 7 illustrates an exemplary embodiment of a backlight unit or module 200 that includes light source 12 as previously described in FIG. 2, light guide panel (LGP) 204, color conversion film 206, dichroic filter 210 and LCD panel 120 as previously described in FIG. 6A. Backlight unit 200 may also optionally include a prism 212 and a double brightness enhanced film (DBEF) 214. The light source 12 is a blue emitting LED and may be a mini-LED or micro-LED. To produce even lighting, blue light from the light source 12 first passes through light guide panel 204, which diffuses the blue light. Generally, there is an air space between the LCD panel 120 and the double brightness enhanced film (DBEF) 214. The double brightness enhanced film is a reflective polarizer film which increases efficiency by repeatedly reflecting any unpolarized light back, which would otherwise be absorbed by the LCD's rear polarizer 118. The double brightness enhanced film 214 is placed behind the LCD panel 120 without any other film in-between. The double brightness enhanced film 214 may be mounted with its transmission axis substantially parallel to the transmission axis of the rear polarizer 118. The double brightness enhanced film 214 helps recycle the white light 220 that would normally be absorbed by the rear polarizer 118 of the LCD panel 120, and thus, increases the brightness of the LCD panel 120 and light 222 emitting from the LCD panel 120. In another embodiment, the prism 212 may be removed or substituted by other brightness enhancement components. In another aspect, the double brightness enhanced film may be removed.

The backlight unit or module 200 includes a color conversion film 206 located remotely at a distance from the light source 12. The color conversion film 206 includes phosphor material including particles of a narrow band emission phosphor. The phosphor material includes a green-emitting phosphor 208A and a red-emitting phosphor 208B. In one embodiment, the green-emitting phosphor comprises a narrow band green-emitting $U^{6+}$-containing phosphor or a narrow band green-emitting $Mn^{2+}$-containing phosphor. In another embodiment, the red-emitting phosphor comprises a narrow band red-emitting phosphor based on complex fluoride materials activated by $Mn^{4+}$. The color conversion film 206 is remote in the sense that the primary light source and the phosphor material are separate elements, and the phosphor material is not integrated with the primary light source as a single element. Primary light is emitted from the primary light source and travels through one or more external media to radiationally or optically couple the light source 12 to the phosphor material in the color conversion film 206.

It will be appreciated by those skilled in the art that a backlight unit or module according to an aspect of the disclosure may vary in configuration. For example, a direct lit configuration may be used, similar to the direct light configuration shown in FIG. 6B.

A display device or display provides information or images from a processor or other type of information management system by converting electrical signals into pixilated multicolor displays. Displays may be self-emissive, such as micro-LED or organic light emitting diode displays (OLED) with organic light emitting diode layers to produce light. A liquid crystal display (LCD) uses backlighting, such as from LED light sources and individual liquid crystal cells. In one embodiment, the display device includes the color conversion film as previously described. Examples of devices that include a backlighting or direct emission display. Display applications include, but are not limited to televisions, plasma screens, home and theater projections, digital photo frames, tablets, automotive displays, e-book reader, electronic dictionary, digital camera, computers, laptops, computer monitors, electronic keyboard, cellular or conventional phone, mobile phones, smartphones, tablet computers, gaming device, other handheld devices that have a display and other electronic devices with a screen. The list of these applications is meant to be merely exemplary and not exhaustive.

EXAMPLES

Example 1

A mixture of solvents, referred to as T/BEA, was prepared by mixing 33.2 g of terpineol with 16.6 g 2-(2-Butoxyethoxy)ethyl acetate (BEA) at room temperature and stirred for 30 mins.

Two phosphor PFS ($K_2SiF_6:Mn^{4+}$)powders, PFS Sample Nos. 395 and F2531-120-2 were used in this Example. PFS Sample No. F2531-120-2 has a D10/D50/D90 particle size distribution of 8.9/10.5/12.3 μm.

PFS Sample No. 395 was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. The powder was sonicated to a D50 particle size of 7.9 μm with a D10/D50/D90 particle size distribution of 6.9/7.9/9.2 μm, as measured by Horiba Particle Size Analyzer. The powder has Mn %=3.55.

PFS Sample No. F2531-120-2 was prepared from PFS Sample No. 425 ($K_2SiF_6:Mn^{4+}$) by surface coating the PFS powder with 2.5% $MgF_2$. PFS Sample No. 425 was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh and washed in a second wash treatment step in a nearly saturated solution of $K_2SiF_6$ in 49% HF for 30 minutes. PFS sample has a D50 particle size of 12.0 μm (unsonicated).

The powder was coated with $MgF_2$, as follows: 12 mL of a 0.22 g/mL solution of $MgSiF_6 \cdot 6H_2O$ in 17.5% aq. $H_2SiF_6$ was added over 30 minutes into a reaction mixture containing a magnetic stir bar and 25 g of $K_2SiF_6:Mn^{4+}$ in 240 mL of 49% aq HF saturated with $K_2SiF_6$. The mixture was stirred vigorously for 30 sec (300 rpm) after which the stirring was turned down to 120 rpm. After the addition was complete, the stirring was stopped, the stir bar was removed and the reaction mixture was allowed to settle for 5 minutes. The supernatant was decanted and discarded. The wet slurry was mixed with 150 mL of 49% aq HF saturated with $K_2SiF_6$. The wash mixture was allowed to settle for 5 minutes and then the supernatant was decanted and discarded. The slurry was transferred to a plastic Buchner funnel fitted with a 0.65 μm fluoropolymer membrane. The residual HF solution was filtered off and the phosphor cake was washed with acetone 5 times, using a total of 500 mL acetone, churning the solid before each wash. The product was dried under vacuum for 3 days and then sifted through a 170 mesh membrane to afford the final coated product, PFS Sample No. F2531-120-2 with Mn %=2.13 and a 0.67% $MgF_2$ coating.

Four ethyl cellulose (EC) materials, obtained from Aldrich with a product number of 200646, 46070, 46080 and 200654, hereafter referred to as EC-L, EC-M, EC-H and EC-HH, respectively, were used as received without any further purification. All EC have a similar amount (48.0-

49.5% (w/w) of ethoxyl basis, optical refractive index of 1.47 and density of 1.14 g/ml at 25° C. The EC materials have different molecular weights and viscosities when measured as a 5 wt % solution in toluene/ethanol (80:20) at 25° C.

TABLE 1

| Ethyl cellulose (product number) | Abbreviation | Viscosity in data sheet |
|---|---|---|
| EC (200646) | EC-L | 4 cP |
| EC (46070) | EC-M | 7~15 cP |
| EC (46080) | EC-H | 30~70 cP |
| EC (200654) | EC-HH | 300 cP |

Example 2

A 3.3 wt % solution of EC-M was prepared by mixing 0.35 g of EC-M (see Example 1) in 10.25 g of T/BEA solvent mixture (see Example 1), hereafter referred to as T/BEA_EC-M (3.3%). A 3.3 wt % solution of EC-H was prepared by mixing 0.42 g of EC-H (see Example 1) in 12.3 g of T/BEA solvent mixture hereafter referred to as T/BEA EC-H (3.3%). The two solutions were stirred overnight at 80° C. to dissolve the ethyl cellulose completely, and then cooled to room temperature for the following experiments.

0.15 g of PFS Sample No. F2531-120-2 (see Example 1) was mixed with 3 g of T/BEA_EC-M (3.3%) varnish to prepare a PFS-containing dispersion, referred to as T/BEA_EC-M(3.3%)-PFS(5%); 0.19 g of PFS Sample No. F2531-120-2 was mixed with 3.8 g of T/BEA_EC-H(3.3%) varnish to prepare a PFS-containing dispersion, referred to as T/BEA_EC-H(3.3%)-PFS(5%); 0.2651 g of PFS Sample No. 395 (see Example 1) was mixed with 4.28 g of T/BEA_EC-M(3.3%) varnish to prepare a PFS-containing dispersion, referred to as T/BEA_EC-M(3.3%)-PFS395(5%); 0.2215 g of PFS Sample No. 395 was mixed with 3.76 g of T/BEA_EC-H(3.3%) varnish to prepare a PFS-containing dispersion, referred to as T/BEA_EC-H(3.3%)-PFS395 (5%). All of the dispersions having a PFS loading of 5 wt % were first stirred for 2 hours at room temperature, followed by vigorous mixing on a vortex mixer for 1-2 minutes to reduce the particle agglomerates, and rolled at a speed of 60 rpm on a bottle roller for 2 hours. The homogeneous dispersions were stirred for another 2 hours at 80° C. and then cooled down to room temperature for settling tests. Dry films coated from the dispersions had a PFS to binder (EC) ratio of 60 to 40.

At 60 minutes, Sample T/BEA_EC-M(3.3%)-PFS395 (5%) had some settling; and Sample T/BEA EC-H(3.3%)-PFS395(5%) had no settling. At 61 minutes, Sample T/BEA EC-M(3.3%)-PFS(5%) had some settling; and Sample T/BEA_EC-H(3.3%)-PFS(5%) had no settling. At 120 minutes, Sample T/BEA_EC-M(3.3%)-PFS395(5%) had increased settling; and Sample T/BEA_EC-H(3.3%)-PFS395(5%) had minimal settling. At 198 minutes, Sample T/BEA_EC-M(3.3%)-PFS(5%) had increased settling; and Sample T/BEA_EC-H(3.3%)-PFS(5%) had no settling.

All four dispersions show improved dispersion stability with respect to PFS dispersed in T/BEA only. EC-H based dispersions, i.e. T/BEA_EC-H(3.3%)-PFS(5%) and T/BEA_EC-H(3.3%)-PFS395(5%), show better dispersion stability than the EC-M based dispersions, i.e. T/BEA_EC-M(3.3%)-PFS(5%) and T/BEA_EC-M(3.3%)-PFS395(5%) due to their higher viscosities. In comparison, PFS Sample No. F2531-120-2 with the MgF$_2$ coating has better dispersion stability than PFS Sample No. 395 without MgF$_2$ coating, which can be partially explained by the fact that PFS with the MgF$_2$ coating has a larger positive Zeta potential (57.2 mV for Sample No. F2531-120-2) than PFS without MgF$_2$ coating (4.6 mV for Sample No. 395), as the larger positive Zeta potential can hinder agglomeration.

Example 3

1.63 g of PFS Sample No. F2531-120-2 (see Example 1) was mixed with 2.45 g of T/BEA_EC-M(3.3%) varnish (see Example 2) to prepare a PFS-containing dispersion, referred to as T/BEA_EC-M(3.3%)-PFS(40%); 1.95 g of PFS Sample No. F2531-120-2 was mixed with 2.93 g of T/BEA_EC-H(3.3%) varnish (see Example 2) to prepare a PFS-containing dispersion, referred to as T/BEA_EC-H(3.3%)-PFS(40%). The two dispersions were first stirred for 2 hours at room temperature, followed by vigorous mixing on a vortex mixer for 1-2 minutes to reduce the particle agglomerates, and rolled at a speed of 60 rpm on a bottle roller for 2 hours. The homogeneous dispersions were stirred for another 2 hours at 80° C., and then cooled down to room temperature for settling tests.

At 130 minutes, Sample T/BEA_EC-M(3.3%)-PFS(40%) had about 30% settling; and Sample T/BEA_EC-H3.3%)-PFS(40%) had about 25% settling. At 188 minutes, Sample T/BEA_EC-M(3.3%)-PFS(40%) had about 50% settling; and Sample T/BEA_EC-H3.3%)-PFS(40%) had about 30% settling.

Both samples show improved dispersion stability with respect to PFS dispersed in T/BEA only. The T/BEA_EC-H3.3%)-PFS(40%) dispersion has better dispersion stability than T/BEA_EC-M(3.3%)-PFS(40%) due to its higher viscosity.

Both dispersions were used to spin-coat PFS:EC films. Pre-cleaned glass slides were used as substrates for spin coating that was carried out in air. Approximately 0.7 ml of dispersion was applied onto the substrate and spun for 60 seconds to obtain a wet film. Film thickness was adjusted by using different spin-speeds. The coated substrate was baked on a pre-heated hotplate at 150° C. for 10 min before testing. The spin-coated films were then placed inside an integration sphere and optically pumped with a blue 450 nm LED. Optical powers of the blue region (400-550 nm) and red region (550-700 nm) were recorded. Blue-to-red conversion efficiency is calculated as:

$$\text{Conversion Efficiency} = \frac{Red_{film}}{(Blue_{LED} - Blue_{film})}$$

where $Blue_{LED}$, $Blue_{film}$ and $Red_{film}$ is optical power in units of μWatt for blue LED, blue emission and red emission with the film in place, respectively.

Shown in Table 2 are results for spin-coated films using the dispersion of T/BEA_EC-H(3.3%)-PFS(40%). The final dry films consist of ~92% of PFS and ~8% EC-H. The films are free of uniformity defects.

TABLE 2

| Spin speed (krpm) | Film thickness (um) | Blue-to-red conversion efficiency |
|---|---|---|
| 0.7 | 33 | 36.7% |
| 1.2 | 25 | 36.3% |
| 4 | 12 | 26.3% |

Example 4

0.2686 g of a binder, poly(vinylidene fluoride-co-hexafluoropropylene) (PVDF-HFP), was mixed with 15.18 g of cyclohexanone (CH) and stirred overnight at 80° C. to obtain a clear solution. The solution referred to as CH_PVDF-HFP has a viscosity of 15.37 cP at 25° C., which translates to a sedimentation velocity of less than 1 mm/hr for a 2 μm $K_2SiF_6:Mn^{4+}$ particle.

PFS Sample No. F2664-43-1 was prepared from PFS Sample No. 466 ($K_2SiF_6:Mn^{4+}$) by surface coating the PFS powder with 2.5% $MgF_2$. PFS Sample No. 466 was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. The PFS sample has a D50 particle size of 9.96 μm without sonication and 9.4 μm under sonication.

The powder was coated with $MgF_2$, as follows: 35.48 mL of a 0.22 g/mL solution of $MgSiF_6.6H_2O$ in 17.5% aq. $H_2SiF_6$ was added over 30 minutes into a reaction mixture containing a magnetic stir bar and 70 g of $K_2SiF_6:Mn^{4+}$ in 665 mL of 49% aq HF saturated with $K_2SiF_6$. The mixture was stirred vigorously for 30 sec (300 rpm) after which the stirring was turned down to 120 rpm. After the addition was complete, the stirring was stopped, the stir bar was removed and the reaction mixture was allowed to settle for 5 minutes. The supernatant was decanted and discarded. The wet slurry was mixed with 250 mL of 49% aq HF saturated with $K_2SiF_6$. The wash mixture was allowed to settle for 5 minutes and then the supernatant was decanted and discarded. The slurry was transferred to a plastic Buchner funnel fitted with a 0.65 μm fluoropolymer membrane. The residual HF solution was filtered off and the phosphor cake was washed with acetone 5 times, using a total of 1 L acetone, churning the solid before each wash. The product was dried under vacuum for 3 days and then sifted through a 170 mesh membrane to afford the final coated product PFS Sample No. F2664-43-1 with Mn %=2.49 and a 1.65% $MgF_2$ coating and has a D10/D50/D90 particle size distribution of 7.9/9.4/11.1 μm.

2.28 g of PFS Sample No. F2664-43-1 was mixed with 3.45 g of CH_PVDF-HFP varnish to prepare a 40 wt % PFS dispersion, referred to as CH_PVDF-HFP-PFS(40%). The dispersion was first stirred for 2 hours at room temperature, followed by vigorous mixing on a vortex mixer for 1-2 minutes to reduce the particle agglomerates, and rolled at a speed of 60-70 rpm on a bottle roller for 2 hours. The homogeneous dispersion was stirred for another 2 hours at 80° C., and then cooled down to room temperature for film coating.

The dispersion having PVDF-HFP was very stable and shows little sedimentation after 30 mins. By contrast, the majority of PFS particles in a dispersion in cyclohexanone without PVDF-HFP settle to the bottom within 10 minutes.

The dispersion CH_PVDF-HFP-PFS(40%) was then used to spin-coat PFS:PVDF-HFP films. Pre-cleaned glass slides were used as substrates for spin coating that was carried out in air. Approximately 0.7 ml mixture was added onto the substrate, which was then spun at 700 rpm for 20 seconds to spread the liquid and then (without stopping) at 1500 rpm for 60 seconds to obtain a wet film. The wet film was baked on a pre-heated hotplate at 150° C. for 10 mins before testing. The final baked film consisting of 97.4% of PFS in 2.6% PVDF-HFP has a thickness of ~35 μm and a blue-to-red conversion efficiency of 36.8%.

Example 5

Two samples were prepared using PFS Sample No. 395 (see Example 1). A binder material poly(methyl acrylate) (PMA) 40 wt % solution in toluene was purchased from Aldrich with a product number of 182214 and $M_W$ of ~40,000 and used as received. To prepare the first sample, hereafter referred to as PFS-Toluene, 1 g of PFS Sample No. 395 was combined with 4 g of toluene to give a 20 wt % dispersion. To prepare the second sample, hereafter referred to as PFS-PMA-Toluene, 1 g of PFS Sample No. 395 was combined with 4.6 ml of the 40 wt % PMA solution in toluene to give a 15 wt % dispersion. The volume of 4.6 ml for PFS-PMA-Toluene was chosen so that its total volume was the same as sample PFS-Toluene. Each sample was vortexed to mix thoroughly and left undisturbed to observe settling behavior. The sample PFS-Toluene (toluene only) settled ~15% in 30 minutes while PFS-Toluene-PMA (toluene and 40 wt % poly(methyl acrylate)) did not show any appreciable settling over the same time frame.

Example 6

Two samples were prepared using PFS Sample No. 320, which is PFS ($K_2SiF_6:Mn^{4+}$) having a D10/D50/D90 particle size distribution of 9.0/13.6/20.2 μm. A binder material polyvinyl alcohol (PVA) was purchased from Aldrich with a product number of 363065 and $M_W$ of 146,000-186,000 and used as received.

PFS Sample No. 320 was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh and washed in a second wash treatment step in a nearly saturated solution of $K_2SiF_6$ in 49% HF for 30 minutes. The powder was subjected to a 'roasting' step, an additional low temperature anneal performed after the second wash treatment, at 150° C. for four hours under a 20% fluorine:80% nitrogen atmosphere. The powder had a D50 particle size of 13.6 μm, as measured by SEM. The powder has Mn % of about 1.32.

To prepare the first sample, hereafter referred to as "5 Control", 0.4 g of Sample No. 320 was dispersed into 2 ml of 2,2,3,3-tetrafluoro-1-propanol (TFPO). To prepare the second sample, hereafter referred to as "5D", 0.5 g of the Sample No. 320 and 0.03 g of PVA were dispersed into 2 ml of TFPO and mixed well. Both samples were vortexed for 30 seconds to form dispersions and then left undisturbed to observe settling behavior.

At 30 min after the sample preparation, the sample "5 Control" had completely settled; and the sample "5D" had no settling. Adding PVA significantly improves stability of the dispersion with a dramatically reduced sedimentation speed.

Example 7

0.3772 g of binder material polyvinyl butyral (PVB) was mixed with 12.15 g of T/BEA (see Example 1), stirred overnight at 80° C. to obtain a clear solution. The solution referred to as T/BEA_PVB has a viscosity of 42.1 cP at 25° C., which translates to a sedimentation velocity of less than 0.5 mm/hr for a 2 μm $K_2SiF_6:Mn^{4+}$ particle.

2.23 g of PFS Sample No. F2664-43-1 (from Example 4) was mixed with 3.35 g of T/BEA_PVB varnish. The dispersion, referred to as Sample 030820-B, was first stirred for 2 hours at room temperature, followed by vigorous mixing on a vortex mixer for 1-2 minutes to reduce the particle agglomerates, and rolled at a speed of 60-70 rpm on a bottle roller for 2 hours. The homogeneous dispersion was stirred for another 2 hours at 80° C., and then cooled to room temperature.

Example 8

For this example, PFS Sample No. PFS GRC082718SSTGA(316/318) was used. The PFS Sample $K_2SiF_6$:$Mn^{4+}$ (PFS) was prepared by the process described in US Publication No. 2018/0163126. The powder was washed in a nearly saturated solution of $K_2SiF_6$ in 49% HF and annealed at 540° C. for 8 hours under a 20% fluorine: 80% nitrogen atmosphere. The annealed powder was sifted through 280 mesh and washed in a second wash treatment step in a nearly saturated solution of $K_2SiF_6$ in 49% HF for 30 minutes. The powder had a D10/D50/D90 particle size distribution of 9.8/14.4/21.8 μm.

In a plastic vial, 0.5 g of PFS Sample No. PFS GRC082718SSTGA(316/318) was mixed with a thermoset binder, pre-mixed Sylgard 184 (1.5 g that consists of 1.36 g part A and 0.14 g of part B). The PFS loading with respect to Sylgard 184 A+B was 25 wt %. The mixture was gently mixed using a wooden Q-tip stick to obtain a homogenous mixture free of visual agglomeration. The mixture was degassed under a vacuum for 5 min. Pre-cleaned glass slides were used as substrates for spin coating that was carried out in air. A glass substrate (1"×1" or 25 mm×25 mm) was loaded onto a spinner chuck. First, approximately 0.5 ml of mixture was applied onto the substrate and spun at 500 rpm for 15 seconds and then (without stopping) spun at 3000 rpm for 60 seconds to obtain a wet film. The coated substrate was baked on a pre-heated hotplate for 30 seconds to dry off any volatile materials. The coated substrate was placed in a pre-heated oven and the film was cured at 125° C. for 30 min. The thickness of the resulting film was about 55 μm. The film had a blue-to-red conversion efficiency of 42.3%.

Another film was prepared using Sylgard 184 diluted with toluene. In a plastic vial, 2 g of Sylgard 184 Part A was diluted with 1 g toluene and mixed well. In a weighing pan, 0.5 g of Sylgard 184 part B was diluted with 0.25 g toluene and mixed well. 0.3 g of the diluted part-B was added to the diluted part-A to prepare a mixture of Sylgard 184 A+B (A:B=10:1 by weight) and mixed well. 0.73 g of Sample No. 316/318 was mixed with the diluted Sylgard 184 A+B and the mixture was gently mixed with a wooden stick to obtain a homogenous dispersion. The mixture was degassed under a vacuum for 5 min. Pre-cleaned glass slides were used as substrates for spin coating that was carried out in air. First, approximately 0.5 ml of the mixture was applied onto the substrate and spun at 500 rpm for 15 seconds and then (without stopping) spun at 3000 rpm for 60 seconds to obtain a wet film. The coated substrate was baked on a pre-heated hotplate for 30 seconds to dry off any volatile materials. The coated substrate was placed in a pre-heated oven and the film was cured at 125° C. for 30 min. The thickness of the resulting film was about 35 μm. The film had a blue-to-red conversion efficiency of 41.7%.

Example 9

A stock solution of a photo-initiator Igracure® 819 was prepared by dissolving 80 mg of Irgacure® 819 with 1 ml of 2,2,3,3-tetrafluoro-1-propanol (TFPO).

1.06 g of PFS Sample No. F2531-120-2 (see Example 1) was mixed with 1.63 g binder material ethoxylated trimethylolpropane triacrylate (Tradename, SR454 obtained from Sartomer Americas) to obtain a dispersion with 40 wt % PFS loading. The dispersion was then mixed with 0.20 ml of the Irgacure® 819 stock solution in TFPO to obtain a 40 wt % PFS dispersion, referred to as SR454-PFS-Dispersion-1.

1.176 g of PFS Sample No. 395 (see Example 1) was mixed with 1.77 g binder material ethoxylated trimethylolpropane triacrylate (SR454) to obtain a dispersion with 40 wt % PFS loading. The dispersion was then mixed with 0.22 ml of the Irgacure 819 stock solution in TFPO to obtain a 40 wt % PFS dispersion, referred to as SR454-PFS-Dispersion-2.

The two dispersions were first stirred for 2 hours at room temperature, followed by vigorous mixing on a vortex mixer for 1-2 minutes to reduce the particle agglomerates, and rolled at a speed of 60-70 rpm on a bottle roller for 2 hours. The homogeneous dispersions were stirred for another two hours at 50° C., and then cooled to room temperature.

Pre-cleaned glass slides were used as substrates for spin coating that was carried out in air. After spin-coating, the substrates with PFS coating were baked on a hotplate pre-heated to 110° C. for 10 mins before UV-curing under a UV intensity of 39 mW/cm² in air. The final films were about 50 μm thick and consisted of ~40% PFS in the crosslinked acrylate matrix. The spin-coated films of both samples had good blue-to-red conversion efficiency of 44% and were stable under UV radiation.

Example 10

Five commercially available photoresist inks were tested as binder materials. 0.30 g of $K_2SiF_6$:$Mn^{4+}$ (PFS) C011817VGAT(241) having a particle size from about 3-5 μm as measured by SEM, was mixed with 2.7 g of each photoresist material to create a coatable liquid formulation having 10 wt % loading of PFS. PFS Sample No. C011817VGAT(241) was prepared by the process described in US Publication No. 2018/0163126. The powder was washed in a nearly saturated solution of $K_2SiF_6$ in 49% HF and annealed at 540° C. for 8 hours under a 20% fluorine: 80% nitrogen atmosphere. Each mixture was mixed manually with a Q-tip. Spin-coating was used to generate the coating. Coating thickness was adjusted by varying the spin speed. Four-inch glass and Silicon wafers, pre-cleaned with isopropanol, were used as the base substrate.

PFS:photoresist films were prepared by spin-coating a single layer of the corresponding liquid formulations directly on pre-cleaned glass and Silicon wafer substrates. However, none of the mixtures provided desirable uniform coatings.

Bilayer Structures were constructed. A layer of a photoresist material (A) free of phosphor was coated onto a substrate, which may be glass or a Silicon wafer. A layer of a photoresist material (B) was mixed with 10 wt % PFS and coated onto the substrate over the photoresist A coating. Coverage and uniformity of the films is shown in Table 3.

TABLE 3

| Photoresist layer A | Photoresist layer B | Full coverage | Uniformity |
| --- | --- | --- | --- |
| AZ1512:PFS | No | No | Poor |
| AZ1512 | AZ1512:PFS | No | Poor |
| Mega-3.0:PFS | No | No | Poor |

TABLE 3-continued

| Photoresist layer A | Photoresist layer B | Full coverage | Uniformity |
|---|---|---|---|
| Mega-3.0 | Mega-3.0:PFS | No | Poor |
| Mega-2.0:PFS | No | No | Poor |
| Mega-2.0 | Mega-2.0:PFS | No | Poor |
| AZ12XT | No | No | Poor |
| AZ12XT | AZ1512:PFS | Yes | Good |
| AZ12XT | Mega-3.0:PFS | Yes | Good |
| AZ12XT | Mega-2.0:PFS | Yes | Good |

Example 11

55.4 g of a primary solvent, terpineol, was mixed with 27.7 g of a co-solvent, 2-(2-Butoxyethoxy)ethyl acetate (BEA), to prepare a mixture of solvents, referred to as T/BEA (see Example 1). The mixture was stirred at room temperature for 30 min. 0.3088 g of binder material ethyl cellulose (EC-H) (see Example 1) was mixed with 9.98 g of the T/BEA solvent mixture to prepare a 3 wt % solution of ethyl cellulose (EC-H), referred to as T/BEA_EC-H(3%). The solution was stirred overnight at 80° C. to dissolve the EC-H completely and then cooled to room temperature. 0.3355 g of PFS Sample No. F2531-120-2 (see Example 1) was mixed with 3.1 g of the T/BEA EC-H(3%) varnish to form a 10 wt % PFS dispersion, referred to as T/BEA_EC-H(3%)-PFS(10%).

33 g of a primary solvent, terpineol, was mixed with 16.5 g of a co-solvent, Diethylene glycol methyl ether (DGME), to prepare a mixture of solvents, referred to as T/DGME. 0.303 g of binder material ethyl cellulose (EC-H) was mixed with 9.8 g of the T/DGME solvent mixture to prepare a 3 wt % solution of ethyl cellulose (EC-H), referred to as T/DGME_EC-H(3%). The solution was stirred overnight at 80° C. to dissolve the EC-H completely and then cooled to room temperature. 0.4632 g of PFS Sample No. F2531-120-2 was mixed with 4.2 g of the T/DGME_EC-H(3%) varnish to form a 10 wt % PFS dispersion, referred to as T/DGME_EC-H(3%)-PFS(10%).

Both dispersions were stirred for 2 hours at room temperature, followed by vigorous mixing on a vortex mixer for 1-2 minutes to reduce the particle agglomerates, and rolled at a speed of 60 rpm on a bottle roller for 2 hours. The homogeneous dispersions were stirred for another 2 hours at 80° C., and then cooled to room temperature for settling tests.

As shown in Table 4, varying co-solvent is one of the methods of adjusting ink rheological properties such as viscosity, which subsequently affects ink stability and sedimentation speed.

TABLE 4

| Dispersion | Co-solvent | Binder | Varnish Viscosity (cP, 25° C.) | Calculated Sedimentation speed (mm/hr) |
|---|---|---|---|---|
| T/DGME_EC-H(3%)-PFS(10%) | DGME | EC-H | 302.1 | 0.3 |
| T/BEA_EC-H(3%)-PFS(10%) | BEA | EC-H | 258 | 0.4 |

Example 12

The following PFS Sample No. F2531-120-2 containing dispersions were prepared in the same way as disclosed in Example 1: T/BEA_PVP(3%)-PFS(10%), T/BEA EC-HH(3%)-PFS(10%) and T/BEA_PEI(3%)-PFS(10%).

A 3 wt % of PVP solution, referred to as T/BEA_PVP (3%), was prepared by mixing 0.29 g of PVP with 9.4 g of the T/BEA solvent mixture. A 10 wt % PFS dispersion, referred to as T/BEA_PVP(3%)-PFS(10%), was prepared by mixing 0.5098 g of PFS Sample No. F2531-120-2 with 4.6 g of T/BEA_PVP(3%) varnish.

A 3 wt % of EC-HH solution, referred to as T/BEA_EC-HH(3%), was prepared by mixing 0.766 g of EC-HH with 24.78 g of the T/BEA solvent mixture. A 10 wt % PFS dispersion, referred to as T/BEA_EC-HH(3%)-PFS(10%), was prepared by mixing 0.4528 g of PFS Sample No. F2531-120-2 with 4.1 g of T/BEA_EC-HH(3%) varnish.

A 3 wt % of PEI solution, referred to as T/BEA_PEI(3%), was prepared by mixing 0.32 g of PEI in 10.6 g of T/BEA solvent mixture. A 10 wt % PFS dispersion, referred to as T/BEA_PEI(3%)-PFS(10%), was prepared by mixing 0.4649 g of PFS Sample No. F2531-120-2 with 4.2 g of T/BEA_PEI(3%) varnish.

All dispersions were first stirred for 2 hours at room temperature, followed by vigorous mixing on a vortex mixer for 1-2 minutes to reduce the particle agglomerates, and then rolled at a speed of 60 rpm on a bottle roller for 2 hours. The homogeneous dispersions were stirred for another 2 hours at 80° C., and cooled down to room temperature for settling tests.

At 78 minutes, Sample T/BEA_PVP(3%)-PFS(10%) had about 10% settling, Sample T/BEA_EC-HH(3%)-PFS(10%) had no settling and Sample T/BEA_PEI(3%)-PFS(10%) had about 70% settling. At 120 minutes, Sample T/BEA_PVP (3%)-PFS(10%) had about 10% settling, Sample T/BEA EC-HH(3%)-PFS(10%) had no settling and Sample T/BEA_PEI(3%)-PFS(10%) had about 80% settling. At 16 hours, Sample T/BEA_PVP(3%)-PFS(10%) had about 50% settling, Sample T/BEA_EC-HH(3%)-PFS(10%) had about 15% settling and Sample T/BEA_PEI(3%)-PFS(10%) had settled.

As shown in Table 5, varying binder materials is another effective approach of adjusting ink rheological properties such as viscosity, which subsequently affects ink stability and sedimentation speed.

TABLE 5

| Dispersion | Co-solvent | Binder | Varnish Viscosity (cP, 25° C.) | Calculated Sedimentation speed (mm/hr) |
|---|---|---|---|---|
| T/BEA_PVP(3%)-PFS(10%) | BEA | PVP | 210.7 | 0.5 |
| T/BEA_EC-HH(3%)-PFS(10%) | BEA | EC-HH | 878.3 | 0.1 |
| T/BEA_PEI(3%)-PFS(10%) | BEA | PEI | 11.15 | 8.4 |

Example 13

A dried 20 ml vial equipped with a stir bar was charged with 2-butanol (8.26 g), water (0.203 g, 11.3 mmol), and isobutyric acid (0.2933 g, 2.8 mmol) at room temperature. After the mixture was stirred for approximately 15 min, tantalum ethoxide (0.844 g, 2.1 mmol) was added to the stirred solution dropwise. The homogeneous solution was allowed to stir at room temperature for 22 hours to provide a solution of 2 nm $Ta_2O_5$ nanoparticles. The $Ta_2O_5$ nanoparticles solution was mixed with 6.19 g of T/BEA varnish with 3 wt % EC-H binder material in a flask, and then the 2-butanol was stripped from the homogeneous solution using rotoevaporation. The remaining solution referred to as T/BEA_EC-H_Ta$_2$O$_5$ is optically clear and has a viscosity of 249.9 cP at 25° C. The solution has 6.9 wt % Ta$_2$O$_5$ and 3.0 wt % of binder (or in another word, the solid binder composite consists of 70% of Ta$_2$O$_5$ and 30% binder). The solution has an effective refractive index of 1.62 (Sample 13 in Table 6). Adjusting the content of metal oxide dispersed in the binder (Sample 1 in Table 6) or replacing Ta$_2$O$_5$ with other metal oxides such as ZrO$_2$ and TiO$_2$ having lower densities (Samples 2 in Table 6) can further optimize the effective refractive index of the binder material to achieve optimum performance.

TABLE 6

|  | Binder only | Sample 13 | Sample-1 | Sample-2 | Sample-2 |
|---|---|---|---|---|---|
| Metal oxide material |  | Ta$_2$O$_5$ | Ta$_2$O$_5$ | ZrO$_2$ | TiO$_2$ |
| Metal oxide refractive index |  | 2.15 | 2.15 | 2.13 | 2.48 |
| Metal oxide density (g/cm$^3$) |  | 8.20 | 8.20 | 5.68 | 4.23 |
| Metal oxide wt % |  | 70% | 40% | 60% | 60% |
| Binder material | Ethyl cellulose | Ethyl cellulose | Ethyl cellulose | Ethyl cellulose | Ethyl cellulose |
| Binder refractive index | 1.47 | 1.47 | 1.47 | 1.47 | 1.47 |
| Binder density (g/cm$^3$) | 1.03 | 1.03 | 1.03 | 1.03 | 1.03 |
| Binder wt % | 100% | 30% | 50% | 50% | 40% |
| Metal oxide (mol %) | 0.0% | 22.7% | 9.1% | 17.9% | 26.8% |
| Binder (mol %) | 100.0% | 77.3% | 90.9% | 82.1% | 73.2% |
| Effective refractive index | 1.47 | 1.62 | 1.53 | 1.59 | 1.74 |

Example 14

0.725 g of PFS Sample No. F2531-120-2 (see Example 1) was mixed with 2.9 g of T/BEA_EC-H_Ta$_2$O$_5$ (from Example 13) as sample 0305-Ta. The dispersion was first stirred for 2 hours at room temperature, followed by vigorous mixing on a vortex mixer for 1-2 minutes to reduce the particle agglomerates, and rolled at a speed of 60-70 rpm on a bottle roller for 2 hours. The homogeneous dispersion was stirred for another 2 hours at 80° C., and then cooled to room temperature for film coating.

Example 15

A dried 250 ml flask equipped with a stir bar was charged with isopropanol (IPA) (90 ml), water (1.16 g, 64.4 mmol), and isobutyric acid (IBA) (1.7 g, 16.2 mmol) at room temperature. After the mixture was stirred for 30 min, tantalum ethoxide (5.8 g, 14.4 mmol) was added to the stirred solution dropwise. The homogeneous solution was allowed to stir at room temperature for 21 hours to provide a solution of 2.2 nm Ta$_2$O$_5$ nanoparticles. The Ta$_2$O$_5$ nanoparticles solution was mixed with 3.15 g binder material ethoxylated trimethylolpropane triacrylate (Tradename SR454) in a flask. Isopropanol was stripped from the clear solution using rotary evaporation. The low boiling point solvents (IPA/H$_2$O/IBA) were further stripped off using nitrogen blowing. The final clear solution (11.6 g) contained 3.15 g of acrylate and 3.15-3.18 g of Ta$_2$O$_5$ nanoparticles. The weight percentage of solid content is 1 part of acrylate to 1 part of Ta$_2$O$_5$ in the final solution.

Example 16

Several waxes containing polymerizable functionality were combined with 4 g of propylene glycol methyl ether acetate (PGMEA) and heated with a heat gun to generate homogeneous solutions (see Table 7). These samples were allowed to cool undisturbed to determine which waxes induced gelation or viscosity increase in the solvent.

Sample F2664-5-8 crystallized on cooling to give a hard paste-like consistency, so it was diluted with an additional 4 g PGMEA and heated until homogeneous again. Upon cooling the second time a less crystalline stable opaque dispersion formed.

1 g of PFS Sample No. 395 (see Example 1) was added to Sample F2664-5-12 and 2 g of PFS Sample No. 395 was added to Sample F2664-5-8 to produce dispersions with 21 wt % solids and 2 wt % wax. These samples were heated to redissolve the waxes and then vortexed to mix thoroughly. Sample F2664-5-3 (20 wt % PFS in PGMEA with no wax) was also vortexed to re-mix and all three samples were allowed to stand undisturbed to observe settling behavior. After approximately 7 minutes, the solids in Sample F2664-5-3 settled approximately 50% while the solids in Sample F2664-5-12 settled approximately 15% and the solids in Sample F2664-5-8 settled approximately 10%. At 10.5 minutes, Sample F2664-5-12 settled another approximately 15% while Sample F2664-5-8 settled another approximately 10%.

TABLE 7

| Sample | Additive | mass (g) | mp ° C. | Soluble at RT | Soluble w/ heat | Gel/viscosity increase on cooling | name |
|---|---|---|---|---|---|---|---|
| F2664-5-6 | 2280-121 | 0.1003 | 76 | Y | N | N | dodecyl cinnamide |
| F2664-5-7 | 2280-123 | 0.1026 | 33 | N | Y | N | di(hexadecyl) maleate |
| F2664-5-8 | 2280-131 | 0.0996 | 65 | N | Y | Y, crystallizes | di(hexadecyl) fumarate |
| F2664-5-9 | 2280-133 | 0.1029 | 43 | N | Y | Y, crystallizes | oleyl cinnamide |
| F2664-5-10 | 2280-112 | 0.1016 | 45 | N | Y | N | di(vinyloxymethylcyclohexylmethyl) eicosanedioate |
| F2664-5-11 | 2280-85 | 0.0997 | 44 | Y | N | N | 4-vinyloxybutyl octadecanoate |
| F2664-5-12 | 2280-97 | 0.1008 | 58 | N | Y | Y, hazy viscous dispersion | di(4-vinyloxybutyl) octadecanedioate |

Example 17

0.1 g wax Sample 2280-129 (di(octadecyl) fumarate) was combined with 4 g of isobornyl acrylate (Sample No. F2664-5-15) and 0.09 g wax Sample 2280-116 (octadecyl cinnamide) was combined with 4 g of isobornyl acrylate (Sample No. F2664-5-16) and both samples were heated with a heat gun until homogeneous and allowed to cool undisturbed. F2664-5-15 gelled slowly on cooling while F2664-5-16 crystallized out. 1 g of PFS Sample No. 395 (see Example 1) was added to F2664-5-15 and the sample was heated to redissolve the wax and vortexed to mix thoroughly. On cooling, the mixture formed a thick flowable dispersion; however, the solids in F2664-5-15 settled at approximately the same rate as sample F2664-5-1 which contained no wax.

Example 18

0.1 g functionalized wax sample 2280-121 (dodecyl cinnamide) was dissolved in 2 g each of ethylene glycol phenyl ether methacrylate (1.85 mL, Sample No. F2664-5-17), polypropylene glycol dimethacrylate (1.98 mL, Sample No. F2664-5-18), and triethylene glycol dimethacrylate (1.83 mL, Sample No. F2664-5-19). Each sample was heated until homogeneous and allowed to cool undisturbed. Sample Nos. F2664-5-18 and F2664-5-19 remained homogeneous on cooling while Sample No. F2664-5-17 formed an opaque thick dispersion. 0.5 g of PFS Sample No. 395 (see Example 1) was added to Sample No. F2664-5-17. A separate sample (Sample No. F2664-5-20) of 0.5 g PFS Sample No. 395 and 2 g of ethylene glycol phenyl ether methacrylate was prepared. Sample No. F2664-5-17 was heated to dissolve the wax and Sample Nos. F2664-5-17 and F2664-5-20 were vortexed to mix thoroughly and allowed to cool undisturbed.

After 25 minutes, the solids in Sample No. F2664-5-20 with no wax had settled by approximately 15-20%, while the solids in Sample No. F2664-5-17 with 4 wt % wax had not begun to settle. Both samples were inverted at ~25 minutes, which resulted in the dispersion flowing for Sample No. F2664-5-20 while the sample containing the wax (Sample No. F2664-5-17) did not flow toward the cap of the vial and instead remained at the bottom of the vial. The samples were then returned to their original orientation (cap up) and left for an additional hour. At 105.5 min, settling is observed in Sample No. F2664-5-20, while no settling occurred in Sample No. F2664-5-17. As noted previously, upon inversion Sample No. F2664-5-20 flowed toward the cap while Sample No. F2664-5-17 did not flow toward the cap, but remained at the bottom of the vial (top of the inverted vial).

Example 19

Five solvent-based dispersants were received from Evonik and used as received (see Table 8).

TABLE 8

| Name solvent | Component | Solubility in water | Solubility in organic | Viscosity, mPas | Density (g/ml) |
|---|---|---|---|---|---|
| TEGO 655 | polyether phosphate | Y, pH = 1.5-2.5 | Ethanol | 5,000-10,000 | 1.1 |
| TEGO 685 | Polyester derivative | N | Butyl acetate | 30,000-175,000 | 1.098 |
| TEGO 687 | High molecular weight polymer in 2-methoxypropyl acetate/Butanol | N | Ethanol, Butylacetate | 40-300 | 1.03 |
| TEGO 689 | Polymer with pigment affinity groups (dodecanoic acid) | N | Butyl acetate | 27,000 | 1.047 |
| TEGO 690 | Polymer with pigment affinity groups (dodecanoic acid) | N | Ethanol, Butyl acetate | 30,000 | 1.048 |

PFS Sample No. 395 (see Example 1) was dispersed in isopropanol (IPA) to prepare the A-series samples (10 wt % PFS) with and without dispersants (Table 9).

TABLE 9

| Sample | PFS Sample No. 395 | IPA | Dispersant | Dispersant/PFS (wt %) |
|---|---|---|---|---|
| A-1 | 0.804 g | 7.24 g | TEGO 655 | 20% |
| A-2 | 0.514 g | 4.63 g | TEGO 685 | 20% |
| A-3 | 0.67 g | 6.03 g | TEGO 687 | 20% |
| A-4 | 0.61 g | 5.49 g | TEGO 689 | 20% |
| A-5 | 0.59 g | 5.31 g | TEGO 690 | 20% |
| A-6 | 0.78 g | 7.02 g | | 0 |

PFS Sample No. F2531-120-2 (see Example 1) With a $MgF_2$ coating was dispersed in IPA to prepare the B-series samples (10 wt % PFS) with and without dispersant (Table 10).

TABLE 10

| Sample | F2531-120-2 | IPA | Dispersant | Dispersant/PFS (wt %) |
|---|---|---|---|---|
| B-1 | 1.39 g | 12.51 g | TEGO 655 | 20% |
| B-2 | 1.45 g | 13.1 g | TEGO 685 | 20% |
| B-3 | 1.22 g | 11 g | TEGO 687 | 20% |
| B-4 | 1.22 g | 11 g | TEGO 689 | 20% |
| B-5 | 1.45 g | 13.1 g | TEGO 690 | 20% |
| B-6 | 1.27 g | 11.4 g | | 0 |

All the dispersions were first stirred for two hours at room temperature, followed by vigorous mixing on a vortex mixer for 1-2 minutes to reduce the particle agglomerates, and rolled at a speed of 60-70 rpm on a bottle roller for 2 hours. The homogeneous dispersion was stirred for another two hours at 80° C., and cooled to room temperature for settling tests.

PFS particles in sample A-3 containing TEGO 687 settled to the bottom immediately, indicating that the TEGO 687 dispersant works likely as a flocculant to interact with PFS particles either through hydrogen bonding or Van der Waal's forces to form larger particle flocs. After 9 minutes, most of the PFS particles in the control sample of A-6 settled down to the bottom. By contrast, sample A-5 containing TEGO 690 showed little settling. In terms of the stability, the order from high to low is: TEGO 690>TEGO 689>Control>TEGO 655>TEGO 685>TEGO 687. A similar trend was observed for PFS Sample No. F2531-120-2.

Example 20

0.5 g PFS Sample No. 395 (see Example 1) and 97.6 mg dispersant BYK®-7410-ET (a solution of a modified urea available from BYK Additives and Instruments) were combined in a 3 dram vial to which 2.535 mL (2 g) of absolute ethanol was added forming Sample No. F2664-5-22 with 3.8% dispersant loading. 0.5 g PFS Sample No. 395 and 44.0 mg dispersant BYK®-7410-ET were combined in a 3 dram vial to which 2.535 ml (2 g) of absolute ethanol was added forming Sample No. F2664-5-23 with 1.7% dispersant loading. The vials were vortexed and allowed to stand undisturbed to observe settling behavior. Both samples containing BYK®-7410-ET at 3.8% and 1.7% loadings gelled and therefore, showed no particle settling in 5 minutes, while the solvent only sample, Sample No. F2664-5-24, settled approximately 70%. Samples F2664-5-22 and F2664-5-23 were then inverted for 5 minutes. The gel in F2664-5-22 did not move, while the top ~10% of the gel in F2664-5-23 flowed toward the vial cap.

Example 21

Shown in Table 11 is an example of using a $MgF_2$ coating to increase Zeta potential of PFS. All samples derived from the same batch of PFS (PFS Sample No. 40C180101-01ATS, D10/D50/D90=16.7/26.1/39.3 μm) but with different amounts and thicknesses of a $MgF_2$ coating.

PFS Sample No. 40C180101-01ATS was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. The powder had a D50 particle size of 26.1 μm, as measured by SEM. The powder has Mn % content of about 1.58%.

PFS Sample No. 40C180101-01ATS was surface coated with $MgF_2$ in varying amounts as shown in Table 11. A representative procedure for coating the phosphor was: 100 mL of a 0.22 g/mL solution of $MgSiF_6 \cdot 6H_2O$ in 17.5% aq. $H_2SiF_6$ was added over 30 minutes into a reaction mixture containing a magnetic stir bar and 50 g of $K_2SiF_6:Mn^{4+}$ in 400 mL of 49% aq HF saturated with $K_2SiF_6$. The mixture was stirred vigorously for 30 sec (300 rpm) after which the stirring was turned down to 120 rpm. After the addition was complete, the stirring was stopped, the stir bar was removed and the reaction mixture was allowed to settle for 5 minutes. The supernatant was decanted and discarded. The slurry was transferred to a plastic Buchner funnel fitted with a 0.65 μm fluoropolymer membrane. The residual HF solution was filtered off and the phosphor cake was washed with acetone 5 times, using a total of 600 mL acetone, churning the solid before each wash. The product was dried under vacuum for 3 days and then sifted through a 170 mesh membrane to afford the final coated product, 40C180101-01ATS-F1934-75-Mg10 described in Table 12 were prepared using the appropriate amount of $MgSiF_6 \cdot 6H_2O$ in 17.5% aq. $H_2SiF_6$ to achieve the desired $MgF_2$ content.

The Zeta potentials were measured in ethanol using folded capillary cells. PFS having higher $MgF_2$ coating weight tended to have increased zeta potential. The addition of a $MgF_2$ surface coating is also evidenced by the decreased QE degradation after testing at 85° C. and 85% RH for 200 hrs and increased particle stability.

TABLE 11

| PFS Powders | MgF2 charging % | ZP (mV) | QE | QE degradation after 85° C./ 85% RH-200 hrs |
|---|---|---|---|---|
| 40C180101-01ATS-Control | 0% | 2.8 | 104.1% | 10.2% |
| 40C180101-01ATS-F1934-88-Mg1 | 1% | 11.0 | 106.2% | 11.9% |
| 40C180101-01ATS-F1934-87-Mg2 | 2% | 19.3 | 106.1% | 7.3% |
| 40C180101-01ATS-F1934-76-Mg2.5 | 2.50% | 40.0 | 105.2% | 5.2% |
| 40C180101-01ATS-F1934-75-Mg5 | 5% | 28.4 | 104.7% | 4.5% |
| 40C180101-01ATS-F1934-75-Mg10 | 10% | 54.3 | 104.5% | 4.3% |

Example 22

Stability of PFS Sample No. 395 (see Example 1) without a $MgF_2$ coating having a Zeta potential ~4.1 mV when measured in isopropanol compared with the stability of PFS Sample No. F2531-120-2 (see Example 1) with a $MgF_2$ coating and a Zeta potential of 57.2 mV when measured in isopropanol. The two powders were dispersed and mixed well in each of solvents 2-butanol, isopropanol and ethanol and left still for settling tests. Regardless of the solvents, the suspensions of PFS Sample No. 395 without a $MgF_2$ coating settled quickly to the bottom; whereas, the suspensions of PFS Sample No. F2531-120-2 with a $MgF_2$ coating, had less than 10% settling over the same time period.

Example 23

Haze in films containing PFS ($K_2SiF_6:Mn^{4+}$) was evaluated. Two silicone-based binder materials were used: a two-part silicone encapsulant (product name: Sylgard™ 184A/B) with a refractive index (RI) of 1.41 obtained from Dow Chemical; and a two-part LED silicone encapsulant (product name: SCR-1011A/B) with a RI of 1.54 from Shin-Etsu Chemical Corporation.

All PFS samples listed in Table 12 were prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. Mn contents were determined by XRF.

For Comparative-1: 0.78 g of PFS (sample ID 040-1700501) was added into a pre-mixed Sylgard™ 184A (2.10 g) and Sylgard™ 184B (0.21 g) blend. The mixture was mixed well using a narrow wood stick to obtain a homogeneous blend, which was then degassed using house vacuum for 30 mins to remove air bubbles. 0.70 g of the mixture was manually poured on a template to create a circular tape with diameter of 2.87 cm and then cured at 90° C. for 30 min. The thickness of 793 μm was measured using a digital caliper.

All other films were prepared by doctor blade with a gap height of 127 μm. For samples with 25 wt % PFS loading (comparative-1 through 4 and inventive-1 and 2), 0.25 g of PFS was added into pre-mixed blend of 0.70 g Sylgard™ 184A and 0.07 g Sylgard™ 184B. For samples with 50 wt % PFS loading, 0.77 g of PFS was added into either a pre-mixed blend of 0.70 g Sylgard™ 184A and 0.07 g Sylgard™ 184B blend (Comparative-5 through 7, inventive-3 and 4) or a pre-mixed blend of 0.38 g SCR-1O$_{11}$A and 0.38 g SCR-10111B (comparative-8 through 10 and Inventive-5 and 6). Each mixture was mixed well using a narrow wood stick to obtain a homogeneous blend, which was then degassed using house vacuum for 30 min to remove air bubbles. Approximately 1.0 ml of each mixture was applied to a 2"×3" pre-cleaned glass slide and processed by the doctor blade using a 127 μm gap to generate a 127 μm thick wet film, which was cured at 90° C. for 30 minutes to obtain a dry film having a thickness of 127 μm.

Haze measurements were performed using a home-made Hazemeter. The Hazemeter consisted of an eight-inch integration sphere and a collimated LED light source. The film sample was placed at the entrance port of the integration sphere. Each measurement measures two transmission values at 450 nm with the exit port either covered with a cap [total transmission denoted as T % (total)] or without the cover cap [diffuse transmission denoted as T % (diffuse)]. The haze value is the ratio of T % (diffuse) divided by T % (total).

As shown in Table 12, haze of PFS containing films may be optimized by varying Mn %, particle size and scattering strength by controlling the refractive index of the matrix.

TABLE 13

| PFS name | Mn % incorporation | Bleed through of blue light | Ratio of peak intensity (I631 nm/ I440 nm) |
|---|---|---|---|
| PFS-1 | 0.7% | 44% | 2.8 |
| F2531-122-25 | 1.4% | 21% | 8.9 |
| F2664-26-3 | 2.1% | 15% | 13.3 |
| GRC022520BTGA(470) | 3.1% | 7% | 32.6 |

Example 24

0.2692 of a binder material, Poly(vinyl phenyl sulfide) (PVPS) having a refractive index of 1.657 (purchased from Aldrich (product number 640212) was used as received) was mixed with 8.7 g of T/BEA (see Example 1), referred to as T/BEA_PVPS(3%), and stirred overnight at 80° C. to obtain a clear solution. 1.44 g of PFS Sample No. F2664-43-1 (see Example 4) was mixed with 2.16 g of T/BEA_PVPS varnish to obtain a suspension having a PFS concentration of 40 wt %, referred to as T/BEA_PVPS-PFS (40%). The suspension was first stirred for 2 hours at room temperature, followed by vigorous mixing on a vortex mixer for about two minutes to reduce the particle agglomerates and rolled at a speed of 60-70 rpm on a bottle roller for 2 hours. The homogeneous suspension was stirred for another 2 hours at 80° C. and cooled to room temperature for film coating.

The T/BEA_PVPS-PFS(40%) suspension was then used to spin-coat PFS:PVPS films. Pre-cleaned glass slides were

TABLE 12

| ID | PFS materials | Mn4+ content in phosphor (%) | PFS size (D50) (μm) | Binder (RI) | PFS (wt %) in film | Film thickness (μm) | Total transmission (%) | Haze (%) |
|---|---|---|---|---|---|---|---|---|
| Comparative-1 | 040-1700501 | 1.43 | 28 | 1.41 | 25 | 793 | 29.2 | 83.9 |
| Comparative-2 | 040-1700501 | 1.43 | 28 | 1.41 | 25 | 127 | 98.2 | 22.4 |
| Comparative-3 | C042216D-TGAT(188) | 2.74 | 28 | 1.41 | 25 | 127 | 91.2 | 27.7 |
| Comparative-4 | C060716A2TGAT(200) | 3.47 | 28 | 1.41 | 25 | 127 | 88.6 | 28.1 |
| Comparative-5 | 040-1700501 | 1.43 | 28 | 1.41 | 50 | 127 | 89.8 | 45.7 |
| Comparative-6 | C042216D-TGAT(188) | 2.74 | 28 | 1.41 | 50 | 127 | 77.4 | 59.3 |
| Comparative-7 | C060716A2TGAT(200) | 3.47 | 28 | 1.41 | 50 | 127 | 75.1 | 53.5 |
| Inventive-1 | GRC011017-AVGAT(239) | 2.66 | 6.8 | 1.41 | 25 | 127 | 86.4 | 77.7 |
| Inventive-2 | GRC011017BVGAT (238) | 3.54 | 3.0 | 1.41 | 25 | 127 | 68.7 | 81.3 |
| Inventive-3 | GRC011017-AVGAT(239) | 2.66 | 6.8 | 1.41 | 50 | 127 | 72.5 | 83.8 |
| Inventive-4 | GRC011017BVGAT (238) | 3.54 | 3.0 | 1.41 | 50 | 127 | 42.3 | 85.2 |
| Comparative-8 | 040-1700501 | 1.43 | 28 | 1.54 | 50 | 127 | 51.3 | 80.7 |
| Comparative-9 | C042216D-TGAT(188) | 2.74 | 28 | 1.54 | 50 | 127 | 48.1 | 78.1 |
| Comparative-10 | C060716A2TGAT(200) | 3.47 | 28 | 1.54 | 50 | 127 | 41.4 | 78.2 |
| Inventive-5 | GRC011017-AVGAT(239) | 2.66 | 6.8 | 1.54 | 50 | 127 | 26.1 | 86.6 |
| Inventive-6 | GRC011017BVGAT (238) | 3.54 | 3 | 1.54 | 50 | 127 | 15.2 | 88.5 |

The amount of activator Mn incorporation in phosphors (referred to as Mn %) has a significant effect on color conversion. Shown in Table 13 are color conversion features of films of PFS (25 wt %) dispersed in silicone illuminated by a blue LED. Increasing the degree of Mn % incorporation in PFS reduces the bleed-through of blue light and increases the intensity of red emission.

used as substrates for spin coating that was carried out in air. Approximately 0.5 ml of the suspension was added onto the substrate and spun for 60 seconds to obtain a wet film. Film thickness may be adjusted by using different spin-speed. The coated substrate was baked on a pre-heated hotplate at 150° C. for 10 minutes before testing. The final dry films consist of 93 wt % of PFS dispersed in 7 wt % of PVPS and have a 13 µm thickness. The films have 41% blue absorption and 17% blue-to-red conversion efficiency.

Example 25

25 mg of CsSe/ZnS core-shell type green emission quantum dot material (QD) (purchased from Aldrich with a product number of 748056) was added into 1.0 g of T/BEA_PVPS-PFS (40%) (from Example 24) and mixed well to prepare a new suspension having 38.8% PFS and 3.0% QD, referred to as T/BEA_PVPS-PFS(39.0%)-QD (2.4%). The suspension was used to spin-coat PFS:PVPS: QD films. Pre-cleaned glass slides were used as substrates for spin coating in air. Approximately 0.5 ml of the suspension was added onto the substrate and spun for 60 seconds to obtain a wet film. Film thickness may be adjusted by using different spin-speed. The coated substrate was baked on a pre-heated hotplate at 150° C. for 10 minutes before testing. The final dry films had a thickness–45 µm and consisted of 90.3 wt % PFS, 5.6% QD and 4.1% PVPS. The films have a blue absorption of 89%.

Example 26

Tapes were prepared by mixing 0.33 g PFS ($K_2SiF_6$: $Mn^{4+}$) (see Table 14) with 1.5 g Sylgard™ 184 to provide 18% weight loading of PFS and the formulations were coated on pre-cleaned 3"×2" glass plates using a doctor blade (see Table 14). For PFS Sample No. 320, see Example 6.

PFS Sample No. F2539-33 was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. The powder was coated with $MgF_2$, as follows: 75.0 mL of a 0.22 g/mL solution of $MgSiF_6 \cdot 6H_2O$ in 17.5% aq. $H_2SiF_6$ was added over 30 minutes into a reaction mixture containing a magnetic stir bar and 125 g of $K_2SiF_6$:$Mn^{4+}$ in 1.425 L of 49% aq HF saturated with $K_2SiF_6$. The mixture was stirred vigorously for 30 sec (300 rpm) after which the stirring was turned down to 120 rpm. After the addition was complete, the stirring was stopped, the stir bar was removed and the reaction mixture was allowed to settle for 10 minutes. The supernatant was decanted and discarded. The wet slurry was mixed with 400 mL of 49% aq HF saturated with $K_2SiF_6$. The wash mixture was allowed to settle for 10 minutes and then the supernatant was decanted and discarded. The slurry was transferred to a plastic Buchner funnel fitted with a 0.65 µm fluoropolymer membrane. The residual HF solution was filtered off and the phosphor cake was washed with acetone 5 times, using a total of 800 mL acetone, churning the solid before each wash. The product was dried under vacuum for 3 days and then sifted through a 170 mesh membrane to afford the final coated product, PFS Sample No. F2539-33 with Mn %=2.35, an unsonicated D50 particle size of 18.8 µm and a 2.5% $MgF_2$ coating.

PFS Sample No. F2531-73B was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh and washed in a second wash treatment step in a nearly saturated solution of $K_2SiF_6$ in 49% HF for 30 minutes. PFS sample has a D50 particle size of 16.0 µm (unsonicated). The PFS sample was coated in PGMEA with 2.5 wt % of Hypermer™ KD4 as described in Example 36.

TABLE 14

| Sample ID | PFS sample no. | PFS weight | Sylgard weight | Loading | Thickness (mil) |
|---|---|---|---|---|---|
| 1-A | 320 | 0.33 | 1.5 | 0.18 | 3 |
| 2-A | F2539-33 | 0.33 | 1.5 | 0.18 | 3 |
| 5-C | F2531-73B | 0.33 | 1.5 | 0.18 | 2 |

The uniformity of the films was analyzed by a Radiant Vision Systems imaging colorimeter with TrueTest™ software. Luminant (Lv) uniformity measurements are based on 100% uniformity. Higher measurements indicate a more uniform film. Films with very low global contrast and color difference are preferred. Results are shown in Table 15.

TABLE 15

|  | Sample 5-C (coated with KD4) | Sample 1-A (Roasted) | Sample 2-A ($MgF_2$) |
|---|---|---|---|
| Lv Uniformity (%) | 88.1% (R); 91.5% (G); 90.9% (B) | 94.3% (R); 94.1% (G); 96.1% (B) | 94.8% (R), 96% (G), 97% (B) |
| CenterMax Lv Uniformity (%) | 95.3% (R); 95.5% (G); 96.2% (B) | 97.7% (R); 96.9% (G); 98.8% (B) | 97.5% (R), 98.6% (G), 99% (B) |
| LocalLv Uniformity (%) | 90.6% (R); 95.2% (G); 93.7% (B) | 96.2% (R); 97.5% (G); 97.8% (B) | 97.3% (r), 97.8% (G), 97% (B) |
| Global Contrast | −7.6% (R); 4.8% (G); −5.5% (B) | −3.5% (R); 3.2% (G); −2.7% (B) | −2.78% (R), −2.65% (G), −2.05% (B) |
| Color Difference | 0.0183 (R); 0.0055 (G); 0.0066 (B) | 0.0115 (R); 0.0032; (G) 0.0061 (B) | 0.024 (R), 0.0038 (G), 0.0091 (B) |

Example 27

Effects of milling media, exemplar solvents, wetting agents, additives, $MgF_2$ coating and milling time on the particle size and quantum efficiency (QE) are presented in Table 16. Hansen parameters for each solvent are also included in Table 16.

The following is an exemplar wet-milling process. A dried 25 ml NALGENE bottle was charged with 36 g of spherical milling beads (Fisher, diameter: 1.44 mm), 10 ml of liquid medium, and optionally, 1.5 ml of a wetting agent, such as 20% TEGO® 689 in butyl acetate or other additives, such as dipotassium hydrogen phosphate ($K_2HP$), at room temperature. Then 2.5 g of PFS Sample No. GRC030620BTGA474 ($K_2SiF_6$:Mn**) was added to the bottle and the bottle was sealed and placed on a roller mill for 10-40 hours at 78 rpm or 2-4 hours at 1000 rpm. The milled PFS powder was obtained by a centrifugation step or a filtration step following a drying step under vacuum for 24 hours.

PFS Sample No. GRC030620BTGA474 ($K_2SiF_6$:$Mn^{4+}$) having a Mn % of 3.48% was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. The PFS powder has a Mn % of 3.48%.

However, the performance of PFS particles upon milling is sensitive to the solvent medium used to facilitate the milling and grinding, especially for PFS with high Mn % incorporation (Table 16). Commonly used solvents such as methanol, ethanol and acetone, significantly degrade the performance of PFS. Milling of PFS particles, especially with high Mn % incorporation, may be conducted using solvents, such as Oleic acid, dibutyl phosphate, hexane, heptane, hexadecane etc. as shown in Table 16.

GRC101819ATGA(450) was dispersed in the above solution and stirred for 20 minutes. After 20 hours of stirring at 40° C., the suspension was loaded into a 25 ml hydrothermal reactor and heated at 140° C. for 6 hours. The suspension was cooled to room temperature, diluted with 10 ml of isopropanol (IPA) and centrifuged at 6000 rpm for 10 min. The crude product was washed with IPA and centrifuged two more times. After drying under vacuum for 24 hours, 0.682 g of OA-coated PFS powder was prepared.

TABLE 16

| Sample ID | Solvent medium | Solvent Hansen parameters | | | Additive | PFS coating | Milling time (hr) | D10 | D50 | D90 | B = (D90 − D10)/D50 | QE |
|---|---|---|---|---|---|---|---|---|---|---|---|---|
| | | Dispersion | Polar | Hydrogen-bonding | | | | | | | | |
| GRC030620BTGA(474) | No | | | | No | No | n/a | 5.6 | 8.3 | 11.9 | 0.77 | 98% |
| 061120 | 2,2,3,3-Tetrafluoro-1-propanol | | | | TEGO689 | No | 40 | 3.2 | 5.5 | 9 | 1.05 | 59% |
| 061320 | Toluene | 18 | 1.4 | 2 | TEGO689 | No | 40 | 18.6 | 33.2 | 50.1 | 0.22 | 17% |
| 061020-B | Isopropanol | 15.8 | 6.1 | 16.4 | TEGO689 | No | 40 | 0.82 | 1.5 | 1.9 | 0.22 | 41% |
| 061620 | Isopropanol | 15.8 | 6.1 | 16.4 | TEGO689 | MgF2 | 40 | 4 | 4.5 | 5 | 0.22 | 55% |
| 060620-A | Isopropanol | 15.8 | 6.1 | 16.4 | TEGO689 | OA coating | 40 | 4.4 | 5 | 5.8 | 0.27 | 54% |
| 070820-A | Butyl acetate | 17.4 | 15.8 | 3.7 | TEGO689 | No | 40 | 1 | 1.1 | 1.3 | 0.29 | 43% |
| 070820-B | Oleic acid | 16.0 | 2.8 | 6.2 | TEGO689 | No | 40 | 3.7 | 4.2 | 4.9 | 0.3 | 77% |
| 071520-B | Oleic acid | 16.0 | 2.8 | 6.2 | No | No | 40 | 4 | 4.6 | 5.1 | 0.24 | 95% |
| 072720-A | Oleic acid | 16.0 | 2.8 | 6.2 | No | No | 2 | 3.5 | 4.1 | 4.7 | 0.24 | 93% |
| 072720-B | Oleic acid | 16.0 | 2.8 | 6.2 | No | No | 4 | 3.9 | 4.3 | 4.9 | 0.24 | 90% |
| 072620-B | Hexane | 14.9 | 0.0 | 0.0 | No | No | 2 | 1.0 | 1.9 | 3.8 | 0.24 | 93% |
| 071520-A | Dibutyl phosphate | | | | No | No | 40 | 4.6 | 5.1 | 5.8 | 0.24 | 92% |
| 072620-A | Acetone | 15.5 | 7.2 | 7.6 | No | No | 2 | 4 | 4.7 | 5.4 | 0.29 | 40% |
| 072020-B | Anhydrous methanol | 14.7 | 12.3 | 22.3 | K2HP | No | 10 | 2.2 | 3.8 | 5.5 | 0.87 | 35% |
| 072020-A | Anhydrous methanol | 14.7 | 12.3 | 22.3 | K2HP | No | 40 | 4 | 5.7 | 7.8 | 0.67 | 29% |

Example 28

PFS powders, especially with small particle sizes, tend to agglomerate. For instance, particle sizes (D10/D50/D90) of GRC101819ATGA(450) measured by Horiba Particle Size Analyzer with no sonication, 3-min sonication and 7-min sonication are (10.3/32.1/87.5 μm), (7.3/11.0/16.9 μm) and (7.3/8.5/9.9 μm), respectively. The significant reduction in particle sizes upon sonication indicates substantial agglomeration in GRC101819ATGA(450).

Oleic acid (OA) was used to coat PFS particles via a solvothermal synthesis or a simple mixing adsorption treatment. 2.5 ml (7.1 mmol) oleic acid (Sigma-Aldrich/364525) was dissolved in 7.5 ml of anhydrous absolute ethanol (Sigma-Aldrich/459836). 0.8405 g of PFS Sample No.

Two other PFS samples, Sample No. GRC101819ATGA(474) and Sample No. GRC101819ATGA(395) were treated in a similar manner and the results are shown in Table 17. After the treatment, the difference between particle sizes and the span (B) measured without sonication and with 7-minute sonication became smaller with respect to each control material. The samples maintained a good % QE (Quantam efficiency).

PFS Sample Nos. GRC101819ATGA(450), GRC101819ATGA(474) and GRC101819ATGA(395) were prepared by the process described in US Publication No. 2018/0163126. The powders were washed in a nearly saturated solution of $K_2SiF_6$ in 49% HF and annealed at 540° C. for 8 hours under a 20% fluorine:80% nitrogen atmosphere. The annealed powders were sifted through 280 mesh.

TABLE 17

| Materials | Discription | Particle size measurement conditions | D10 | D50 | D90 | B = (d90 − d10)/d50 | QE |
|---|---|---|---|---|---|---|---|
| GRC101819ATGA(450) | Control | No sonication | 10.3 | 32.1 | 87.5 | 2.4 | 104.6% |
| | | 3 min sonication | 7.3 | 11.0 | 16.9 | 0.9 | |
| | | 7 min sonication | 7.3 | 8.5 | 9.9 | 0.3 | |
| | OA solvothermal treated | No sonication | 8.4 | 14.9 | 24.6 | 1.1 | 103.3% |
| | | 3 min sonication | 7.9 | 9.5 | 11.2 | 0.4 | |
| | | 7 min sonication | 7.0 | 7.9 | 9.1 | 0.3 | |
| GRC101819ATGA(474) | Control | No sonication | 12.0 | 34.7 | 72.1 | 1.7 | 98.0% |
| | | 3 min sonication | 7.6 | 11.8 | 17.2 | 0.8 | |
| | | 7 min sonication | 7.7 | 9.2 | 11.0 | 0.4 | |

TABLE 17-continued

| Materials | Discription | Particle size measurement conditions | D10 | D50 | D90 | B = (d90 − d10)/ d50 | QE |
|---|---|---|---|---|---|---|---|
| | OA solvothermal treated | No sonication | 6.9 | 8.1 | 9.4 | 0.3 | |
| | | 3 min sonication | 6.8 | 7.5 | 9.6 | 0.4 | |
| | | 7 min sonication | 6.3 | 7.2 | 8.0 | 0.3 | |
| GRC101819ATGA(395) | Control | No sonication | 11.6 | 38.7 | 68.3 | 1.5 | 107.0% |
| | | 3 min sonication | 7.3 | 10.8 | 15.1 | 0.7 | |
| | | 7 min sonication | 7.8 | 9.1 | 10.6 | 0.3 | |
| | OA solvothermal treated | No sonication | 7.0 | 8.1 | 9.3 | 0.3 | 104.0% |
| | | 3 min sonication | 7.0 | 8.0 | 9.0 | 0.3 | |
| | | 7 min sonication | 6.9 | 7.7 | 8.7 | 0.2 | |

Example 29

A mixture solvent, referred to as Toluene/BEA, was prepared by mixing 27.1847 g of toluene and 27.4994 g of 2-(2-Butoxyethoxy)ethyl acetate (BEA). The mixture solvent was stirred for 15-30 minutes at room temperature. A 4.2% EC-HH solution, referred to as Toluene/BEA_EC-HH (4.2%) was prepared by mixing 0.4886 g of binder material EC-HH (see Example 1) in 11.0682 g of the Toluene/BEA solvent mixture. The varnish was stirred overnight at 80° C. to dissolve the binder completely, and then cooled to room temperature. The varnish had a viscosity of ~800 cP@25° C. 1.4688 g of PFS Sample No. F2664-68-1 was mixed with 2.1545 g of the Tol/BEA_EC-HH(4.2%) varnish to obtain an ink formulation referred to as Toluene/BEA_EC-HH(4.2%)/PFS(40%)-061420-B.

PFS Sample No. F2664-68-1 was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. The powder was coated with $MgF_2$, as follows: 11.75 mL of a 0.22 g/mL solution of $MgSiF_6 \cdot 6H_2O$ in 17.5% aq. $H_2SiF_6$ was added over 30 minutes into a reaction mixture containing a magnetic stir bar and 77 g of $K_2SiF_6:Mn^{4+}$ in 760 mL of 49% aq HF saturated with $K_2SiF_6$. The mixture was stirred vigorously for 30 sec (300 rpm) after which the stirring was turned down to 120 rpm. After the addition was complete, the stirring was stopped, the stir bar was removed and the reaction mixture was allowed to settle for 7 minutes. The supernatant was decanted and discarded. The wet slurry was mixed with 380 mL of 49% aq HF saturated with $K_2SiF_6$. The wash mixture was allowed to settle for 7 minutes and then the supernatant was decanted and discarded. The slurry was transferred to a plastic Buchner funnel fitted with a 0.65 μm fluoropolymer membrane. The residual HF solution was filtered off and the phosphor cake was washed with acetone 5 times, using a total of 800 mL acetone, churning the solid before each wash. The product was dried under vacuum for 3 days and then sifted through a 170 mesh membrane to afford the final coated product, PFS Sample No. F2664-68-1 Mn % of 3.08%, relative QE of 101% and D50 particle size of 9.1 μm.

The Toluene/BEA_EC-HH(4.2%)/PFS(40%)-061420-B suspension was stirred for 2 hours at room temperature, vigorously mixed on a vortex mixer for 1-2 minutes and sonicated for 10 minutes to reduce the particle agglomerates, and then rolled at a speed of 60 rpm on a bottle roller for 2 hours. The homogeneous suspension was stirred for another 2 hours at 80° C. and cooled to room temperature.

The formulation was used to spin-coat PFS:EC films. Pre-cleaned glass slides were used as substrates for spin coating that was carried out in air. Approximately 0.7 ml of dispersion was applied onto the substrate and spun for 60 seconds to obtain a wet film, which was dried for 10 minutes on a pre-heated hotplate at 150° C. to obtain a final dry film. Spin-coating conditions and properties of final dry films are summarized in Table 18.

TABLE 18

| Spin-speed (krpm) | Film thickness (um) | Blue absorption | Conversion Efficiency |
|---|---|---|---|
| 0.7 | 48 | 72.2% | 51.5% |
| 0.8 | 45 | 66.8% | 52.1% |
| 0.9 | 42 | 62.3% | 53.5% |

1.8965 g of PFS Sample No. GRC030620BTGA474 (see Example 27) was mixed with 2.8527 g of the Tol/BEA_EC-HH(4.2%) varnish to obtain an ink formulation, referred to as Toluene/BEA_EC-HH(4.2%)/PFS(40%)-072920.

The PFS has approximately 3.48% Mn % incorporation. The suspension was stirred for 2 hours at room temperature, vigorously mixed on a vortex mixer for 1-2 minutes and a sonicated for 10 minutes to reduce the particle agglomerates, and then rolled at a speed of 60 rpm on a bottle roller for 2 hours. The homogeneous suspension was stirred for another 2 hours at 80° C. and cooled to room temperature.

The formulation was used to spin-coat PFS:EC films. Pre-cleaned glass slides were used as substrates for spin coating that was carried out in air. Approximately 0.7 ml of dispersion was applied onto the substrate and spun for 60 seconds to obtain a wet film, which was dried for 10 minutes on a pre-heated hotplate at 150° C. to obtain a final dry film. Spin-coating conditions and properties of final dry films are summarized in Table 19.

TABLE 19

| Spin-speed (krpm) | Film thickness (um) | Blue absorption | Conversion Efficiency |
|---|---|---|---|
| 0.7 | 41 | 71.2% | 47.8% |
| 1.0 | 33 | 64.1% | 48.0% |
| 3.0 | 24 | 39.6% | 48.3% |

Example 30

A mixture solvent, referred to as Toluene/BEA, was prepared by mixing 27.1847 g of toluene and 27.4994 g of 2-(2-Butoxyethoxy)ethyl acetate (BEA). The mixture solvent was stirred for 15-30 minutes at room temperature. A 4.2% EC-HH solution referred to as Toluene/BEA_EC-HH (4.2%) was prepared by mixing 0.4886 g of a binder material EC-HH (see Example 1) in 11.0682 g of the Toluene/BEA solvent mixture. The varnish was stirred overnight at 80° C. to dissolve the binder completely and cooled to room temperature.

1.8965 g of PFS Sample No. GRC030620BTGA474 (from Example 27) having a relative QE>93% and milled to a D50 particle size of 4 µm was mixed with 2.8527 g of the Toluene/BEA_EC-HH(4.2%) varnish to obtain an ink formulation referred to as Toluene/BEA_EC-HH(4.2%)/PFS (40%)-072920. The PFS has approximately 3.48% Mn % incorporation. The suspension was stirred for 2 hours at room temperature, vigorously mixed on a vortex mixer for 1-2 minutes and sonicated for 10 minutes to reduce the particle agglomerates, and then rolled at a speed of 60 rpm on a bottle roller for 2 hours. The homogeneous suspension was stirred for another 2 hours at 80° C. and cooled to room temperature.

The formulation was used to spin-coat PFS:EC films. Pre-cleaned glass slides were used as substrates for spin coating that was carried out in air. Approximately 0.7 ml of dispersion was applied onto the substrate and spun for 60 seconds to obtain a wet film, which was dried for 10 minutes on a pre-heated hotplate at 150° C. to obtain a final dry film. Spin-coating conditions and properties of the final dry films are summarized in Table 20.

TABLE 20

| Spin-speed (krpm) | Film thickness (um) | Blue absorption | Conversion Efficiency |
|---|---|---|---|
| 0.7 | 41 | 71.2% | 47.8% |
| 1.0 | 33 | 64.1% | 48.0% |
| 3.0 | 24 | 39.6% | 48.3% |

Example 31

Triethylene glycol monomethyl ether (TGME) obtained from Sigma-Aldrich (catalog #317292) and Diethylene glycol dimethyl ether (DGDE) were used as solvent. The solvent was mixed with a binder material, ethyl cellulose EC-HH (see Example 1) to produce a 1% binder varnish, referred to as TGME/DGDE-1% EC-HH (see Table 21). 0.5776 g of PFS Sample No. 070820A ($K_2SiF_6:Mn^{4+}$) was mixed with 6.6703 g of the TGME/DGDE_EC-HH(1.0%) varnish to obtain an ink formulation, referred to as TGME/DGDE_EC-HH(1.0%)/PFS(8.0%).

PFS Sample No. 070820A was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. The PFS sample has a relative QE=43% and the powder was milled to a D50 particle size of 1.1 µm.

The TGME/DGDE_EC-HH(1.0%)/PFS(8.0%) suspension was stirred for 2 hours at room temperature, vigorously mixed on a vortex mixer for 1-2 minutes and sonicated for 10 minutes to reduce the particle agglomerates, and then rolled at a speed of 60 rpm on a bottle roller for 2 hours. The homogeneous suspension was stirred for another 2 hours at 60° C. and cooled to room temperature for ink jet printing.

An exemplar print was obtained using the formulation of TGME/DGDE_EC-HH(1.0%)/PFS(8.0%) and the formulation was ink jet printed in patterns on a polyethylene terephthalate (PET) substrate. A commercially available MFL-003 ink from Fuji Film was used as a reference (see Table 21).

TABLE 21

| | Viscosity at 45° C. | Contact angle on nozzle plate (1 |
|---|---|---|
| Commercial ink MF003 | | 62 |
| TGME/DGDE-1% EC-HH | 8.36 | 63.7 |
| T/CHO-1% EC-HH | 13.27 | 54 |
| TGME/CHO-1% EC-HH | 10.97 | 55.3 |
| DGDE/DGME-1% EC-HH | 6.83 | 51.6 |
| DGME/20% Tol-1% EC-HH | 7.05 | 51.5 |
| T/DGDE-0.66% EC-HH | | 51.6 |

A Dimatix Materials Printer (DMP-2831) from Fuji Film with a 10 pL ink cartridge (DMC-11610, 16 nozzles, nozzle diameter is 21 µm) was used. The nozzle plate is made of $Si/SiO_2$ material and the contact angle of water on its surface is 100°.

Example 32

For Example 32, the chemical agents are listed in Table 22.

TABLE 22

| Chemical | Abbr. | CAS | Vendor/Catalog | Comment |
|---|---|---|---|---|
| 2-propanol | IPA | 67-63-0 | Fisher/A416-500 | |
| Sec-Butanol | SBA | 78-92-2 | Fisher/AC107700010 | |
| Isobutyric acid | IBA | 79-31-2 | TIC/I0103 | |
| Lactic acid | | 50-21-5 | Sigma/252476 | |
| Titaniunn(IV) isopropoxide | TIPO | 546-68-9 | Sigma/377996 | |
| Oleic acid | OA | 112-80-1 | Sigma/364525 | |
| Dibutyl phosphate | DBP | 107-66-4 | Sigma/68572 | |
| Bis(2-ethylhexyl) phosphate | BEHP | 298-07-7 | Sigma/237825 | |

TiO2-1-Slurry: A dried 20-ml vial equipped with a stir bar was charged with sec-Butanol (12 ml), water (0.3489 g, 19.4 mmol) and isobutyric acid (IBA) (0.3502 g, 4 mmol) at room temperature. After the mixture was stirred for 30 minutes, titanium(IV) isopropoxide (0.87 g, 3 mmol) was added to the stirred solution dropwise. The homogeneous solution, referred to as TiO2-1-Slurry, was allowed to stir at room temperature. The particle size characterized by Malvern Zetasizer Dynamic Light Scattering after 5 hours was 2.45 nm and after 28 hours was 3.04 nm.

TiO2-2-Slurry: A dried 50 ml vial equipped with a stir bar was charged with 2-propanol (18 ml), water (0.1856 g, 10.3 mmol) and lactic acid (0.35 g, 3.9 mmol) at room temperature. After the mixture was stirred for 30 minutes, titanium(IV) isopropoxide (0.8269 g, 2.9 mmol) was added to the stirred solution dropwise. The homogeneous solution, referred to as TiO2-2-Slurry, was allowed to stir at room temperature. The particle size characterized by Malvern Zetasizer Dynamic Light Scattering after 20 hours was slightly over 3 nm.

TiO2-3-Slurry: A dried 50 ml vial equipped with a stir bar was charged with sec-Butanol (18 ml), water (0.2109 g, 11.7 mmol) and lactic acid (0.3756 g, 4.16 mmol) at room temperature. After the mixture was stirred for 30 minutes, titanium(IV) isopropoxide (0.9091 g, 3.2 mmol) was added to the stirred solution dropwise. The homogeneous solution, referred to as TiO2-3-Slurry was allowed to stir at room temperature. The particle size characterized by Malvern Zetasizer Dynamic Light Scattering after 20 hours was slightly over 3 nm.

TiO2-4-Slurry: A dried 50 ml vial equipped with a stir bar was charged with 2-propanol (19.74 g), water (1.13 g, 63 mmol) and IBA (1.0 g, 11.3 mmol) at room temperature. After the mixture was stirred for 30 minutes, titanium(IV) isopropoxide (5.11 g, 18 mmol) was added to the stirred solution dropwise. The homogeneous solution, referred to as TiO2-4-Slurry was allowed to stir at room temperature. The solution turned cloudy and became a white slurry within 2-3 minutes indicating agglomeration had formed.

Example 33

Four different solvent samples (dibutyl phosphate (DBP), oleic acid (OA), bis(2-ethylhexyl) phosphate (BEHP) and terpineol) were evaluated for removing agglomeration and stabilizing $TiO_2$ nanoparticles in isopropanol. Four glass vials were cleaned and dried. 2 ml of the white and cloudy TiO2-4-Slurry (from Example 32) was added to each vial. Added 0.5 ml of one of the solvent samples to be evaluated to each of the vials.

Solvent DBP turned the cloudy slurry into a clear suspension, while solvents OA, BEHP and terpineol (vial-D) did not change the slurry (remained white and cloudy). All the suspensions were sonicated for 10 minutes. After sonication, the suspension containing BEHP turned clear. After 2-day storage at ambient conditions, only the suspension containing DBP remained clear. The vial containing BEHP became cloudy again. The vial containing OA and the vial containing terpineol exhibited settling and phase separation, suggesting particle agglomeration.

The TiO2-4-Slurry sample with DBP was dried with flowing nitrogen and further dried in an oven at 145° C. The coarse solid powders were ground with an agate mortar and pestle into much finer powder and analyzed with X-ray diffraction (XRD), which was performed using an Empyrean machine at 45 kV*40 mA. The $TiO_2$ nanoparticles obtained appear to be amorphous and do not show any crystalline phases.

Example 34

3.9416 g of the $TiO_2$ nanoparticle suspension sample TiO2-1-slurry (from Example 32) was concentrated by $N_2$ flowing to a 0.8186 g of clear gel-like suspension containing 53.4% (0.4375 g) $TiO_2$, which was then mixed with 1.5406 g of a varnish containing solvent mixture Toluene/BEA (1:1) and 6.1 wt % of ethyl cellulose EC-HH (see Example 1) in a flask. The suspension (2.3592 g=1.5406 g+0.8186 g) was optically clear, hereafter referred to as Toluene/BEA_EC-HH_$TiO_2$. 2.1302 g of the Toluene/BEA_EC-HH_$TiO_2$ suspension was then added to a vial containing 0.9897 g of PFS Sample No. GRC030620BTGA474 having a relative QE-90% (see Example 27). PFS Sample No. GRC030620BTGA474 was milled using oleic acid (see Example 27) to a D50 particle size of 4.3 μm and mixed well. Solid contents in the final suspension, hereafter referred to as Toluene/BEA_EC-HH_TiO2-PFS-33, are 0.9897 g (46.5 wt %) of PFS, 0.395 g (18.5 wt %) of $TiO_2$ and 0.0854 g (4.0 wt %) of EC-HH. The suspension was first stirred for 2 hours at room temperature, followed by vigorous mixing on a vortex mixer for 1-2 minutes to reduce the particle agglomerates, and then rolled at a speed of 60-70 rpm on a bottle roller for 2 hours. It was stirred for another 2 hours at 80° C., and then cooled down to room temperature for film coating.

The Toluene/BEA_EC-HH_TiO2-PFS-33 suspension was then used to spin-coat films. Pre-cleaned glass slides were used as substrates for spin coating that was carried out in air. Approximately 0.3 ml of the suspension was added onto the substrate and spun for 60 seconds to obtain a wet film. Film thickness may be adjusted by using different spin-speeds. The coated substrate was baked on a pre-heated hotplate at 150° C. for 10 minutes before testing. The final dry films contained 67.3 wt % of PFS and 26.9 wt % TiO2 dispersed in 5.8 wt % of EC-HH.

Performance of the spin-coated films are summarized in Table 23. The film spun at 0.8 krpm was then characterized using Titan Themis SEM/TEM. TEM sample was prepared by using a scalpel to remove several small pieces of the film from the glass substrate. These film pieces were then placed between two glass slides and the slides were moved back and forth to reduce the size of the film pieces to powder as much as possible. This film powder was placed on a 3 mm diameter carbon coated copper grid. Composition spectra obtained by TEM confirmed the presence of $TiO_2$ and PFS.

TABLE 23

| Spin speed (krpm) | Thickness (um) | Blue absorption | Conversion Efficiency | Red conversion ratio |
|---|---|---|---|---|
| 0.8 | 32 | 56.1% | 46.9% | 26.3% |
| 1.0 | 28 | 53.2% | 49.0% | 26.1% |
| 3.0 | 16 | 33.8% | 46.2% | 15.6% |

Example 35

0.10 g of dibutyl phosphate (DBP) was added to 1.0 g of Toluene/BEA_EC-HH_TiO2-PFS-33 prepared in Example 33. The final suspension, hereafter referred to as Toluene/BEA_EC-HH_TiO2-DBP-PFS-34, was stirred for another 2 hours at 80° C., followed by vigorous mixing on a vortex mixer for 1-2 minutes to reduce the particle agglomerates, and then cooled down to room temperature for film coating. Spin-coating was conducted in the same way as in Example 33. Final dry films consist of 67.3 wt % of PFS and 26.9 wt % $TiO_2$ dispersed in 5.8% of binder ethyl cellulose EC-HH. Performance of the spin-coated films are summarized in Table 24.

TABLE 24

| Spin speed (krpm) | Thickness (um) | Blue absorption | Conversion Efficiency | Red conversion ratio |
|---|---|---|---|---|
| 1.0 | 25 | 53.3% | 45.7% | 24.4% |
| 3.0 | 15 | 36.5% | 45.3% | 16.5% |

Example 36

Three anionic dispersants in the Hypermer™ family from Croda Inc. were evaluated in propylene glycol methyl ether acetate (PGMEA) and isobornyl acrylate (IA). Hypermer™ KD4-LQ-(AP), referred to as KD4, is a polyester composed of polyhydroxystearic acid stearate (Octadecanoic acid, 12-hydroxy-, homopolymer, octadecenoate, CAS-No: 58128-22-6), Hypermer™ KD24-SS-(RB), referred to as KD24 is polyoxyethylene (10) ether phosphate (PEG-10 Oleyl ether phosphate, CAS-No: 39464-69-2), and Hypermer™ KD57-LQ-(JP), referred to as KD57, is 2-(octen-1-yl)-butanedioic acid (CAS-No: 28805-58-5).

PFS Sample No. 327 was prepared by the process described in US Publication No. 2018/0163126. The $K_2SiF_6:Mn^{41}$ powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. The powder was then washed in a nearly saturated solution of $K_2SiF_6$ in 49% HF for 30 minutes.

Samples at 25 wt % total solids loading were prepared by combining an anionic dispersant at 2.5 wt % and 5 wt % loadings (relative to PFS), PFS Sample No. 327 and PGMEA. The samples were shaken briefly to mix and rolled at 80 rpm for 10 minutes and filtered through Whatman #4 filter paper and washed with 3×20 mL acetone. The first wash was used to rinse the sample bottle and the solid filter cake was churned after washes 1 and 2. After the final wash, the filter cake was transferred to a vacuum desiccator to dry under vacuum overnight. The samples were then sifted through a 170 mesh nylon screen and analyzed (see Table 25).

Each dispersant reduced the D50 particle size by 50-60% and narrowed the particle size distribution (e.g. span) by 30-50%, as desired to reduce dispersity and agglomeration in the samples.

All three anionic dispersant materials reduced the % QE by 1-6%. KD4 showed a 2-3% reduction in the QE drop after 100 hr HTHH relative to the control sample. KD24 and KD57 had a 3-9% higher QE drop after 100 hr HTHH relative to the control sample. Since the % QE of PFS Sample No. 327 was low, it was hypothesized that some of the observed % QE degradation stemmed from the poor sample quality of the starting $K_2SiF_6:Mn^{4+}*$.

TABLE 25

| Sample | Dispersant | loading (wt %) | % QE | D10 (μm) | D50 (μm) | D90 (μm) | span | 100 hr HTHH QE drop (%) |
|---|---|---|---|---|---|---|---|---|
| PFS 327 | none | none | 99.7% | 10.4 | 33.8 | 65.9 | 1.6 | 21.4% |
| 1 | KD4 | 5 | 93.9% | 8.9 | 13.5 | 19.6 | 0.8 | 18.4% |
| 2 | KD4 | 2.5 | 94.5% | 9.6 | 16.0 | 27.2 | 1.1 | 19.4% |
| 3 | KD24 | 5 | 98.3% | 9.6 | 16.1 | 28.4 | 1.2 | 30.0% |
| 4 | KD24 | 2.5 | 98.9% | 9.2 | 14.7 | 22.8 | 0.9 | 27.7% |
| 5 | KD57 | 5 | 97.8% | 9.5 | 15.8 | 25.4 | 1.0 | 24.2% |
| 6 | KD57 | 2.5 | 96.9% | 9.7 | 16.9 | 28.0 | 1.1 | 24.8% |

Samples at 45 wt % total solids loading were prepared by combining an anionic Hypermer™ dispersant or potassium oleate dispersant (dispersant loading at 2.5 wt % relative to PFS), PFS Sample No. 337 ($K_2SiF_6:Mn^{4+}$, annealed, treated and roasted) and PGMEA. Samples at 40 wt % total solids loading were prepared by combining an anionic Hypermer™ dispersant or potassium oleate dispersant (dispersant loading at 2.5 wt % relative to PFS), PFS Sample No. 337 at 2.5 wt % and IA.

The samples were shaken briefly to mix and rolled at 80 rpm for 30 minutes and filtered through Whatman #4 filter paper and washed with 3×20 mL acetone. The first wash was used to rinse the sample bottle and the solid filter cake was churned after washes 1 and 2. After the final wash, the filter cake was transferred to a vacuum desiccator to dry under vacuum overnight. The samples were then sifted through a 170 mesh nylon screen and analyzed (see Table 26).

Each Hypermer™ dispersant reduced the D50 particle size 30-45% and narrowed the particle size distribution (e.g. span) by 10-40%, as desired to reduce dispersity and agglomeration in the samples. Potassium oleate yielded lower D50 particle size and narrower particle size distribution, as desired to reduce dispersity and agglomeration in the samples.

All three anionic Hypermer™ dispersant materials had a much lower impact on % QE. KD24 increased the % QE by just under 1% and KD57 KD4 and potassium oleate reduced the % QE by about 1-3%. No HTHH data was collected.

TABLE 26

| Sample | solvent | dispersant | % QE | D10 (μm) | D50 (μm) | D90 (μm) | span |
|---|---|---|---|---|---|---|---|
| PFS 339 | none | none | 103.7% | 9.8 | 26.3 | 52.0 | 1.6 |
| 1 | PGMEA | potassium oleate | 102.4% | 8.9 | 10.4 | 12.2 | 0.3 |
| 2 | PGMEA | KD57 | 102.2% | 9.5 | 17.6 | 34.1 | 1.4 |
| 3 | PGMEA | KD24 | 104.4% | 9.1 | 15.2 | 27.1 | 1.2 |
| 4 | PGMEA | KD4 | 101.1% | 8.9 | 14.6 | 23.3 | 1.0 |
| 5 | IA | potassium oleate | 103.0% | 9.2 | 11.0 | 12.9 | 0.3 |
| 6 | IA | KD57 | 102.7% | 9.3 | 16.7 | 32.3 | 1.4 |
| 7 | IA | KD24 | 104.4% | 8.8 | 14.7 | 26.1 | 1.2 |
| 8 | IA | KD4 | 102.8% | 9.6 | 18.4 | 37.1 | 1.5 |

Example 37

Dispersants from Lubrizol Corporation were evaluated in propylene glycol methyl ether acetate (PGMEA), ethyl acetate (EA) and ethanol. Solplus™ D540 or Solsperse™ 45000, Solpus™ D541, Solsperse™ 41000, Solsperse™ 65000 and Solsperse™ 85000 are anionic dispersants containing phosphate based coordinating groups with varying lengths of polyol or polyester-polyol stabilizing groups and varying amounts of acid functionality on the phosphate. Solplus™ D570 is a partially neutralized polyacrylate with polyol stabilizing groups. Solsperse™ wv400 is a non-ionic polyurethane-based material. Solsperse™ 71000 is a zwitterionic or multi-functional comb copolymer with amine and acid groups.

PFS Sample No. 344 was prepared by the process described in US Publication No. 2018/0163126. The $K_2SiF_6:Mn^{4+}$ powder was washed in a nearly saturated solution of $K_2SiF_6$ in 49% HF and annealed at 540° C. for 8 hours under a 20% fluorine:80% nitrogen atmosphere. The annealed powder was sifted through 280 mesh. The powder was then washed in a nearly saturated solution of $K_2SiF_6$ in 49% HF for 30 minutes. The powder was subjected to a 'roasting' step, an additional low temperature anneal performed after the second wash treatment, at 150° C. for four hours under a 20% fluorine:80% nitrogen atmosphere.

PFS Sample No. 388 was prepared by the process described in US Publication No. 2018/0163126. The $K_2SiF_6:Mn^{4+}$ powder was washed in a nearly saturated solution of $K_2SiF_6$ in 49% HF and annealed at 540° C. for 8 hours under a 20% fluorine:80% nitrogen atmosphere. The annealed powder was sifted through 280 mesh.

Samples at 15 wt % total solids loading were prepared by combining Solsperse™ wv400 or Solplus™ D540 dispersants at 5 wt % dispersant loading relative to PFS, PFS Sample No. 344 and Ethanol or EA. A sample at 15 wt % total solids loading was prepared by combining potassium oleate dispersant at 2.5 wt % dispersant loading relative to PFS, PFS Sample No. 344 and Ethanol.

The samples were shaken briefly to mix and rolled at 80 rpm for 10 minutes and filtered through Whatman #4 filter paper and washed with 2×20 mL ethanol and 3×20 mL acetone. The first wash was used to rinse the sample bottle and the solid filter cake was churned after washes 1 through 4. After the final wash, the filter cake was transferred to a vacuum desiccator to dry under vacuum overnight. The samples were then sifted through a 170 mesh nylon screen and analyzed (see Table 27).

Solsperse™ wv400 reduced the D50 particle size by approximately 55% in both solvents while also reducing the particle size distribution by 35-40%, as desired to reduce dispersity and agglomeration in the samples. Solplus' D540 reduced the D50 particle size in ethyl acetate by 56% and by about 40% in ethanol and also, reduced the particle size distribution (span) by 38% in ethyl acetate and by about 12% in ethanol, as desired to reduce dispersity and agglomeration in the samples. Potassium oleate reduced the D50 particle size by about 52% and reduced the span by about 18%, as desired to reduce dispersity and agglomeration in the samples.

Solplus™ D540 did not reduce the % QE of the PFS material. Solsperse™ wv400 reduced the % QE by about 4-5% in both solvents. Potassium oleate reduced the % QE by about 2%.

TABLE 27

| Sample | solvent | dispersant | % QE | D10 (μm) | D50 (μm) | D90 (μm) | span |
|---|---|---|---|---|---|---|---|
| PFS 344 | none | none | 101.5% | 10.4 | 35.6 | 69.8 | 1.7 |
| 1 | EtOH | potassium oleate | 99.8% | 9.7 | 17.0 | 33.2 | 1.4 |
| 2 | EtOH | Solsperse ™ wv400 | 97.0% | 10.0 | 16.4 | 28.3 | 1.1 |
| 3 | EA | Solsperse ™ wv400 | 95.9% | 9.5 | 15.1 | 24.2 | 1.0 |
| 4 | EtOH | Solplus ™ D540 | 102.6% | 9.9 | 21.7 | 41.8 | 1.5 |
| 5 | EA | Solplus ™ D540 | 102.0% | 9.6 | 15.6 | 25.8 | 1.0 |

The remaining dispersants from Lubrizol were evaluated. Samples at 25 wt % total solids loading were prepared by combining a dispersant (loading at 5 wt % relative to PFS), PFS Sample No. 388 and PGMEA or ethanol.

After combining $K_2SiF_6$:$Mn^{4+}$ with the dispersant solution, the samples were shaken briefly to mix and rolled at 80 rpm for 10 min after which they were filtered through Whatman #4 filter paper and washed with 2×20 mL ethanol and 3×20 mL acetone and then transferred to a vacuum desiccator to dry under vacuum overnight. The first wash was used to rinse the sample bottle and the solid filter cake was churned after washes 1 through 4. The samples were then sifted through a 170 mesh nylon screen and analyzed (see Table 28).

In ethanol, all dispersants performed well, reducing the D50 particle size by 55-65% and reducing the particle size distribution (e.g. span) by 50-80% (compared to PFS Sample No. 388 without solvent or dispersant and sample 1 without dispersant), as desired to reduce dispersity and agglomeration in the samples. In PGMEA, all dispersants except Solsperse™ 85000, performed well reducing the D50 particle size by 50-60% and reducing the particle size distribution by 50-60% (compared to PFS Sample No. 388 without solvent or dispersant and sample 8 without dispersant), as desired to reduce dispersity and agglomeration in the samples. Solsperse™ 85000 reduced both D50 particle size and particle size distribution as desired to reduce dispersity and agglomeration in the sample, but was less effective than sample 8 without dispersant. The zwitterionic comb copolymer with amine and acid functional groups (Solsperse™ 71000) was most effective in reducing agglomeration of $K_2SiF_6$:$Mn^{4+}$ in ethanol and PGMEA. The polymeric acrylate salt containing polyol stabilizing groups (Solplus™ D570) and one of the polyol stabilized phosphate ester dispersants (Solsperse™ 41000) were also very effective.

In ethanol, the impact on % QE was minimal with a 0-1% decrease in % QE. The % QE drop after 100 hr HTHH testing increased substantially compared to PFS Sample No. 388 without solvent or dispersant and sample 1 without dispersant. In PGMEA, the impact on % QE was minimal with <0.5% change relative to PFS Sample No. 388 with no solvent or dispersant. Similarly, the % QE drop after 100 hr HTHH testing increased substantially from 40% QE drop PFS Sample No. 388 with no solvent or dispersant and sample 8 with no dispersant to a 49-61% QE drop for the dispersant coated materials. The zwitterionic comb copolymer exhibited the highest % QE drop after 100 hr at 80° C. and 80% RH. Additional testing was performed on the zwitterionic comb copolymer and discussed below.

TABLE 28

| Sample | solvent | dispersant | % QE | D10 (μm) | D50 (μm) | D90 (μm) | span | 100 hr HTHH QE drop (%) |
|---|---|---|---|---|---|---|---|---|
| PFS 388 | none | none | 100.7% | 10.3 | 28.5 | 59.5 | 1.7 | 39.3% |
| 1 | EtOH | none | 100.6% | 8.9 | 14.7 | 25.0 | 1.1 | 41.1% |
| 2 | EtOH | Solplus ™ D541 | 99.7% | 8.7 | 13.3 | 20.1 | 0.9 | 47.5% |
| 3 | EtOH | Solplus ™ D570 | 99.9% | 8.1 | 12.1 | 17.3 | 0.8 | 65.1% |
| 4 | EtOH | Solsperse ™ 65000 | 100.3% | 7.9 | 11.5 | 16.1 | 0.7 | 54.4% |
| 5 | EtOH | Solsperse ™ 85000 | 100.3% | 8.5 | 12.9 | 19.1 | 0.8 | 49.0% |
| 6 | EtOH | Solsperse ™ 71000 | 100.2% | 8.3 | 9.9 | 11.4 | 0.3 | 65.3% |
| 7 | EtOH | Solsperse ™ 41000 | 100.7% | 7.9 | 11.5 | 16.2 | 0.7 | 52.9% |
| 8 | PGMEA | none | 100.3% | 8.9 | 14.1 | 22.5 | 1.0 | 41.2% |
| 9 | PGMEA | Solplus ™ D541 | 100.5% | 8.4 | 12.7 | 18.7 | 0.8 | 50.3% |
| 10 | PGMEA | Solplus ™ D570 | 101.0% | 7.9 | 11.6 | 16.6 | 0.8 | 60.6% |

TABLE 28-continued

| Sample | solvent | dispersant | % QE | D10 (μm) | D50 (μm) | D90 (μm) | span | 100 hr HTHH QE drop (%) |
|---|---|---|---|---|---|---|---|---|
| 11 | PGMEA | Solsperse ™ 65000 | 101.1% | 8.5 | 13.6 | 22.3 | 1.0 | 57.3% |
| 12 | PGMEA | Solsperse ™ 85000 | 100.5% | 8.9 | 14.6 | 24.5 | 1.1 | 49.1% |
| 13 | PGMEA | Solsperse ™ 71000 | 101.0% | 7.7 | 11.3 | 16.3 | 0.8 | 60.7% |
| 14 | PGMEA | Solsperse ™ 41000 | 100.7% | 8.1 | 12.4 | 18.4 | 0.8 | 57.8% |

Example 38

Anionic dispersants obtained from BYK Additives and Instruments were evaluated. The dispersants include phosphoric and carboxylic acid esters (BYK®-W 9011, Disperbyk®-102, -110, -111, -180, and Disperplast® 1142), polyacrylates (Disperbyk®-190 and -2055), and structured or controlled polymerization technology (CPT) derived acrylates (Disperbyk®-2008, -2012 and -2013). Three non-ionic polyurethane based dispersants (BYK®-9077, Disperbyk®-168, and -185) and several cationic hyperbranched polyamine dispersants (BYK®-9076, Disperbyk®-2152, -2155, -2157, -2158, -2200, and -2205). Additional materials include small molecule surfactants (BYK®-1788 and -3410 (docusate sodium, CAS-No: 577-11-7) and Disperbyk®-2117 and -2118 (EO/PO block copolymers).

Samples at 17 wt % total solids loading were prepared by combining phosphoric acid polyester anionic dispersant, Disperbyk®-110 at 5 wt % loading (relative to PFS), PFS Samples with varying levels of processing (PFS Sample No. 386 ($K_2SiF_6$:$Mn^{4+}$, annealed), PFS Sample No. 428 ($K_2SiF_6$:$Mn^{4+}$, annealed and treated), PFS Sample No. 421 ($K_2SiF_6$:$Mn^{4+}$, annealed), PFS Sample No. 421 ($K_2SiF_6$:$Mn^{4+}$, annealed and treated), PFS Sample No. 425 ($K_2SiF_6$:$Mn^{4+}$, annealed and treated) and PFS Sample No. 341 ($K_2SiF_6$:$Mn^{4+}$, annealed, treated and roasted)) and ethanol or ethyl acetate.

The PFS samples were prepared by the process described in US Publication No. 2018/0163126. The powders were washed in a nearly saturated solution of $K_2SiF_6$ in 49% HF and annealed at 540° C. for 8 hours under a 20% fluorine: 80% nitrogen atmosphere. The annealed powder was sifted through 280 mesh. The annealed and treated PFS samples were then washed in a nearly saturated solution of $K_2SiF_6$ in 49% HF for 30 minutes. PFS Sample No. 341 was subjected to a 'roasting' step, an additional low temperature anneal performed after the second wash treatment, at 150° C. for four hours under a 20% fluorine:80% nitrogen atmosphere.

After combining $K_2SiF_6$:$Mn^{4+}$ with the dispersant solution, the samples were shaken briefly to mix and rolled at 80 rpm for 10 min after which they were filtered through Whatman #4 filter paper and washed with 2×20 mL ethanol and 3×20 mL acetone and then transferred to a vacuum desiccator to dry under vacuum overnight. The first wash was used to rinse the sample bottle and the solid filter cake was churned after washes 1 through 4. The samples were then sifted through a 170 mesh nylon screen and analyzed (see Table 29).

For the annealed PFS samples (samples 1, 6 and 7), the dispersant coating reduced the D50 particle size by 60-70%, as desired to reduce dispersity and agglomeration in the samples. Samples 6 and 7 reduced the particle size distribution by 40%, while sample 1 exhibited the same particle size distribution as PFS Sample No. 386 without a solvent.

For annealed and treated phosphor materials, the dispersant coating decreased the D50 particle size by 35-60%, as desired to reduce dispersity and agglomeration in the samples. Samples 2 and 3 reduced the particle size distribution by ~40%, while sample 4 exhibited the same particle size distribution as PFS Sample No. 425. The annealed, treated, and roasted phosphor PFS material had a reduction in D50 particle size of 30% and a reduction in particle size distribution of 10%, as desired to reduce dispersity and agglomeration in the samples.

Regardless of the processing level for the PFS samples, the addition of Disperbyk®-110 resulted in a decrease in % QE of 1-3%.

TABLE 29

| Sample | solvent | $K_2SiF_6$:$Mn^{4+}$ | % QE | D10 (μm) | D50 (μm) | D90 (μm) | span |
|---|---|---|---|---|---|---|---|
| PFS 386 | none | annealed | 102.1% | 12.3 | 59.5 | 102.9 | 1.5 |
| 1 | EtOH | annealed | 101.3% | 10.0 | 21.6 | 42.6 | 1.5 |
| PFS 428 | none | annealed, treated | 102.2% | 8.5 | 23.7 | 43.8 | 1.5 |
| 2 | EtOH | annealed, treated | 100.6% | 7.7 | 12.1 | 17.9 | 0.8 |
| PFS 421 | none | annealed, treated | 105.6% | 10.3 | 33.2 | 65.4 | 1.7 |
| 3 | EtOH | annealed, treated | 104.4% | 8.6 | 13.9 | 21.6 | 0.9 |
| PFS 425 | none | annealed, treated | 104.4% | 10.9 | 39.6 | 75.6 | 1.6 |
| 4 | EtOH | annealed, treated | 103.4% | 9.8 | 19.7 | 41.8 | 1.6 |
| PFS 341 | none | annealed, treated, roasted | 101.6% | 9.8 | 26.2 | 49.0 | 1.5 |
| 5 | EtOH | annealed, treated, roasted | 101.0% | 9.7 | 18.0 | 33.6 | 1.3 |
| PFS 421 | none | annealed | 105.4% | 12.6 | 47.9 | 84.6 | 1.5 |
| 6 | EtOH | annealed | 102.1% | 8.0 | 12.6 | 19.0 | 0.9 |
| 7 | EA | annealed | 102.2% | 8.0 | 12.4 | 19.1 | 0.9 |

The remaining dispersants obtained from BYK Additives and Instruments were evaluated using a single PFS Sample No. 434 ($K_2SiF_6$:$Mn^4$, annealed and treated) at 5 wt % dispersant loading relative to PFS in ethanol at 25 wt % total solids loading, and in PGMEA at 21 wt % total solids loading. Disperbyk@-168, -2157, -2158, -2205 and BYK@-1788 were not soluble/miscible with ethanol and BYKR-3410 was not soluble/miscible with PGMEA and these dispersants were not examined in those solvents.

After combining the PFS sample with the dispersant solution, the samples were shaken briefly to mix and rolled at 80 rpm for 10 min (ethanol samples) or 40 rpm for 15 min (PGMEA samples). The ethanol samples were then filtered through Whatman #4 filter paper, washed with 3×20 mL ethanol and 2×20 mL acetone and then transferred to a vacuum desiccator to dry under vacuum overnight. The PGMEA samples were filtered through Whatman #4 filter paper, washed with 3×20 mL PGMEA and 2×20 mL acetone and then transferred to a vacuum desiccator to dry under vacuum overnight. In both solvents, the first wash was used to rinse the sample bottle and the solid filter cake was churned after washes 1 through 4. All samples were then sifted through a 170 mesh nylon screen and analyzed and the data is collected in Table 30 for samples coated in ethanol and Table 31 for samples coated in PGMEA.

Hyperbranched polyamine cationic dispersants (samples 3-5) performed well in ethanol providing a substantial reduction in D50 particle size (60-70%) and particle size distribution (17-47%) (compared to PFS Sample No. 434 without solvent or dispersant and sample 1 with no dispersant), as desired to reduce dispersity and agglomeration in the samples. Sample 2 was coated with potassium oleate and provided a substantial reduction in D50 particle size (53%) (compared to PFS Sample No. 434 without solvent or dispersant), as desired to reduce dispersity and agglomeration in the samples; although there was an increase in the particle size distribution. (See Table 30.) Polyurethane based non-ionic dispersants (samples 6 and 7) also performed well in ethanol producing very low D50 particle sizes near 13.0 µm (70% reduction) and greatly reduced (44%) particle size distributions, as desired to reduce dispersity and agglomeration in the samples. Phosphoric and carboxylic acid ester based anionic dispersants (samples 8-12) provided a substantial reduction (55-65%) to D50 particle size and a reduction (0-25%) to particle size distribution, as desired to reduce dispersity and agglomeration in the samples. Polyacrylate and CPT derived acrylate based anionic dispersants (samples 13-17) performed excellent (compared to PFS Sample No. 434 and sample 1) producing a substantial reduction (60-70%) in D50 particle size and in particle size distribution (17-47%), as desired to reduce dispersity and agglomeration in the samples. Small molecule surfactant coated sample 18 exhibited D50 particle size reduction (70%), and particle size distribution reduction (34%), as desired to reduce dispersity and agglomeration in the samples. Samples 19 and 20 coated with Disperbyk®-2117 and -2118 showed a substantial reduction in the D50 particle size (50-60%), as desired to reduce dispersity and agglomeration in the samples; although the particle size distribution of these coated materials is similar to sample 1.

Hyperbranched polyamine cationic dispersants (samples 3-5) performed well in ethanol exhibiting minimal impact to % QE of +1% (See Table 30.) Samples 3-5 only showed a slight increase (poorer performance) in QE drop after 100 hr of HTHH testing at 80° C. and 80% RH relative to PFS Sample No. 434 and sample 1. Polyurethane based non-ionic dispersants (samples 6 and 7) also performed well in ethanol with no discernible impact to % QE. These dispersants also showed a slight increase (poorer performance) in QE drop after 100 hr of HTHH testing relative to PFS Sample No. 434 and sample 1. Phosphoric and carboxylic acid ester based anionic dispersants (samples 8-12) performed on par with or very slightly better than PFS Sample No. 434 and sample 1 and exhibited minimal impact to % QE (±0-1.5%). These dispersants also showed a very slight increase (poorer performance) in QE drop after 100 hr of HTHH testing relative to PFS Sample No. 434 and sample 1. Polyacrylate and CPT derived acrylate based anionic dispersants (samples 13-17) performed excellent when compared to PFS Sample No. 434 and sample 1 and exhibited minimal impact to % QE (±1%). The acrylate based dispersants exhibited significant increases in % QE drop after 100 hr of HTHH testing relative to PFS Sample No. 434 and sample 1. Small molecule surfactant coated sample 18 exhibited excellent % QE, but displayed the worst % QE drop after 100 hr of HTHH testing of 48.6%. Samples 19 and 20 coated with Disperbyk®-2117 and -2118 showed no impact to % QE and only a slight increase in the % QE drop after 100 hr HTHH testing.

TABLE 30

| Sample | dispersant | type | % QE | D10 (µm) | D50 (µm) | D90 (µm) | span | 100 hr HTHH QE drop (%) |
|---|---|---|---|---|---|---|---|---|
| PFS 434 | none | N/A | 102.3% | 11.6 | 44.0 | 76.3 | 1.5 | 27.2% |
| 1 | none, w/ EtOH | N/A | 102.1% | 9.8 | 17.7 | 34.7 | 1.4 | 31.2% |
| 2 | potassium oleate | anionic | 102.0% | 10.0 | 20.7 | 46.9 | 1.8 | 32.4% |
| 3 | BYK ®-9076 | polyamine | 103.4% | 8.9 | 13.9 | 22.3 | 1.0 | 41.6% |
| 4 | Disperbyk ®-2152 | polyamine | 101.4% | 9.7 | 17.1 | 30.6 | 1.2 | 38.9% |
| 5 | Disperbyk ®-2155 | polyamine | 101.9% | 8.8 | 13.1 | 19.2 | 0.8 | 33.8% |
| 6 | BYK ®-9077 | polyurethane | 102.3% | 8.7 | 13.1 | 19.6 | 0.8 | 36.0% |
| 7 | Disperbyk ®-185 | polyurethane | 102.1% | 8.6 | 13.0 | 19.3 | 0.8 | 41.9% |
| 8 | BYK ®-W-9011 | acid ester | 100.6% | 9.1 | 14.8 | 25.7 | 1.1 | 39.6% |
| 9 | Disperbyk ®-102 | acid ester | 103.4% | 9.6 | 16.3 | 27.9 | 1.1 | 35.4% |
| 10 | Disperbyk ®-111 | acid ester | 102.1% | 9.5 | 16.8 | 31.4 | 1.3 | 37.5% |
| 11 | Disperbyk ®-180 | acid ester | 102.9% | 10.2 | 19.7 | 38.4 | 1.4 | 36.3% |
| 12 | Disperplast ®-1142 | acid ester | 103.2% | 10.0 | 18.8 | 38.4 | 1.5 | 35.2% |
| 13 | Disperbyk ®-190 | polyacrylate | 102.2% | 9.8 | 17.3 | 32.7 | 1.3 | 41.4% |
| 14 | Disperbyk ®-2055 | polyacrylate | 103.2% | 8.9 | 13.2 | 19.3 | 0.8 | 37.5% |
| 15 | Disperbyk ®-2008 | CPT-acrylate | 101.5% | 8.9 | 13.7 | 21.1 | 0.9 | 43.6% |
| 16 | Disperbyk ®-2012 | CPT-acrylate | 102.2% | 8.8 | 13.0 | 19.0 | 0.8 | 41.8% |
| 17 | Disperbyk ®-2013 | CPT-acrylate | 103.4% | 8.5 | 12.7 | 18.9 | 0.8 | 44.9% |
| 18 | BYK ®-3410 | surfactants | 103.0% | 8.9 | 14.2 | 22.7 | 1.0 | 48.6% |

TABLE 30-continued

| Sample | dispersant | type | % QE | D10 (μm) | D50 (μm) | D90 (μm) | span | 100 hr HTHH QE drop (%) |
|---|---|---|---|---|---|---|---|---|
| 19 | Disperbyk ®-2117 | other | 103.0% | 10.0 | 20.5 | 45.0 | 1.7 | 32.5% |
| 20 | Disperbyk ®-2118 | other | 102.5% | 9.8 | 17.4 | 32.7 | 1.3 | 38.5% |

Hyperbranched polyamine cationic dispersants (samples 3-9) performed well in PGMEA providing a substantial reduction in D50 particle size (60-70%) and particle size distribution (15-40%) (compared to PFS Sample No. 434 without dispersant or solvent and sample 1 without dispersant), as desired to reduce dispersity and agglomeration in the samples. Sample 2 was coated with potassium oleate and provided a substantial reduction in D50 particle size (71%) and span (36%) (compared to PFS Sample No. 434 without solvent or dispersant), as desired to reduce dispersity and agglomeration in the samples. (See Table 31). Polyurethane based non-ionic dispersants (samples 10-12) also performed well in PGMEA providing substantial reduction in D50 particle size (65-70%) and greatly reduced (27-39%) particle size distributions, as desired to reduce dispersity and agglomeration in the samples. Phosphoric and carboxylic acid ester based anionic dispersants (samples 13-17) provided a substantial reduction (60-70%) to D50 particle size and a reduction (5-40%) to particle size distribution, as desired to reduce dispersity and agglomeration in the samples. Polyacrylate and CPT derived acrylate based anionic dispersants (samples 18-22) performed excellent (compared to PFS Sample No. 434 and sample 1) producing a substantial reduction (70%) to D50 particle size and particle size distribution (34-44%), as desired to reduce dispersity and agglomeration in the samples. Small molecule surfactant coated sample 23 exhibited excellent D50 particle size reduction (70%) and particle size distribution reduction (27%), as desired to reduce dispersity and agglomeration in the samples. Sample 24 and 25 coated with Disperbyk®-2117 and -2118 showed a substantial reduction in the D50 particle size (65-67%), as desired to reduce dispersity and agglomeration in the samples; although, the particle size distribution of these coated materials is no better than sample 1.

Hyperbranched polyamine cationic dispersants (samples 3-9) performed well in PGMEA exhibiting minimal impact to % QE of 0.5%. Samples 3-9 showed a slight to moderate increase (poorer performance) in QE drop to 35-50% after 100 hr of HTHH testing at 80° C. and 80% RH relative to PFS Sample No. 434 and sample 1. Polyurethane based non-ionic dispersants (samples 10-12) also performed well in PGMEA with no discernible impact to % QE. These dispersants also showed a moderate increase (poorer performance) in QE drop to 37-47% after 100 hr of HTHH testing relative to PFS Sample No. 434 and sample 1. Phosphoric and carboxylic acid ester based anionic dispersants (samples 13-17) performed on par with or slightly better than PFS Sample No. 434 and sample 1 and exhibited minimal impact to % QE (±0.5). These dispersants also showed a moderate increase (poorer performance) in QE drop to 38-45% after 100 hr of HTHH testing relative to PFS Sample No. 434 and sample 1. Polyacrylate and CPT derived acrylate based anionic dispersants (samples 18-22) performed excellent when compared to PFS Sample No. 434 and sample 1 and exhibited minimal impact to % QE (±0.5%). These acrylate based dispersants exhibited significant increases in % QE drop to 39-50% after 100 hr of HTHH testing relative to PFS Sample No. 434 and sample 1. Small molecule surfactant coated sample 23 exhibited excellent % QE, however this sample also displayed a high % QE drop after 100 hr of HTHH testing of 41.7%. Samples 24 and 25 coated with Disperbyk®-2117 and -2118 showed no impact to % QE and only a slight increase in the % QE drop after 100 hr HTHH testing.

TABLE 31

| Sample | dispersant | type | % QE | D10 (μm) | D50 (μm) | D90 (μm) | span | 100 hr HTHH QE drop (%) |
|---|---|---|---|---|---|---|---|---|
| PFS 434 | none | N/A | 103.5% | 12.0 | 45.6 | 76.5 | 1.4 | 26.4% |
| 1 | none, w/ PGMEA | N/A | 103.4% | 9.5 | 16.0 | 27.7 | 1.1 | 31.7% |
| 2 | potassium oleate | anionic | 101.8% | 9.0 | 14.1 | 22.1 | 0.9 | 28.1% |
| 3 | BYK ®-9076 | polyamine | 103.5% | 9.6 | 16.5 | 29.5 | 1.2 | 48.0% |
| 4 | Disperbyk ®-2152 | polyamine | 103.6% | 9.4 | 15.7 | 26.9 | 1.1 | 35.6% |
| 5 | Disperbyk ®-2155 | polyamine | 103.5% | 9.3 | 15.4 | 26.8 | 1.1 | 36.2% |
| 6 | Disperbyk ®-2157 | polyamine | 103.3% | 9.5 | 15.6 | 25.5 | 1.0 | 41.4% |
| 7 | Disperbyk ®-2158 | polyamine | 103.3% | 9.2 | 15.0 | 25.6 | 1.1 | 34.8% |
| 8 | Disperbyk ®-2200 | polyamine | 103.0% | 8.7 | 13.2 | 19.8 | 0.8 | 44.4% |
| 9 | Disperbyk ®-2205 | polyamine | 103.1% | 9.2 | 15.0 | 25.3 | 1.1 | 36.3% |
| 10 | BYK ®-9077 | polyurethane | 103.3% | 9.2 | 15.0 | 24.7 | 1.0 | 39.0% |
| 11 | Disperbyk ®-168 | polyurethane | 103.1% | 9.2 | 14.9 | 24.7 | 1.0 | 37.0% |

TABLE 31-continued

| Sample | dispersant | type | % QE | D10 (μm) | D50 (μm) | D90 (μm) | span | 100 hr HTHH QE drop (%) |
|---|---|---|---|---|---|---|---|---|
| 12 | Disperbyk ®-185 | polyurethane | 103.2% | 8.3 | 12.8 | 19.4 | 0.9 | 47.3% |
| 13 | BYK ®-W-9011 | acid ester | 103.2% | 8.9 | 14.0 | 22.2 | 1.0 | 44.3% |
| 14 | Disperbyk ®-102 | acid ester | 103.5% | 9.3 | 15.7 | 28.1 | 1.2 | 38.0% |
| 15 | Disperbyk ®-111 | acid ester | 103.4% | 9.6 | 16.7 | 30.1 | 1.2 | 40.6% |
| 16 | Disperbyk ®-180 | acid ester | 103.0% | 9.4 | 16.9 | 32.5 | 1.4 | 39.7% |
| 17 | Disperplast ®-1142 | acid ester | 103.6% | 8.9 | 13.4 | 19.9 | 0.8 | 44.4% |
| 18 | Disperbyk ®-190 | polyacrylate | 103.4% | 9.0 | 13.6 | 20.2 | 0.8 | 40.7% |
| 19 | Disperbyk ®-2055 | polyacrylate | 102.9% | 8.7 | 13.0 | 19.4 | 0.8 | 50.5% |
| 20 | Disperbyk ®-2008 | CPT-acrylate | 103.0% | 8.9 | 13.8 | 21.8 | 0.9 | 38.7% |
| 21 | Disperbyk ®-2012 | CPT-acrylate | 103.4% | 8.7 | 13.2 | 19.8 | 0.8 | 48.6% |
| 22 | Disperbyk ®-2013 | CPT-acrylate | 102.9% | 8.4 | 12.5 | 18.2 | 0.8 | 46.9% |
| 23 | BYK ®-1788 | surfactants | 103.3% | 8.5 | 13.7 | 22.7 | 1.0 | 41.7% |
| 24 | Disperbyk ®-2117 | other | 103.0% | 9.4 | 15.6 | 26.5 | 1.1 | 34.6% |
| 25 | Disperbyk ®-2118 | other | 103.1% | 9.2 | 15.0 | 25.5 | 1.1 | 34.9% |

Example 39

Dispersants from Croda Inc., Lubrizol Corporation, BYK Additives and Instruments and potassium oleate were evaluated. Samples at 25 wt % total solids loading were prepared by combining a dispersant (shown in Table 32) at 5 wt % dispersant loading (relative to PFS), PFS Sample No. 421 and ethanol.

After combining the PFS sample with the dispersant solution, the samples were vortexed to mix and rolled at 80 rpm for 10 minutes. The samples were filtered through Whatman #4 filter paper and washed with 2×20 mL ethanol and 3×20 mL acetone and then transferred to a vacuum desiccator to dry under vacuum overnight. The first wash was used to rinse the sample bottle and the solid filter cake was churned after washes 1 through 4. All samples were sifted through a 170 mesh nylon screen and analyzed (see Table 32).

All the dispersants showed a substantial reduction in D50 particle size (55-65%) and particle size distribution (30-80%), as desired to reduce dispersity and agglomeration in the samples.

All dispersants except sample 6 showed minimal impact to % QE (+0.8%). Samples 1, 7, and 10 showed slight increases (poorer performance) to % QE drop relative to PFS Sample No. 421, while all other dispersants resulted in moderate to substantial increase in the % QE drop (30-50%) after 100 hr of HTHH testing.

TABLE 32

| Sample | dispersant | type | % QE | D10 (μm) | D50 (μm) | D90 (μm) | span | 100 hr HTHH QE drop (%) |
|---|---|---|---|---|---|---|---|---|
| PFS 421 | none | N/A | 103.7% | 10.3 | 29.2 | 55.6 | 1.6 | 24.6% |
| 1 | potassium oleate | anionic | 103.7% | 8.2 | 12.8 | 19.6 | 0.9 | 30.3% |
| 2 | Hypermer ™ KD4 | polyester | 103.2% | 7.4 | 10.9 | 15.3 | 0.7 | 33.5% |
| 3 | Solsperse ™ 71000 | zwitterionic comb | 103.5% | 8.1 | 9.6 | 11.2 | 0.3 | 49.4% |
| 4 | Solsperse ™ 41000 | phosphate ester | 103.6% | 8.2 | 13.6 | 22.6 | 1.1 | 31.6% |
| 5 | Solplus ™ D570 | polyacrylate salt | 103.8% | 8.5 | 10.3 | 13.0 | 0.4 | 50.4% |
| 6 | Disperbyk ®-2013 | CPT-acrylate | 100.5% | 8.4 | 10.0 | 11.5 | 0.3 | 45.9% |
| 7 | Disperbyk ®-2155 | polyamine | 103.5% | 7.5 | 11.0 | 15.6 | 0.7 | 29.8% |
| 8 | Disperbyk ®-2008 | CPT-acrylate | 103.1% | 7.4 | 11.2 | 16.3 | 0.8 | 32.2% |
| 9 | Disperbyk ®-2055 | polyacrylate | 102.9% | 7.1 | 10.5 | 14.8 | 0.7 | 43.5% |
| 10 | BYK ®-9077 | polyurethane | 103.4% | 7.5 | 11.1 | 15.7 | 0.7 | 26.6% |

Five samples from Table 32 providing the greatest reduction of the D50 particle size and dispersant sodium dodecylbenzenesulfonate (NaSDBS) were evaluated. Samples at 25 wt % total solids loading were prepared by combining a selected dispersant from Table 32 (shown in Table 33) at 2.5 wt % and 1 wt % dispersant loading (relative to PFS), PFS Sample No. 421 ($K_2SiF_6$:$Mn^{4+}$, annealed and treated) and ethanol. Samples at 25 wt % total solids loading were prepared by combining dispersant sodium dodecylbenzenesulfonate at 5 wt %, 2.5 wt % and 1 wt % dispersant loading (relative to PFS), PFS Sample No. 421 ($K_2SiF_6$:$Mn^{4+}$, annealed and treated) and ethanol.

After combining the PFS sample with the dispersant solution, the samples were vortexed to mix and rolled at 80 rpm for 10 minutes. The samples were filtered through Whatman #4 filter paper and washed with 2×20 mL ethanol and 3×20 mL acetone and then transferred to a vacuum desiccator to dry under vacuum overnight. The first wash was used to rinse the sample bottle and the solid filter cake was churned after washes 1 through 4. All samples were sifted through a 170 mesh nylon screen and analyzed (see Table 33).

At the lower dispersant loading these materials maintained performance and exhibited excellent D50 particle size reduction (60-70%). Samples 1, 2, 9, 10 showed moderate reductions in particle size distribution (28-45%) while samples 3-8 achieved superior reduction of the particle size distribution by 75-80%, as desired to reduce dispersity and agglomeration in the samples. Sodium dodecylbenzenesulfonate performed comparably to samples 1, 2, 9, and 10 and yielded substantial D50 particle size reductions of 55-60% and particle size distribution reductions of 27-37%, as desired to reduce dispersity and agglomeration in the samples. In this case, the 5 and 2.5 wt % coated samples performed best with D50 particle size of 12.1 and 12.7 um, respectively, while the 1 wt % coated sample exhibited a D50 particle size of 14.1 μm.

The dispersants also showed minimal impact on % QE with 10% change relative to PFS Sample No. 421 at the lower loadings. Sodium dodecylbenzenesulfonate performed comparably to samples 1, 2, 9, and 10 and yielded <1% impact to % QE. In many cases, lowering the dispersant loading to 2.5 wt % or 1 wt % resulted in moderately better HTHH performance (e.g. lower % QE drop relative to the 5 wt % loading). Solplus™ D570 and Solsperse™ 71000 exhibited a % QE drop of 50% at 5 wt % which decreased to 43% and 36% at 1 wt %, respectively. Hypermer™ KD4 exhibited a % QE drop of 34% at 5 wt % which decreased to 28% at 1 wt % loading. However Disperbyk®-2055, Disperbyk®-2013, and NaSDBS all exhibited comparable or higher % QE drop at 2.5 wt % or 1 wt % relative to the 5 wt % loading.

TABLE 33

| Sample | dispersant | type | loading (wt %) | % QE | D10 (μm) | D50 (μm) | D90 (μm) | span | 100 hr HTHH QE drop (%) |
|---|---|---|---|---|---|---|---|---|---|
| PFS 421 | none | N/A | N/A | 106.3 | 10.7 | 32.3 | 55.3 | 1.4 | 33.8% |
| 1 | Solplus™ D570 | polyacrylate salt | 2.5 | 105.7 | 8.1 | 13.0 | 21.0 | 1.0 | 42.2% |
| 2 | Solplus™ D570 | polyacrylate salt | 1 | 105.8 | 7.6 | 11.3 | 16.2 | 0.8 | 43.3% |
| 3 | Solsperse™ 71000 | zwitterionic comb | 2.5 | 106.4 | 8.7 | 10.2 | 11.5 | 0.3 | 46.9% |
| 4 | Solsperse™ 71000 | zwitterionic comb | 1 | 106.8 | 8.5 | 10.3 | 12.2 | 0.4 | 35.7% |
| 5 | Disperbyk®-2055 | polyacrylate | 2.5 | 106.9 | 8.3 | 10.0 | 11.5 | 0.3 | 51.9% |
| 6 | Disperbyk®-2055 | polyacrylate | 1 | 107.1 | 8.9 | 10.4 | 12.1 | 0.3 | 48.0% |
| 7 | Disperbyk®-2013 | CPT-acrylate | 2.5 | 107.3 | 8.8 | 10.5 | 12.3 | 0.3 | 49.9% |
| 8 | Disperbyk®-2013 | CPT-acrylate | 1 | 107.5 | 8.7 | 10.2 | 11.7 | 0.3 | 46.8% |
| 9 | Hypermer™ KD4 | polyester | 2.5 | 107.4 | 7.5 | 11.5 | 17.2 | 0.8 | 27.3% |
| 10 | Hypermer™ KD4 | polyester | 1 | 105.2 | 8.0 | 12.6 | 19.2 | 0.9 | 28.2% |
| 11 | NaSDBS | alkylsulfonate | 5 | 105.5 | 7.8 | 12.1 | 18.3 | 0.9 | 20.3% |
| 12 | NaSDBS | alkylsulfonate | 2.5 | 105.9 | 7.9 | 12.7 | 19.9 | 1.0 | 20.9% |
| 13 | NaSDBS | alkylsulfonate | 1 | 106.0 | 8.5 | 14.1 | 22.7 | 1.0 | 24.3% |

Example 40

Sedimentation behaviors of two PFS samples, PFS Sample No. 554 and PFS Sample No. F2699-17-3, in binder material ethoxylated trimethylolpropane triacrylate (Tradename, SR454 obtained from Sartomer Americas) were evaluated.

PFS Sample No. 554 was prepared from PFS Sample No. 1016BTGA ($K_2SiF_6$:$Mn^{4+}$). PFS Sample No. 1016BTGA was prepared by the process described in US Publication No. 2018/0163126. The powder was washed in a nearly saturated solution of $K_2SiF_6$ in 49% HF and annealed at 540° C. for 8 hours under a 20% fluorine:80% nitrogen atmosphere. The annealed powder was sifted through 280 mesh.

PFS Sample No. F2699-17-3 was also prepared from PFS Sample No. 1016BTGA (as above) and then surface coated with a $MgF_2$ (2.5 wt %) overcoating. The powder was coated with $MgF_2$ as follows: 4.1 mL of a 0.22 g/mL solution of $MgSiF_6$ $6H_2O$ in 17.5% aq. $H_2SiF_6$ was added over 30 minutes into a reaction mixture containing a magnetic stir bar and 8.1 g of $K_2SiF_6:Mn^{4+}$ in 78 mL of 49% aq HF saturated with $K_2SiF_6$. The mixture was stirred vigorously for 30 sec (300 rpm) after which the stirring was turned down to 120 rpm. After the addition was complete, the stirring was stopped, the stir bar was removed and the reaction mixture was allowed to settle for 7 minutes. The supernatant was decanted and discarded. The wet slurry was mixed with 35 mL of 49% aq HF saturated with $K_2SiF_6$. The wash mixture was allowed to settle for 5 minutes and then the supernatant was decanted and discarded. The slurry was transferred to a plastic Buchner funnel fitted with a 0.65 μm fluoropolymer membrane. The residual HF solution was filtered off and the phosphor cake was washed with acetone 5 times, using a total of 100 mL acetone, churning the solid before each wash. The product was dried under vacuum for 3 days and then sifted through a 170 mesh membrane to afford the final coated product.

0.3 g of the PFS powders were each mixed separately with 4.5 g of SR454 to obtain two dispersions with 6.3 wt % PFS loading. The two mixtures were stirred for 2 hours at room temperature, followed by mixing on a vortex mixer for 2 minutes, and sonicated for 10 minutes. Both mixtures were rolled at a speed of 60 rpm on a bottle roller for 2 hours. The suspensions were stirred for another two hours at 60° C., and then cooled to room temperature for the sedimentation test.

As one can see in Table 34, PFS Sample No. 554 has a small Zeta potential and settles much faster than its estimated calculated sedimentation rate based on its particle size, which indicates significant agglomeration of PFS Sample No. 554 in the suspension. The $MgF_2$ coated sample, PFS Sample No. F2699-17-3, has a larger zeta potential and even though it has a slightly larger particle size than PFS Sample No. 554, PFS Sample No. F2699-17-3 settles at a much slower rate than PFS Sample No. 554. Further, the settling behavior of PFS Sample No. F2699-17-3 agrees reasonably well with its estimated calculated sedimentation rate, which indicates the absence of agglomeration in the suspension.

TABLE 34

| PFS Sample No. | MgF2 coating | Particle size (um) | | | Zeta potential (mV) | Sedimentation (mm) | | | | | |
|---|---|---|---|---|---|---|---|---|---|---|---|
| | | | | | | 1-hr | | 2-hr | | 4-hr | |
| | | D10 | D50 | D90 | | Calculated | Actual | Calculated | Actual | Calculated | Actual |
| 554 | No | 4.5 | 5.4 | 6.3 | 9.5 | 1.2 | 9 | 2.4 | >13 | 4.8 | >13 |
| F2699-17-3 | Yes | 5.2 | 6.2 | 7.3 | 23.0 | 1.4 | 1 | 2.8 | 3 | 5.6 | 5.5 |

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A film comprising at least one phosphor dispersed within a binder matrix, wherein the phosphor has a D50 particle size from about 0.1 μm to about 15 μm and is selected from the group consisting of a green-emitting $U^{6+}$-containing phosphor, a green-emitting $Mn^{2+}$-containing phosphor, a red-emitting phosphor based on complex fluoride materials activated by $Mn^{4+}$, and a mixture thereof, wherein the film is a single layer or has multiple layers.

2. The film according to claim 1, wherein the at least one phosphor has a D50 particle size from about 0.1 μm to about 3 μm or from about 3 μm to about 8.5 μm.

3. The film according to claim 1, wherein the green-emitting $U^{6+}$-containing phosphor is selected from the group consisting of: $\gamma\text{-}Ba_2UO_2(PO_4)_2$, $Ba[Mg,Zn]UO_2(PO_4)_2$, $Ba_6Al_5P_5O_{26}:U^{6+}$, $Ba(UO_2)P_2O_7$, $Ba_3(UO_2)_2P_2O_7(PO_4)_2$, and combinations thereof; and the green-emitting $Mn^{2+}$-containing phosphor is selected from the group consisting of: $((CH_3)_4N)MnX_3$, where X=Br or Cl; $[MEA]\text{-}(MnX_4)_2$, where X=Br or Cl and $[MEA]=((CH_3)_4N(C_2H_5)_4N)_2NH_4$; $(OP\text{-}Ph_3)_2MnBr_2$, where Ph=phenyl; $(OP(N\text{-}Me_2)_3)_2MnX_2$, where X=Cl or Br and Me=methyl; $(OP\text{-}Ph\text{-}(N\text{-}Me_2)_2)_2MnX_2$, where X=Cl or Br, Ph=phenyl and Me=Methyl; $[DPEPO]\text{-}MnX_2$, where X=Cl, Br or I and [DPEPO]= bis[2-(diphenylphosphino)-phenyl]ether-oxide; $[DBFDPO]\text{-}MnX_2$, where X=Cl or Br and [DBFDPO]=4,6-bis(diphenylphosphoryl)dibenzofuran; $C_{11}H_{22}N_2MnCl_4$; $C_4H_{10}NMnBr_3$; and $A_2MnX_4$, where X=Br, Cl or I, and when X=Br, then A=$Et_4$-N, $Pr_4$-N, Bz-$Bu_3$-N, Ph-$Me_3$-N, $Ph_4$-P, Me-$Ph_3$-P, Et-$Ph_3$-P, Bz-$Me_3$-N, K(crypt-222), Pr-$Me_3$-N, Me-P-$Ph_3$-Br, Pr-$Me_3$-NBr, $P_{14}$, $PP_{14}$, $C_2H_{10}N_2Br$, $C_{10}$, $H_{16}N$, Btz, Bn-P-$Ph_3$, $C_n$mim (n=1,2,3), K(dibenzo-18-crown-6), Bn-$Me_3$-N, Bn-$Et_3$-N, Bn-$(C_5H_5N)$, $C_6H_{14}N$, $C_5H_5N$, and $C_4H_{10}N$, and when X=Cl, then A=$Et_4$-N, Pro-N, Bz-$Bu_3$-N, Ph-$Me_3$-N, $Ph_4$-P, Et-$Ph_3$-P, Bz-$Me_3$-N, $(P\text{-}Ph_3)_2N$, Btz, Bn-P-$Ph_3$, $C_n$mim (n=1,2,3), K(dibenzo-18-crown-6), and $C_4NOH_{10}$, and when X=I, then A=$Et_4$-N, $Pr_4$-N, Ph-$Me_3$-N, Bz-$Me_3$-N, and $C_4H_{10}N$; where Bz=benzoyl, Bn=benzyl, Pr=propyl, Me=methyl, Et=ethyl, Bu=butyl, Btz=Benzothiazole, $C_n$mim=n-alkyl-methylimidazolium and Ph=phenyl.

4. The film according to claim 1 further comprising one or more materials selected from the group consisting of quantum dot materials, additional phosphors, phosphorescent dyes, color filter pigments, metal oxide nanoparticles, scattering particles, and mixtures thereof.

5. The film according to claim 4 further comprising quantum dot materials, wherein the quantum dot materials comprise perovskite quantum dots.

6. The film according to claim 1, wherein the film further comprises an additional phosphor selected from $(Y,Gd,Tb,La,Sm,Pr,Lu)_3(Al,Ga)_{5-a}O_{12-3/2a}:Ce^{3+}$ (wherein $0 \le a \le 0.5$); beta-SiAlON:$Eu^{2+}$; $(Sr,Ca,Ba)(Al,Ga,In)_2S_4:Eu^{2+}$; alpha-SiAlON doped with $Eu^{2+}$ and/or $Ce^{3+}$; $Ca_{1-h-r}Ce_hEu_rAl_{1-h}(Mg,Zn)_hSiN_3$ (where $0 \le h \le 0.2$, $0 \le r \le 0.2$); $Sr(LiAl_3N_4):Eu^{2+}$; $(Ca, Sr)S:Eu^{2+}$, $Ce^{3+}$; $(Ba, Sr,Ca)_bSi_gN_m:Eu^{2+}$ (wherein 2b+4g=3m); and combinations thereof.

7. The film according to claim 1, wherein the at least one phosphor is the red-emitting phosphor based on complex fluoride materials activated by $Mn^{4+}$ and the red-emitting phosphor is at least partially coated with a surface coating comprising a metal fluoride, silica or organic coating.

8. The film according to claim 7, wherein the surface coating is a metal fluoride selected from the group consisting of $MgF_2$, $CaF_2$, $SrF_2$, $BaF_2$, $AgF$, $ZnF_2$, $AlF_3$, and a combination thereof.

9. The film according to claim 1, wherein the at least one phosphor comprises the green-emitting $U^{6+}$-containing phosphor or the green-emitting $Mn^{2+}$-containing phosphor, and the film further comprises an additional phosphor selected from $(Y,Gd,Tb,La,Sm,Pr,Lu)_3(Al,Ga)_{5-a}O_{12-3/2a}$:$Ce^{3+}$(wherein 0≤a≤0.5); beta-SiAlON:$Eu^{2+}$; $(Sr,Ca,Ba)(Al,Ga,In)_2S_4$:$Eu^{2+}$; alpha-SiAlON doped with $Eu^{2+}$ and/or $Ce^{3+}$; $Ca_{1-h-r}Ce_hEu_rAl_{1-h}(Mg,Zn)_hSiN_3$, (where 0≤h≤0.2, 0≤r≤0.2); $Sr(LiAl_3N_4)$:$Eu^{2+}$; $(Ca,Sr)S$:$Eu^{2+},Ce^{3+}$; $(Ba,Sr,Ca)_bSi_gN_m$:$Eu^{2+}$(wherein 2b+4g=3m); and combinations thereof.

10. A film comprising a red-emitting phosphor dispersed within a binder matrix, wherein the red-emitting phosphor has a D50 particle size from about 0.1 μm to about 3 μm or from about 3 μm to about 8.5 μm, wherein the red-emitting phosphor comprises formula I and is at least partially coated with a surface coating comprising a metal fluoride, silica or organic coating, and wherein the film is a single layer or has multiple layers, $$A_x\ MF_y: Mn^{4+} \qquad I$$

wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is an absolute value of a charge of the $MF_y$ ion; and
y is 5, 6 or 7.

11. The film according to claim 10, wherein the surface coating is a metal fluoride selected from the group consisting of $MgF_2$, $CaF_2$, $SrF_2$, $BaF_2$, $AgF$, $ZnF_2$, $AlF_3$, and a combination thereof.

12. The film according to claim 10, wherein formula I is $K_2SiF_6$:$Mn^{4+}$ or $Na_2SiF_6$:$Mn^{4+}$.

13. The film according to claim 10 further comprising one or more materials selected from the group consisting of quantum dot materials, additional phosphors, phosphorescent dyes, color filter pigments, metal oxide nanoparticles, scattering particles, and mixtures thereof.

14. The film according to claim 13 further comprising quantum dot materials, wherein the quantum dot materials comprise perovskite quantum dots.

15. The film according to claim 10, wherein the film comprises one or more additional phosphors selected from $(Y,Gd,Tb,La,Sm,Pau)_3(Al,Ga)_{5-a}O_{12-3/2a}$:$Ce^{3+}$(wherein 0≤a≤0.5); beta-SiAlON:$Eu^{2+}$;

$(Sr,Ca,Ba)(Al,Ga,In)_2S_4$:$Eu^{2+}$; alpha-SiAlON doped with $Eu^{2+}$ and/or $Ce^{3+}$;
$Ca_{1-h-r}Ce_hEu_rAl_{1-h}(Mg,Zn)_hSiN_3$, (where 0≤h≤0.2, 0≤r≤0.2); $Sr(LiAl_3N_4)$:$Eu^{2+}$;
$(Ca,Sr)S$:$Eu^{2+}$, $Ce^{3+}$; $(Ba, Sr, Ca)_b\ Si_gN_m$:$Eu^{2+}$(wherein 2b+4g=3m); and combinations thereof.

16. A device comprising an LED light source optically coupled and/or radiationally connected to a film comprising at least one phosphor dispersed within a binder matrix, wherein the phosphor has a D50 particle size from about 0.1 μm to about 15 μm and is selected from the group consisting of a green-emitting $U^{6+}$-containing phosphor, a green-emitting $Mn^{2+}$-containing phosphor, a red-emitting phosphor based on complex fluoride materials activated by $Mn^{4+}$, and a mixture thereof, wherein the film is a single layer or has multiple layers.

17. A backlight apparatus comprising the device according to claim 16.

18. A lighting apparatus comprising the device according to claim 16.

19. A television comprising the backlight apparatus of claim 17.

20. A mobile phone comprising the backlight apparatus of claim 17.

21. A computer monitor comprising the backlight apparatus of claim 17.

22. An automotive display comprising the backlight apparatus of claim 17.

23. A tablet computer comprising the backlight apparatus of claim 17.

24. A laptop comprising the backlight apparatus of claim 17.

25. The device according to claim 16, wherein the LED light source comprises a mini-LED or a micro-LED.

26. The device according to claim 16, wherein the LED light source emits UV or blue light.

27. The device according to claim 16, wherein the film is disposed on the LED light source or is located remotely from the LED light source.

28. The device according to claim 16, wherein the film further comprises one or more materials selected from the group consisting of quantum dot materials, additional phosphors, phosphorescent dyes, color filter pigments, metal oxide nanoparticles, scattering particles, and mixtures thereof.

29. The device according to claim 28, wherein the film further comprises quantum dot materials, wherein the quantum dot materials comprise perovskite quantum dots.

30. A film prepared by depositing a composition on a substrate and drying or curing the composition, wherein the composition comprises a binder material and at least one phosphor being uniformly dispersed throughout the composition, the narrow band emission phosphor having a D50 particle size from about 0.1 μm to about 15 μm and is selected from the group consisting of a green-emitting $U^{6+}$-containing phosphor, a green-emitting $Mn^{2+}$-containing phosphor, a red-emitting phosphor based on complex fluoride materials activated by Me, and a mixture thereof.

31. The film in accordance with claim 30, wherein the composition is deposited by coating or printing.

32. The film in accordance with claim 30, wherein the composition is deposited by at least one of wet-coating, spin coating, slot-die coating, spray coating, dipping, applying the composition with a doctor blade, and ink jet printing.

* * * * *